US009178028B2

(12) United States Patent
Kitagawa

(10) Patent No.: US 9,178,028 B2
(45) Date of Patent: Nov. 3, 2015

(54) SEMICONDUCTOR DEVICE

(71) Applicant: Kabushiki Kaisha Toshiba, Minato-ku, Tokyo (JP)

(72) Inventor: Mitsuhiko Kitagawa, Tokyo (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 43 days.

(21) Appl. No.: 14/202,335

(22) Filed: Mar. 10, 2014

(65) Prior Publication Data

US 2015/0021656 A1 Jan. 22, 2015

(30) Foreign Application Priority Data

Jul. 16, 2013 (JP) ................................ 2013-147992
Feb. 7, 2014 (JP) ................................ 2014-022294

(51) Int. Cl.
*H01L 29/66* (2006.01)
*H01L 29/423* (2006.01)
*H01L 29/739* (2006.01)
*H01L 29/78* (2006.01)
*H01L 29/08* (2006.01)

(52) U.S. Cl.
CPC ...... *H01L 29/42376* (2013.01); *H01L 29/0834* (2013.01); *H01L 29/4236* (2013.01); *H01L 29/7397* (2013.01); *H01L 29/7813* (2013.01)

(58) Field of Classification Search
CPC ............ H01L 29/4236; H01L 29/7397; H01L 29/7813; H01L 29/0834
USPC ........................................................ 257/139
See application file for complete search history.

(56) References Cited

U.S. PATENT DOCUMENTS

2009/0085106 A1 4/2009 Matsunaga
2011/0140180 A1 6/2011 Kitagawa
2011/0210391 A1 9/2011 Kitagawa
2012/0056241 A1 3/2012 Sumitomo et al.
2012/0061723 A1 3/2012 Ishii
2012/0068220 A1 3/2012 Kobayashi et al.
2012/0068248 A1 3/2012 Kawaguchi

FOREIGN PATENT DOCUMENTS

JP 2006-019556 A 1/2006
JP 2009-081397 A 4/2009
JP 2009-170670 A 7/2009
JP 2011-146682 A 7/2011
JP 2011-181583 A 9/2011
JP 2011-199109 A 10/2011
JP 2012-064641 A 3/2012
JP 2012-064849 A 3/2012
JP 2012-069579 A 4/2012
JP 2012-080074 A 4/2012
JP 2012-124518 A 6/2012

OTHER PUBLICATIONS

Proceedings of the 2012 24th International Symposium on Power Semiconductor Devices and ICs Jun. 3-7, 2012—Bruges Belgium, pp. 17-20. "Loss loss IGBT with Partially Narrower Mesa Structure (PNM-IGBT)."

Proceedings of the 2012 24th International Symposium on Power Semiconductor Devices and ICs 3-7 Jun. 4-8, 2006 Naples, Italy, 5-8. "Theoretical Investigation of Silicon Limit Characteristics of IGBT."

*Primary Examiner* — Douglas Menz
(74) *Attorney, Agent, or Firm* — White & Case LLP

(57) ABSTRACT

According to one embodiment, a semiconductor device includes a first semiconductor region of a first conductivity type, a first control electrode, a first electrode, a second control electrode, a second semiconductor region of a second conductivity type, a third semiconductor region of the first conductivity type, and a first insulating film. The first control electrode is provided on or above the first semiconductor region. The first electrode is provided on the first control electrode. The second control electrode is provided on or above the first semiconductor region and includes a first portion which is beside the first control electrode and a second portion which is provided on the first portion and beside the first electrode. The second semiconductor region is provided on the first semiconductor region. A boundary between the first semiconductor region and the second semiconductor region is above the lower end of the first electrode.

20 Claims, 39 Drawing Sheets

FIG. 4A
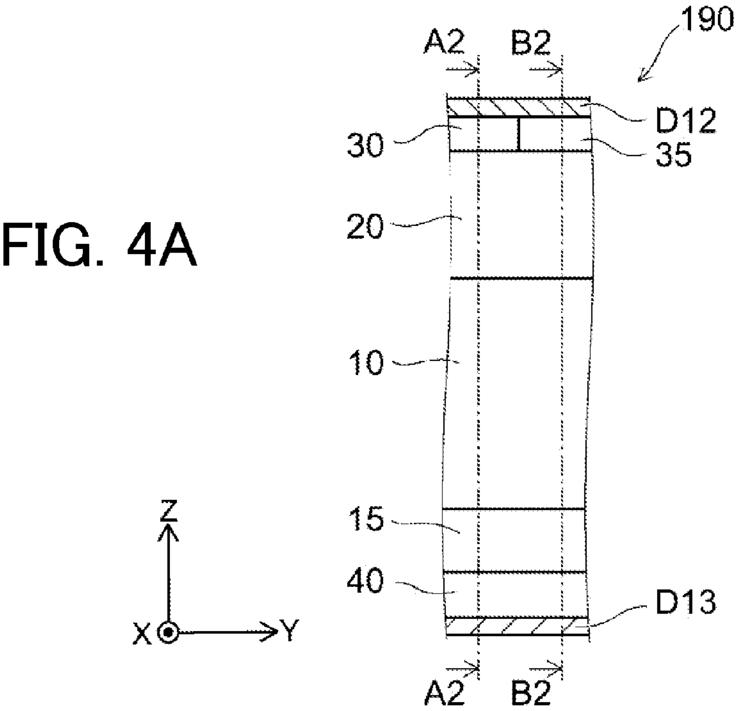
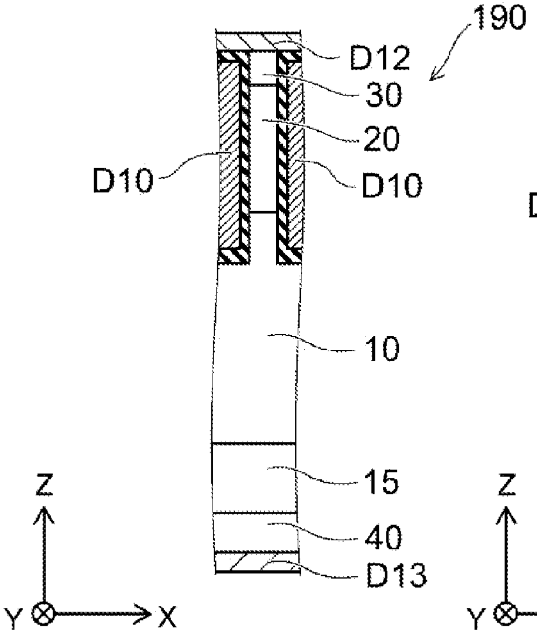
FIG. 4B
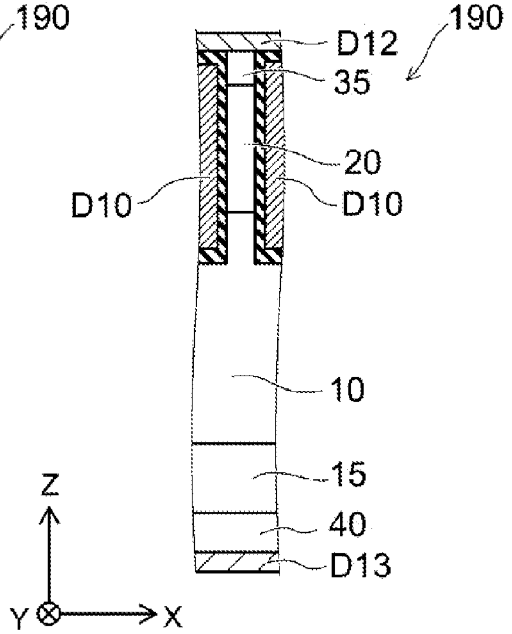
FIG. 4C

FIG. 7A
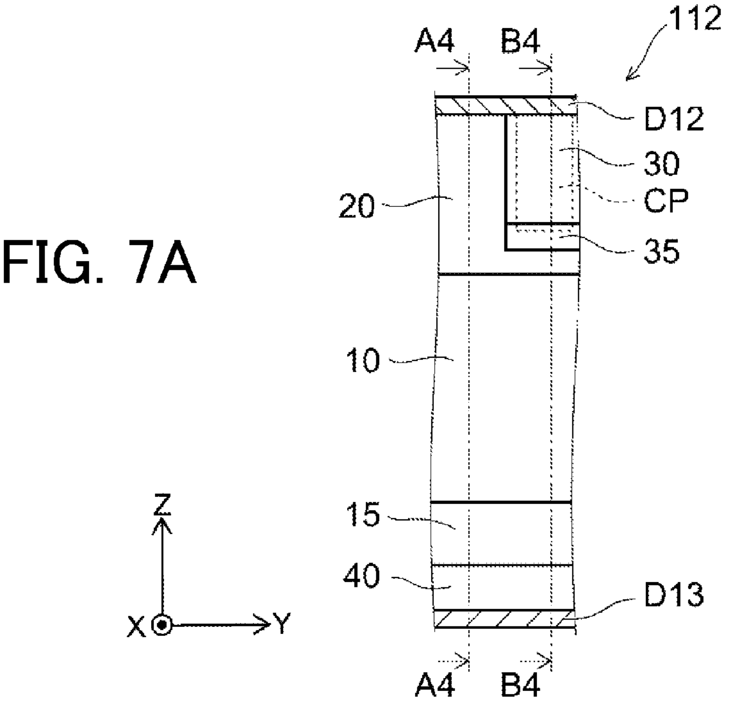
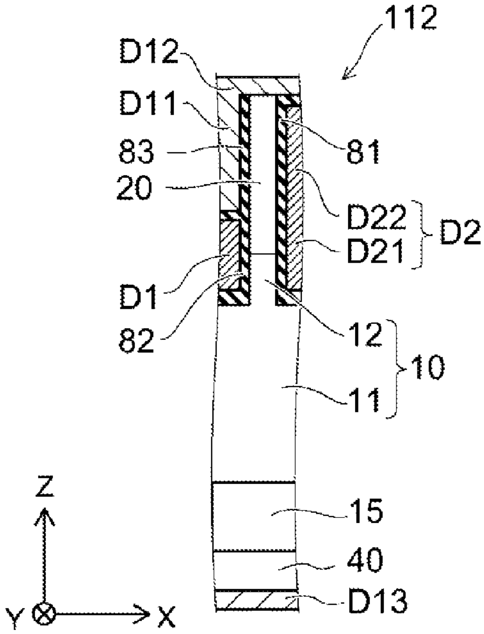
FIG. 7B
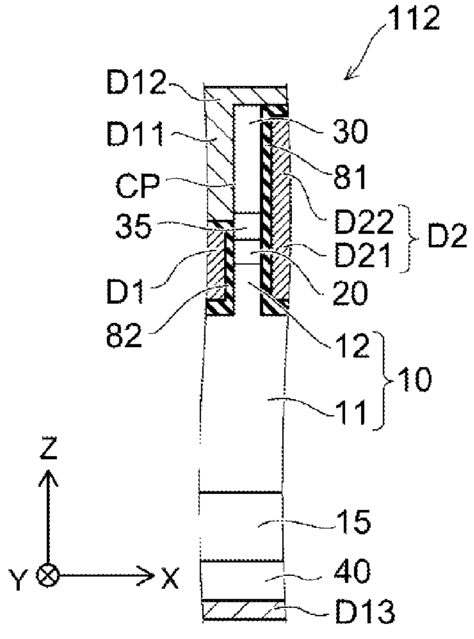
FIG. 7C

FIG. 8A
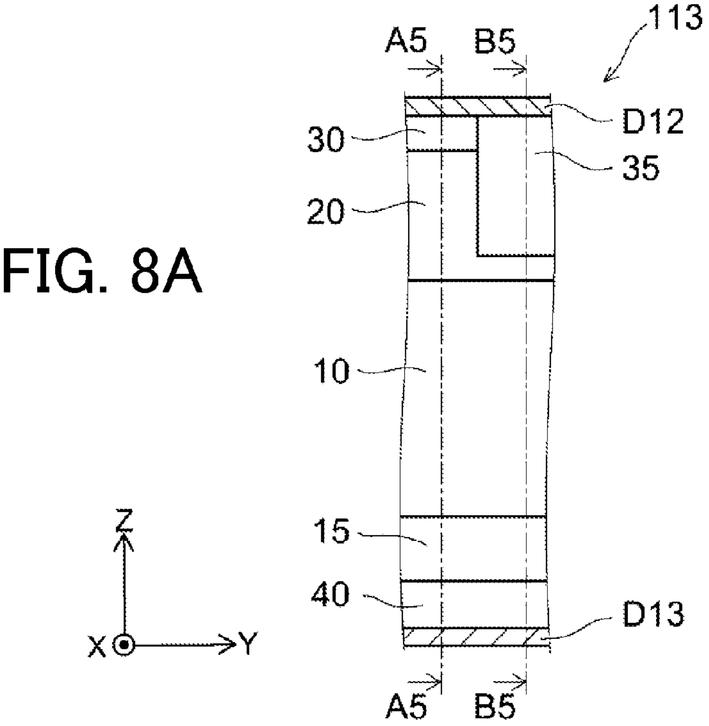
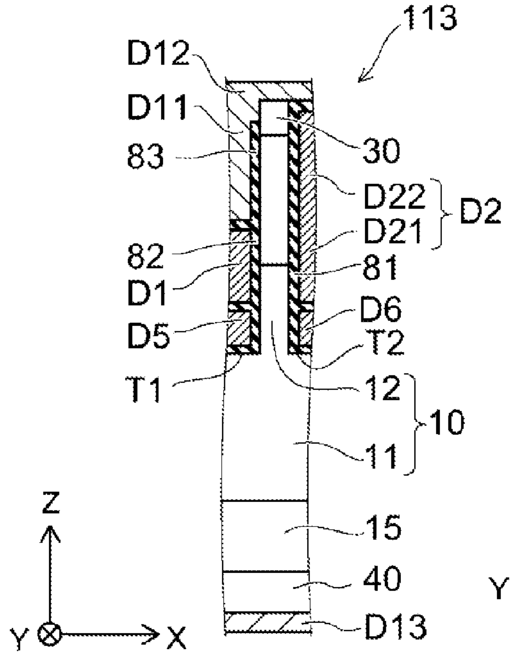
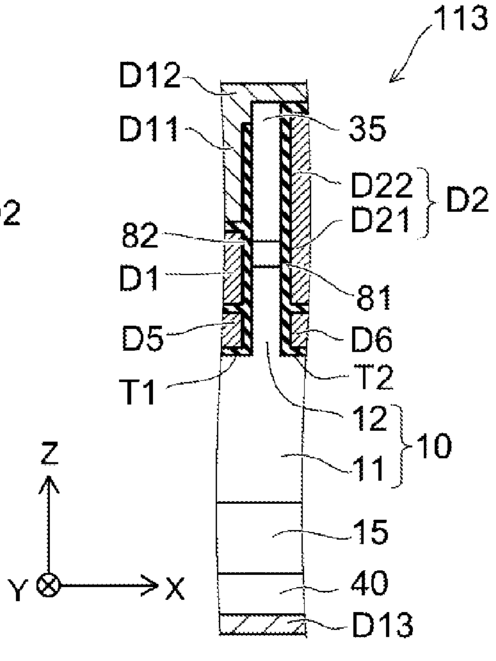
FIG. 8B
FIG. 8C

FIG. 9A
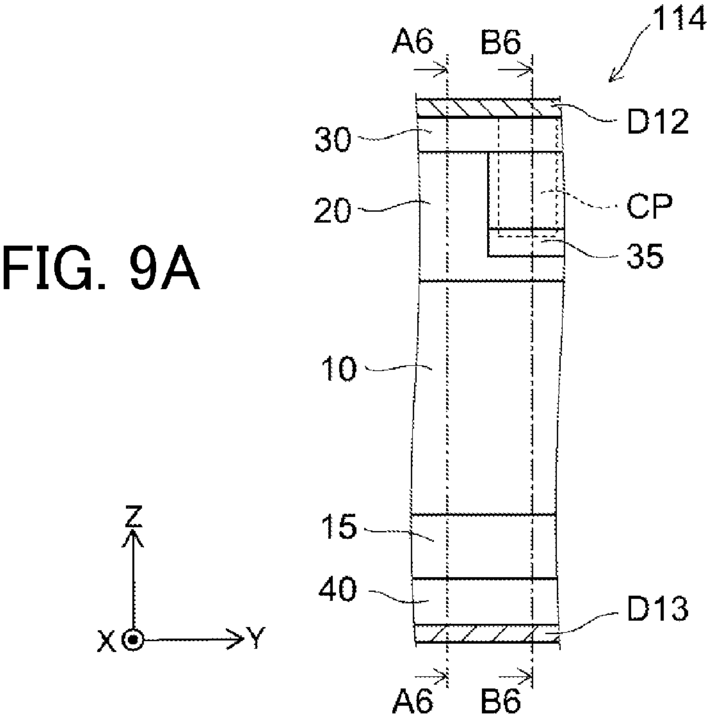
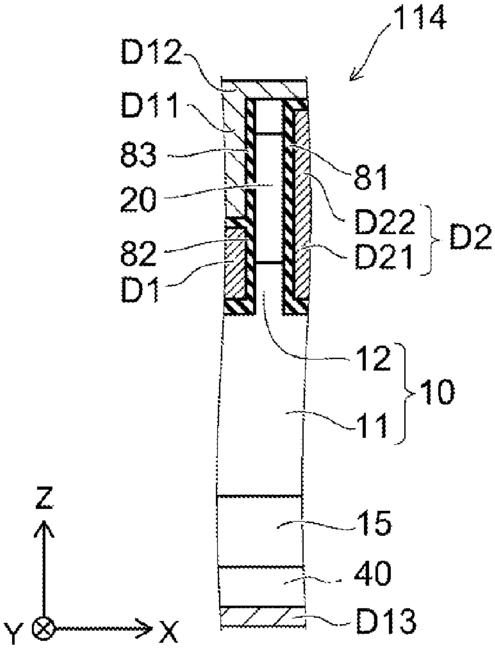
FIG. 9B
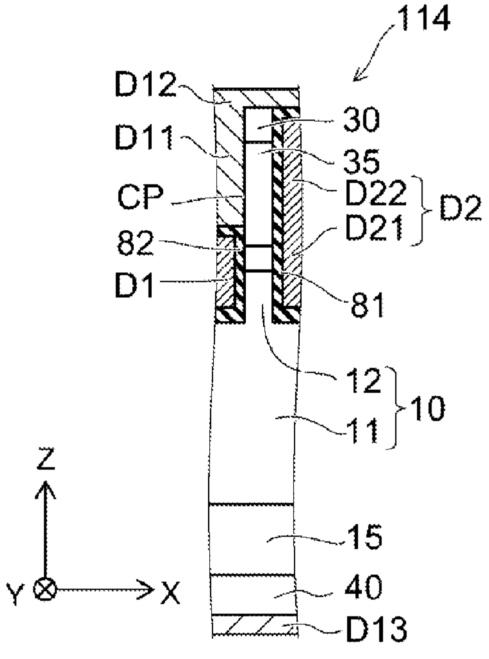
FIG. 9C

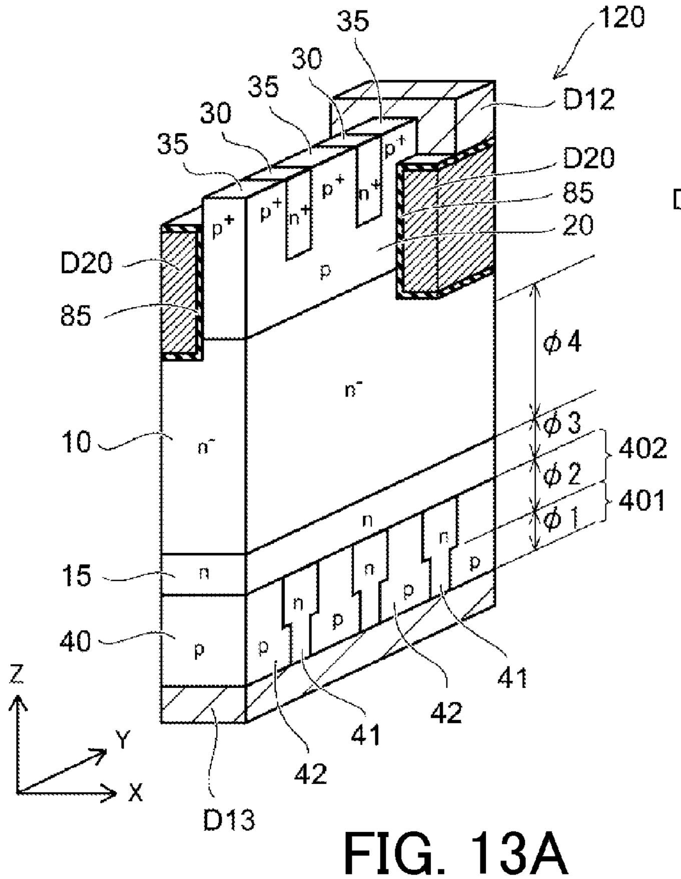
FIG. 13A
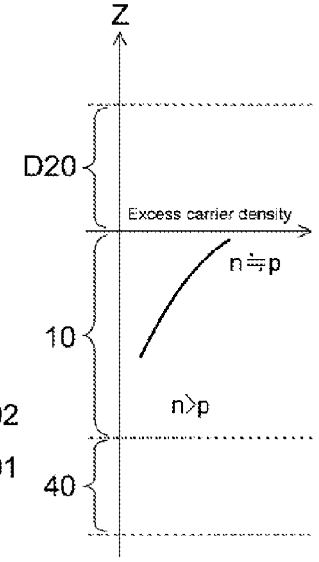
FIG. 13C
FIG. 13B
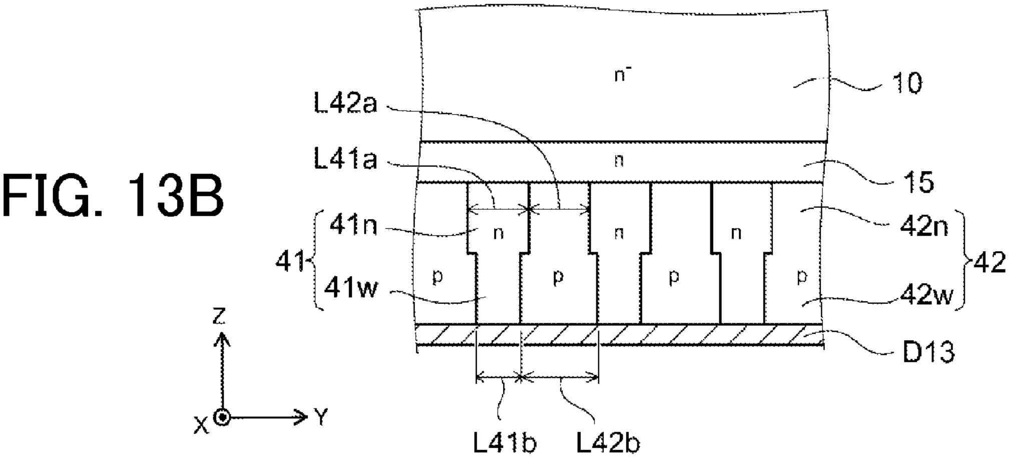

FIG. 19A
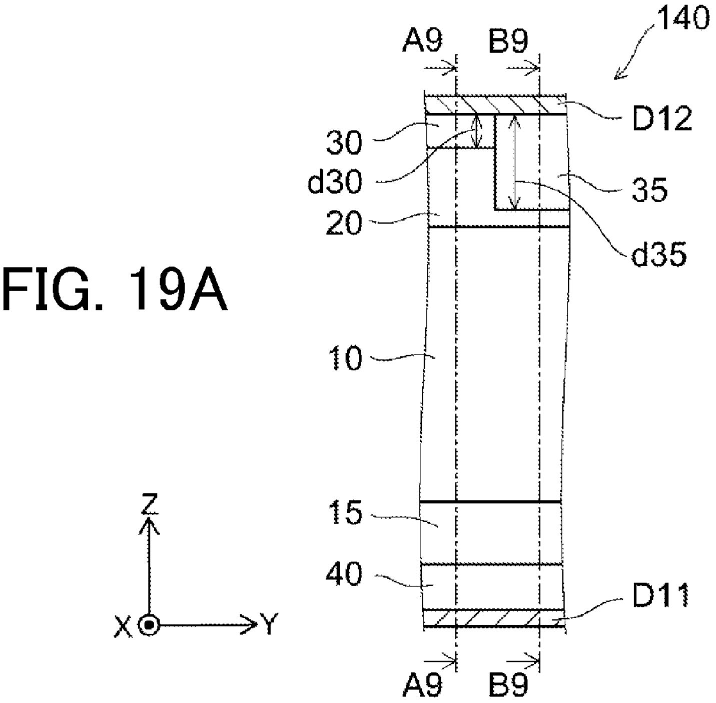
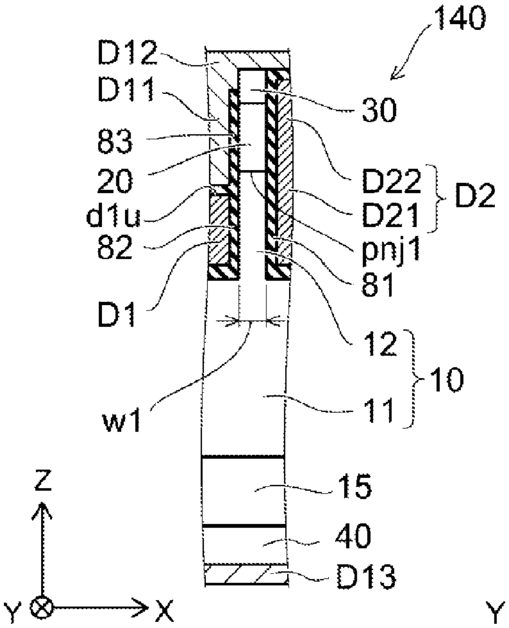
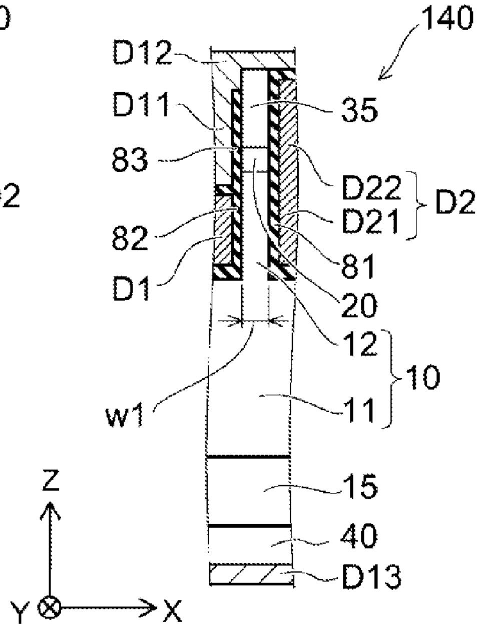
FIG. 19B
FIG. 19C

SEMICONDUCTOR DEVICE

CROSS REFERENCE TO RELATED APPLICATION

This application is based upon and claims the benefit of priority from the prior Japanese Patent Application No. 2013-147992, filed on Jul. 16, 2013, the prior Japanese Patent Application No. 2014-022294, filed on Feb. 7, 2014, and the entire contents of which are incorporated herein by reference.

FIELD

Embodiments described herein are generally related to a semiconductor device.

BACKGROUND

As an example of achieving miniaturization of a semiconductor device, a trench gate structure in which a gate electrode is formed in a trench is employed. As the gap between trench gates is narrowed, a gate density per unit area is increased and an advantage of reducing an ON-state resistance is also increased.

On the other hand, when the gap between the trench gates becomes narrow, there is trouble for controlling the threshold of the semiconductor device and for securing a short-circuit resistance. It is important for the semiconductor device to achieve the miniaturization and an improvement in characteristics while securing the controllability and the resistance using the gate.

For example, having conductivity modulation of a high resistance semiconductor layer, a bipolar power device (a thyristor, a pn diode, an IGBT, an IEGT, a bipolar transistor, and the like) is realized with the low ON-state resistance, and is secured with a large current-carrying capability. However, for the conductivity modulation, the device is hard to make the current flow when a drain voltage (Vd) is equal to or below a built-in potential (Vbi). The bipolar power device is advantageously operated at Vd>Vbi.

On the contrary, a unipolar power device (a MOSFET or the like) has no limitation caused due to the built-in potential, and the current flows linearly in proportion to the drain voltage. However, when the drain voltage is equal to or greater than the built-in potential, the effect of the conductivity modulation cannot be used, and there is no large current-carrying capability. The unipolar power device is advantageously operated at Vd<Vbi.

There is required a device which can realize the characteristics of each of the bipolar power device and the unipolar power device, that is, maintaining a good current-carrying characteristic of the bipolar power device at Vd>Vbi, and achieving an ON-state characteristic lower than a normal MOSFET at Vbi>Vd>0V.

DETAILED DESCRIPTION OF THE DRAWINGS

FIGS. 4A to 4C are cross-sectional views schematically illustrating a semiconductor device according to the reference example.

FIGS. 6A to 6C, 7A to 7C, 8A to 8C, 9A to 9C, 10A to 10C, and 11A to 11C are cross-sectional views schematically illustrating the semiconductor device according to the modified example of the first embodiment.

Figure 12:
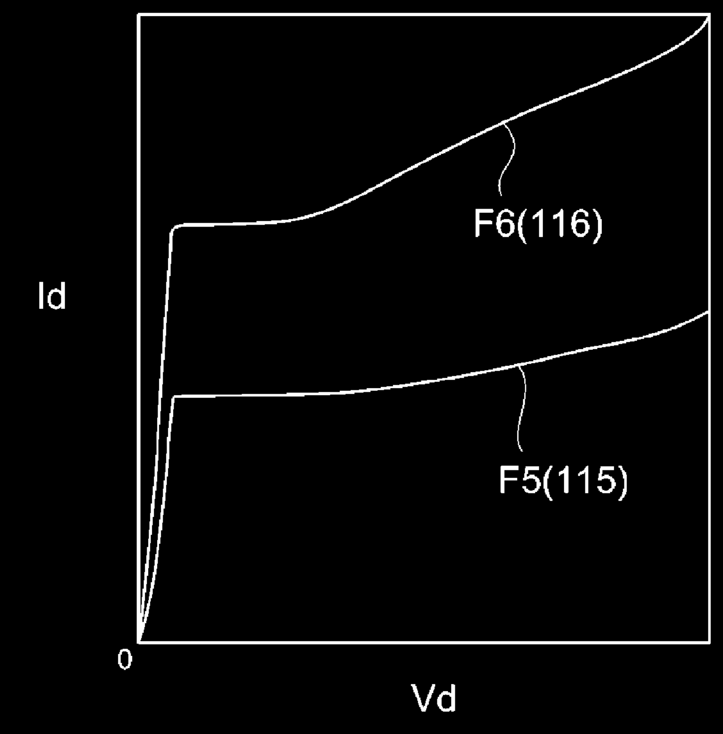

FIG. 12 is a diagram plotting a relation between a drain voltage and a drain current.

FIGS. 13A to 13C are diagrams schematically illustrating a semiconductor device according to a second embodiment.

Figure 14A:
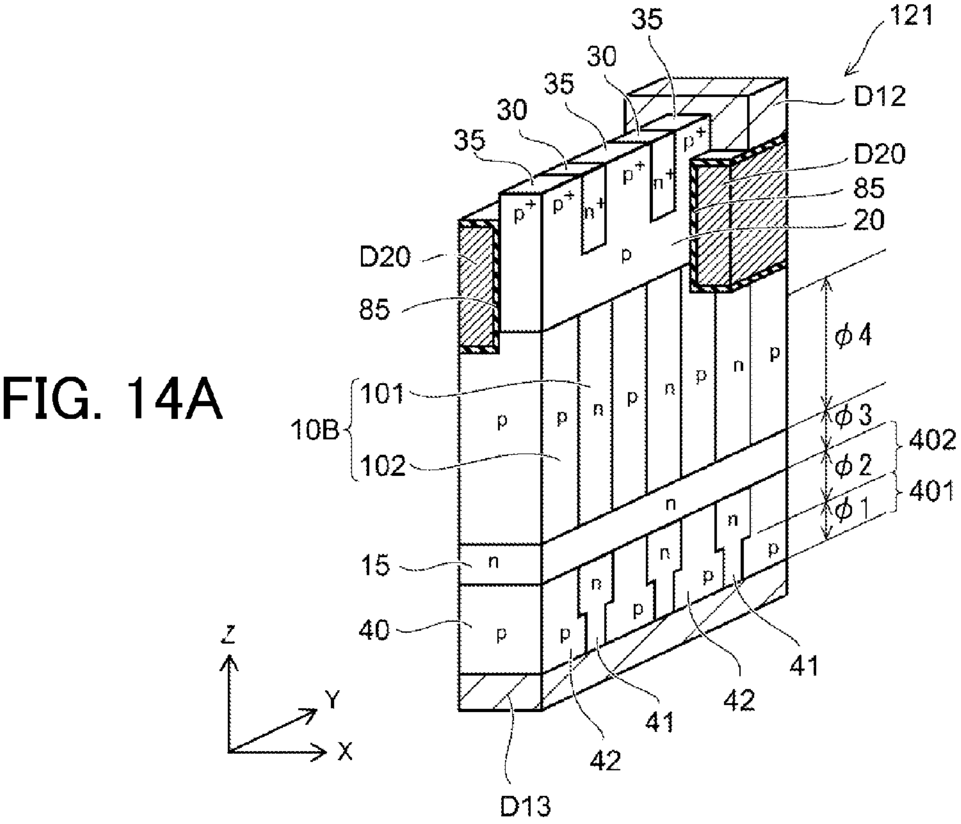
Figure 14B:
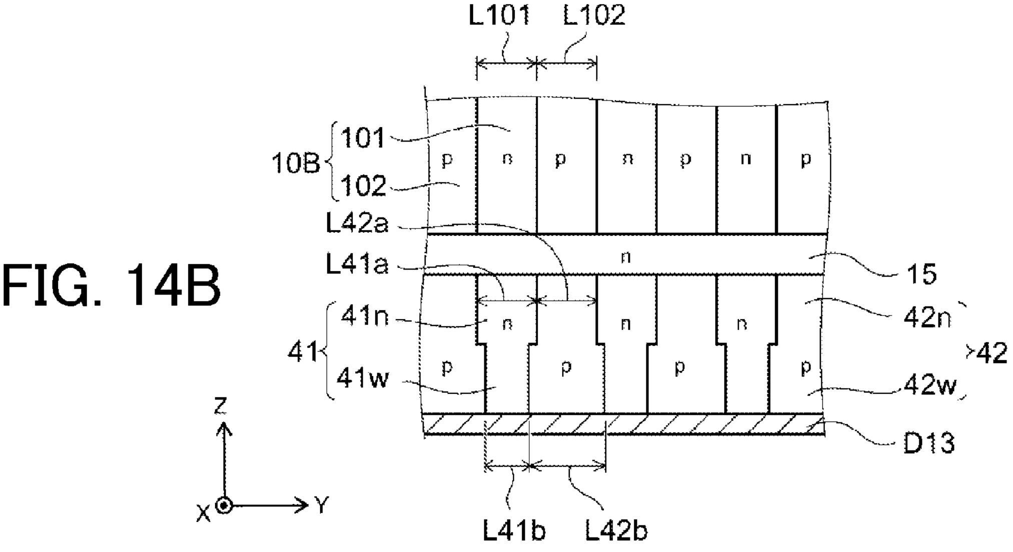

FIGS. 14A and 14B are diagram schematically illustrating a semiconductor device according to a modified example of the second embodiment.

Figure 15:
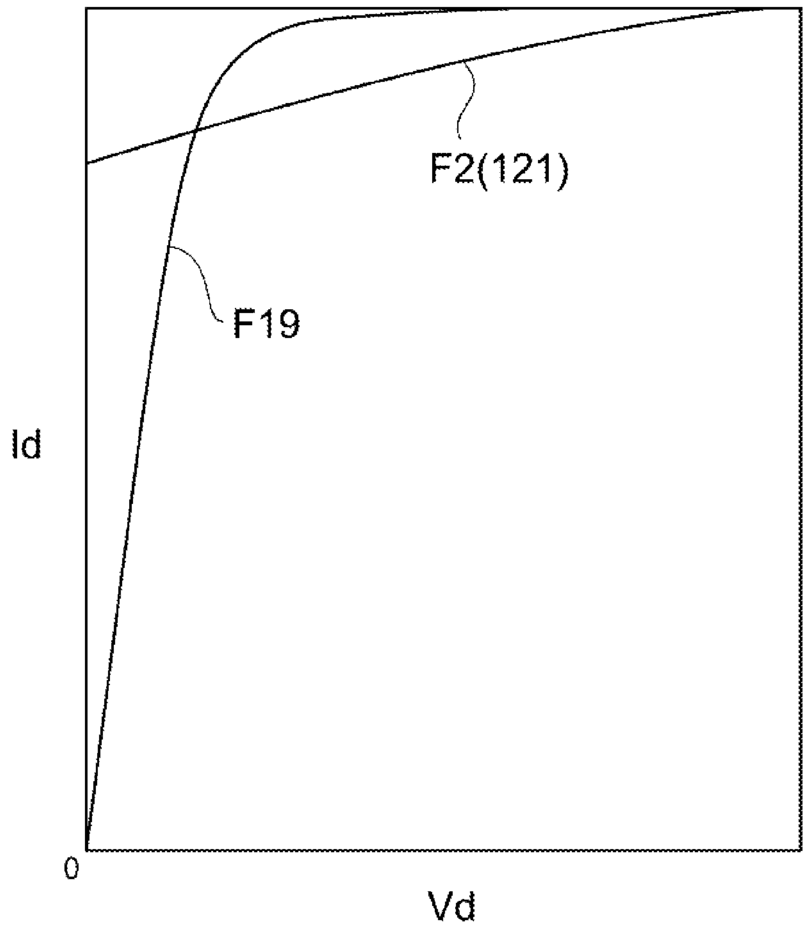

FIG. 15 is a diagram plotting a relation between a drain voltage and a drain current.

Figure 16:
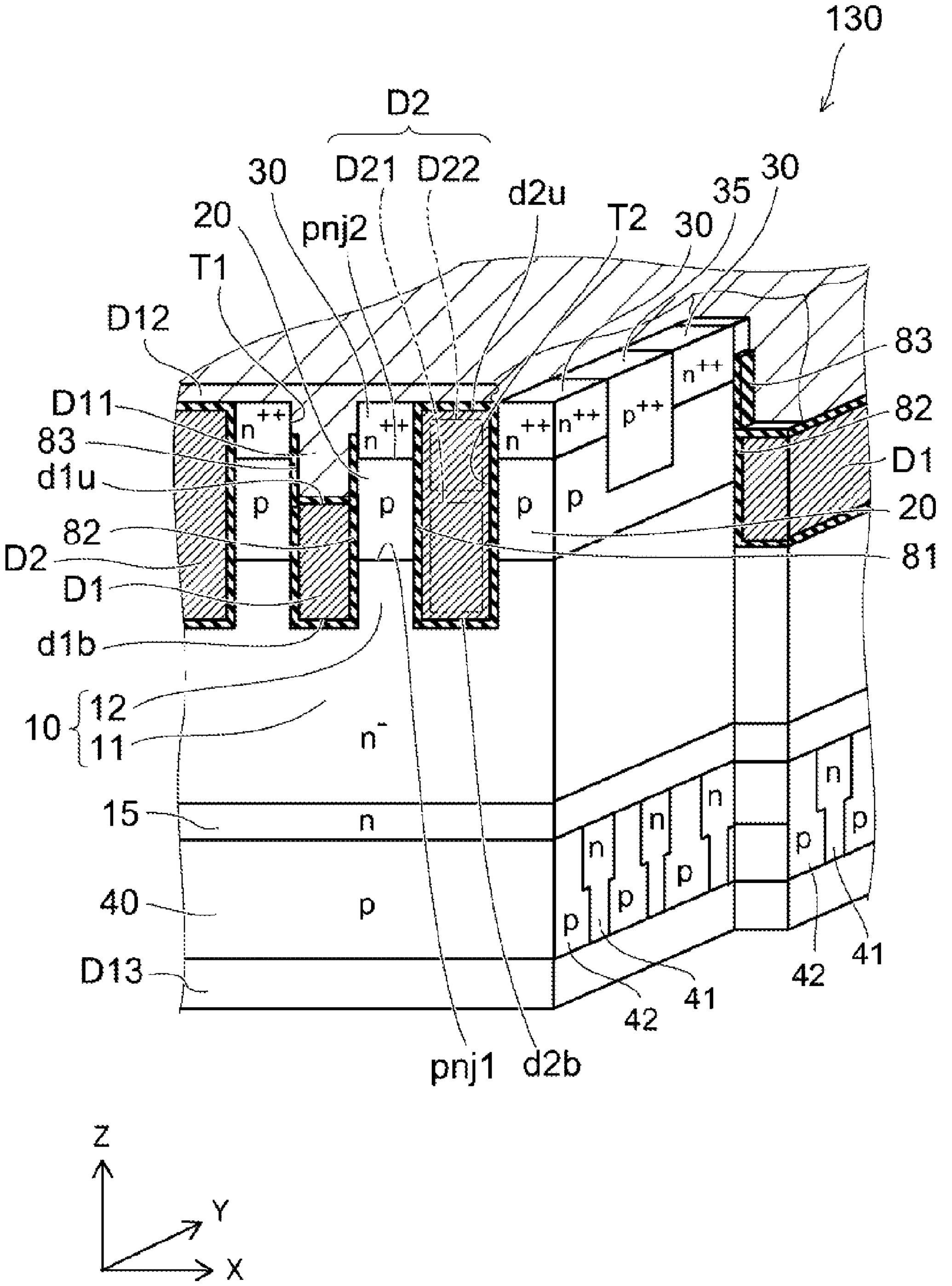

FIG. 16 is a perspective view schematically illustrating a semiconductor device according to a third embodiment.

Figure 17:
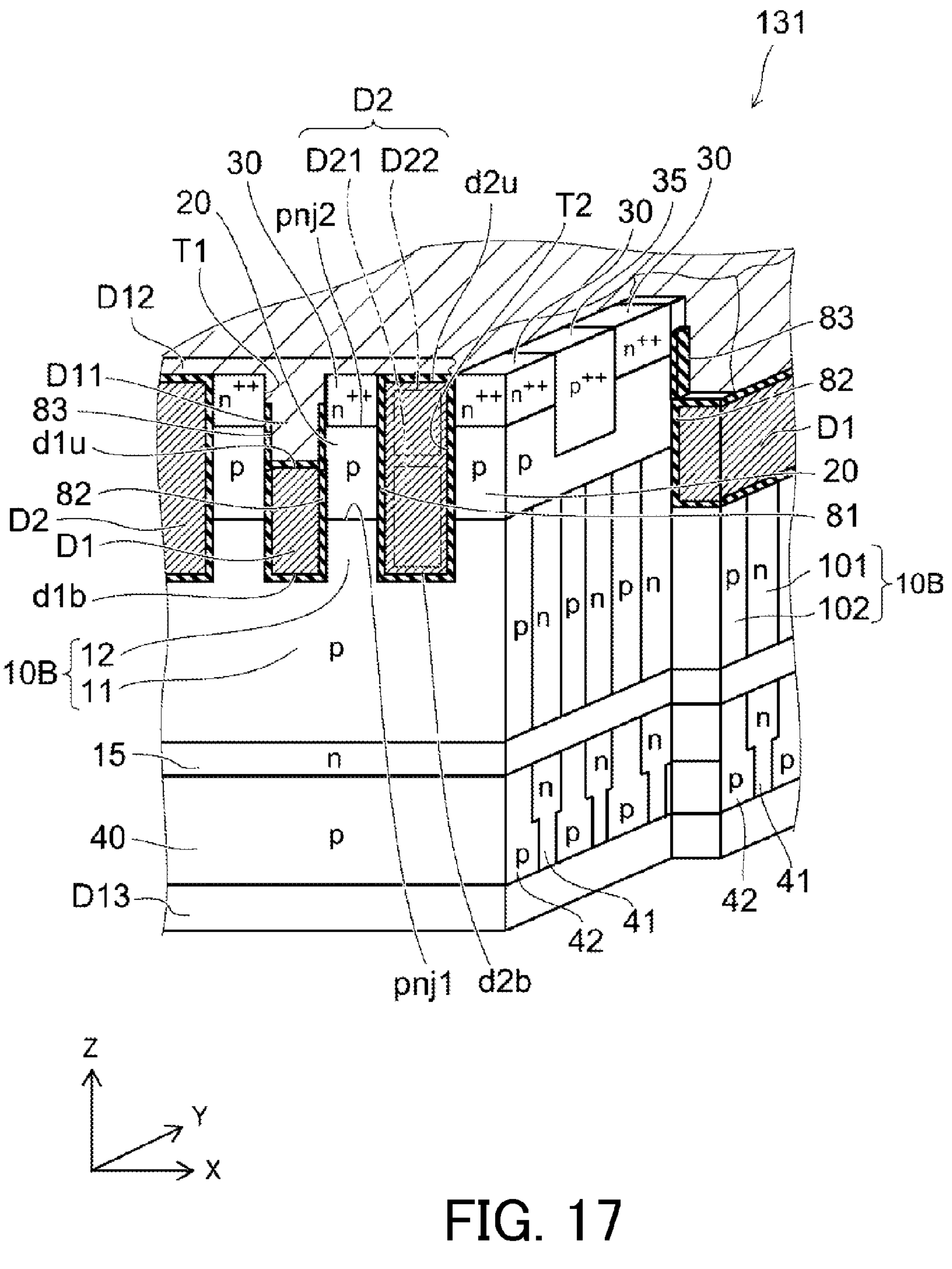

FIG. 17 is a perspective view schematically illustrating a semiconductor device according to a modified example of the third embodiment.

Figure 18:
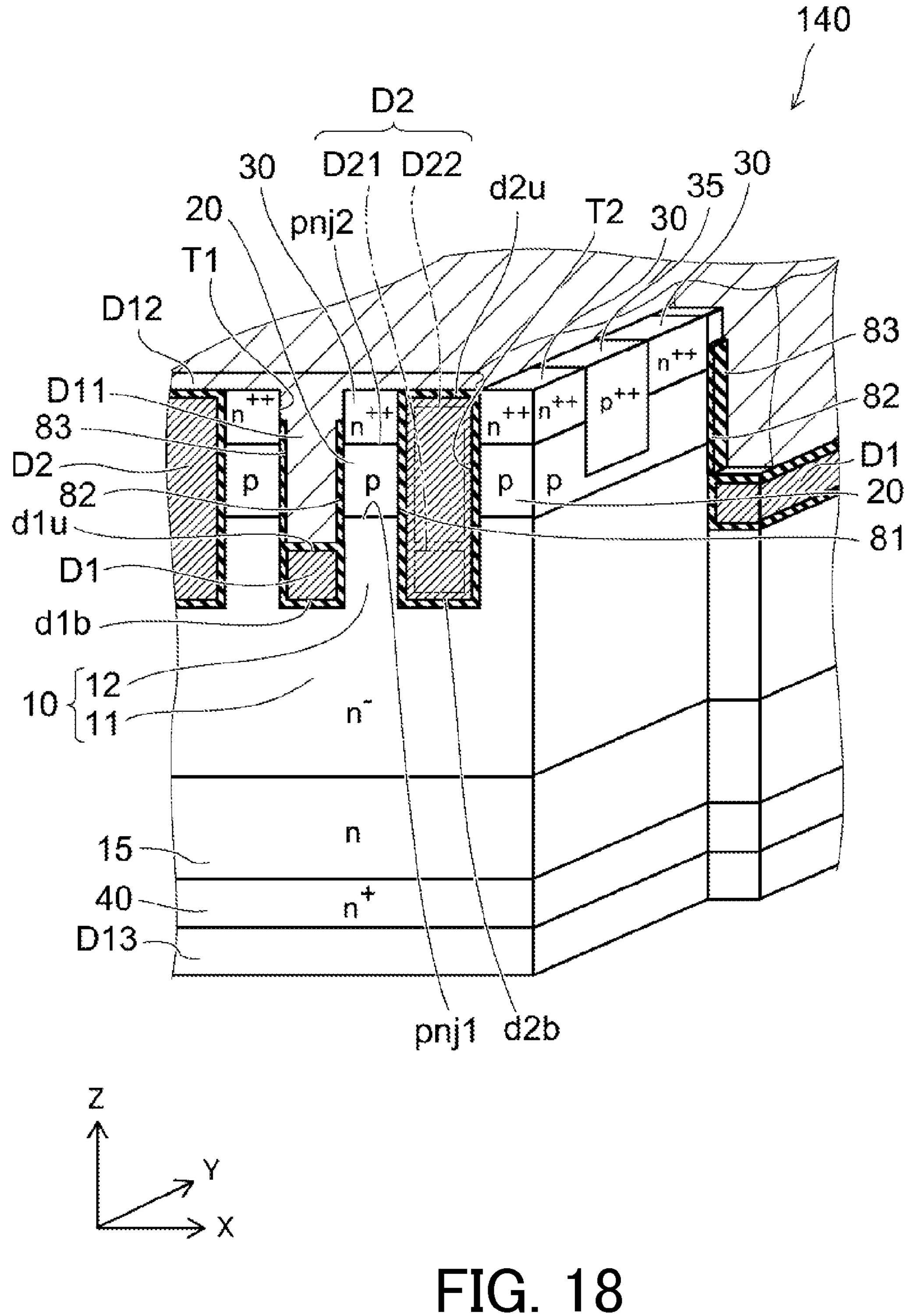

FIG. 18 is a perspective view schematically illustrating a semiconductor device according to a fourth embodiment.

FIGS. 19A to 19C are cross-sectional views schematically illustrating the semiconductor device according to the fourth embodiment.

Figure 20:
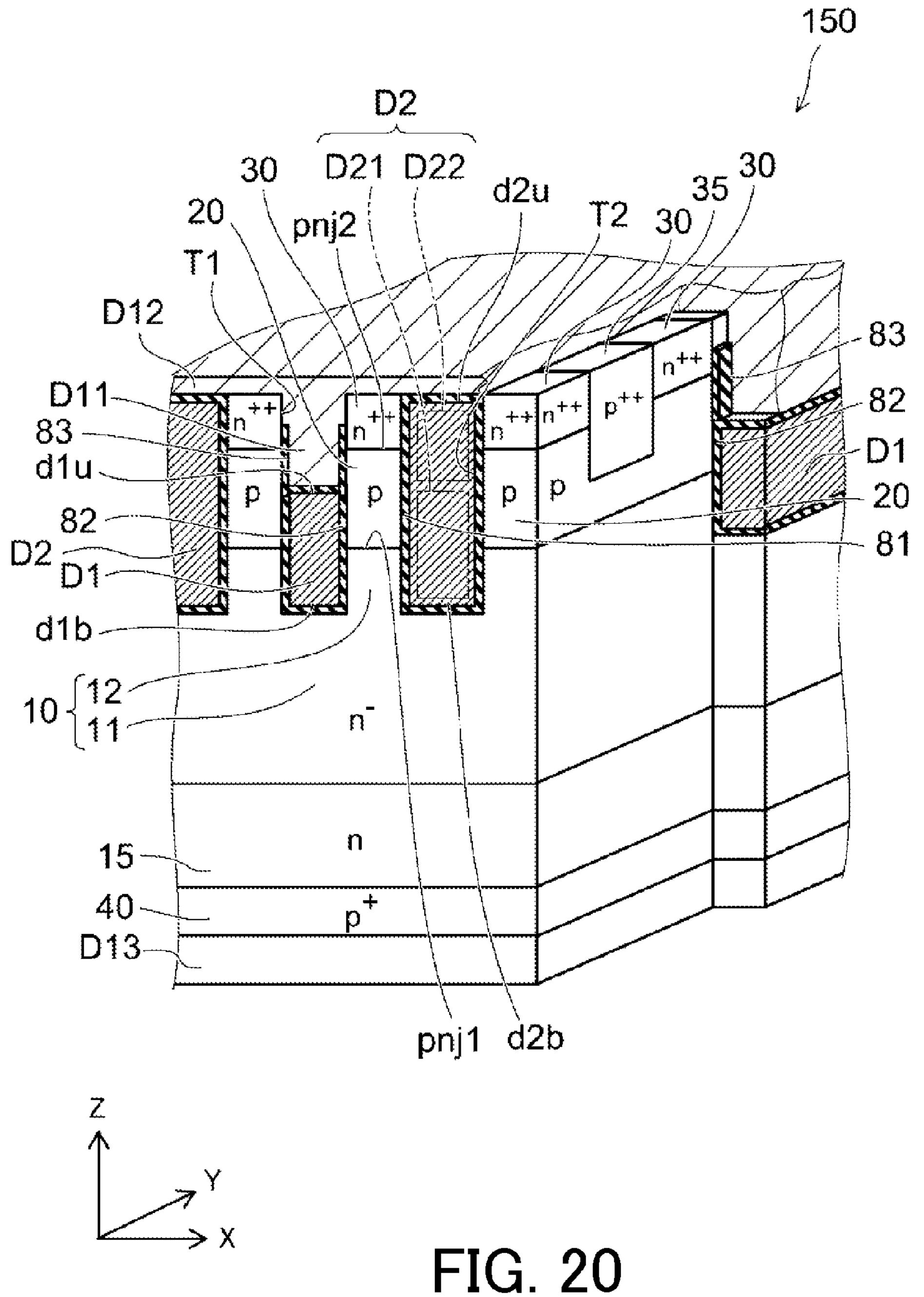

FIG. 20 is a perspective view schematically illustrating a semiconductor device according to a fifth embodiment.

Figure 21:
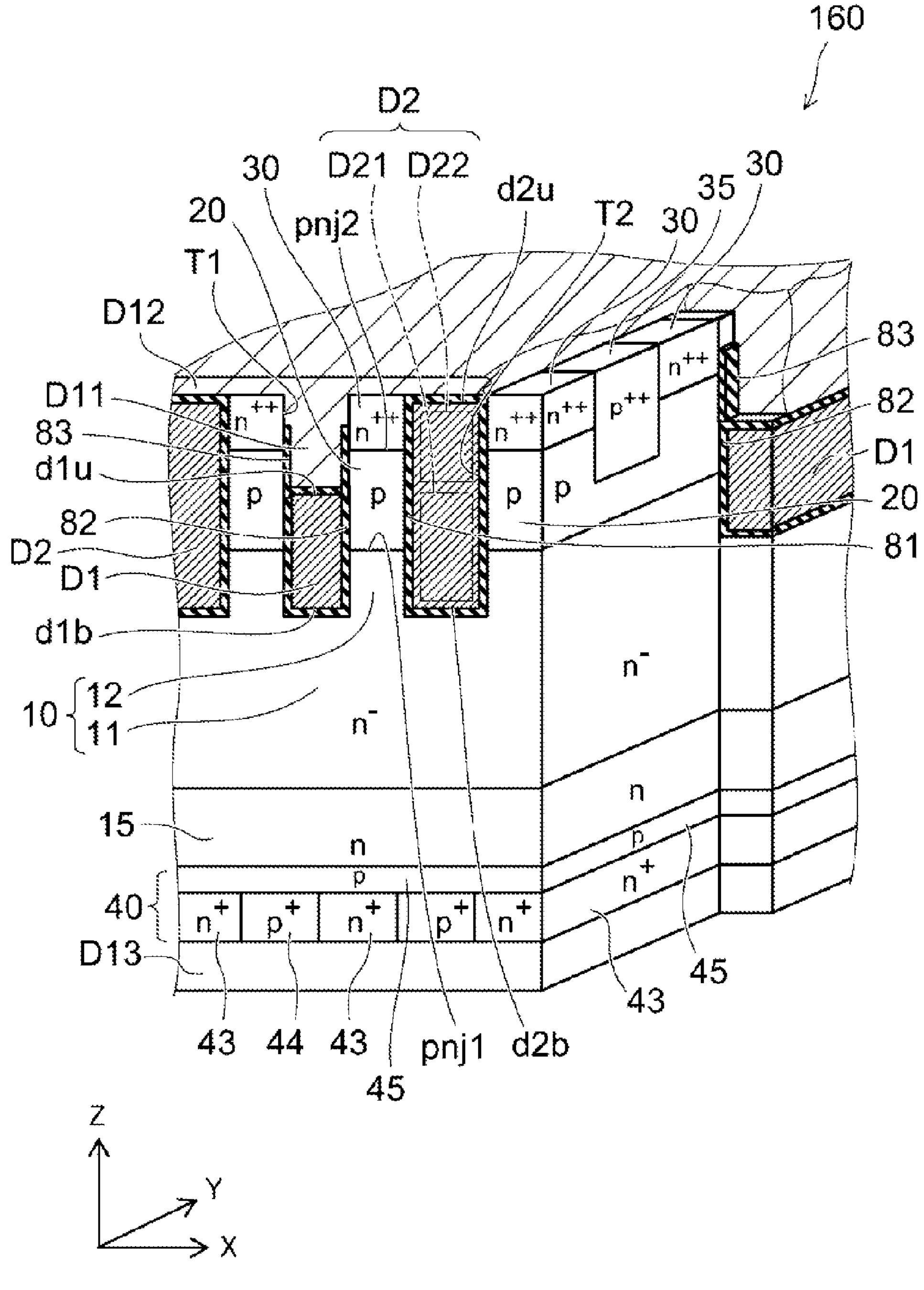

FIG. 21 is a perspective view schematically illustrating a semiconductor device according to a sixth embodiment.

Figure 22:
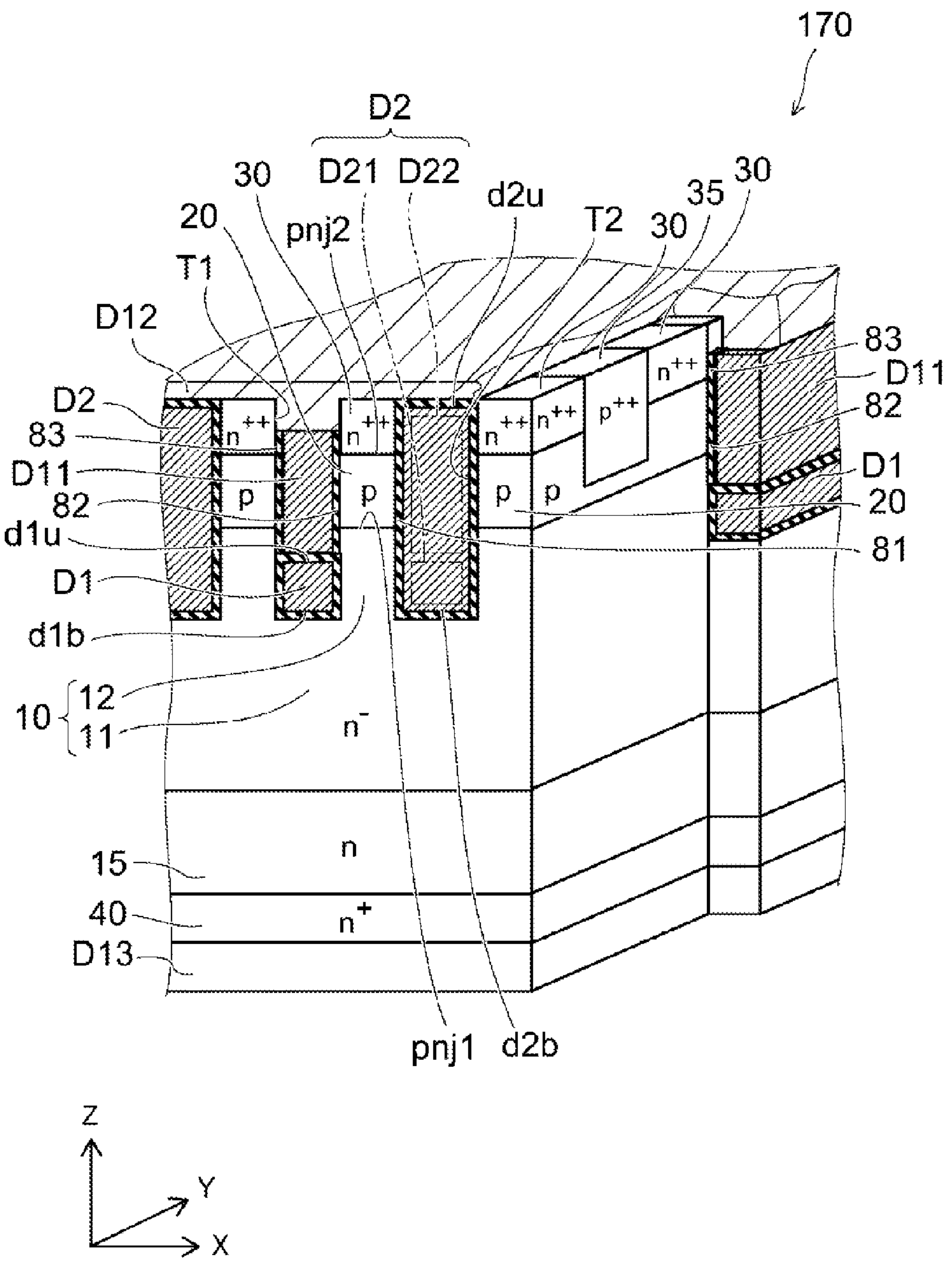

FIG. 22 is a perspective view schematically illustrating a semiconductor device according to a seventh embodiment.

Figure 23:
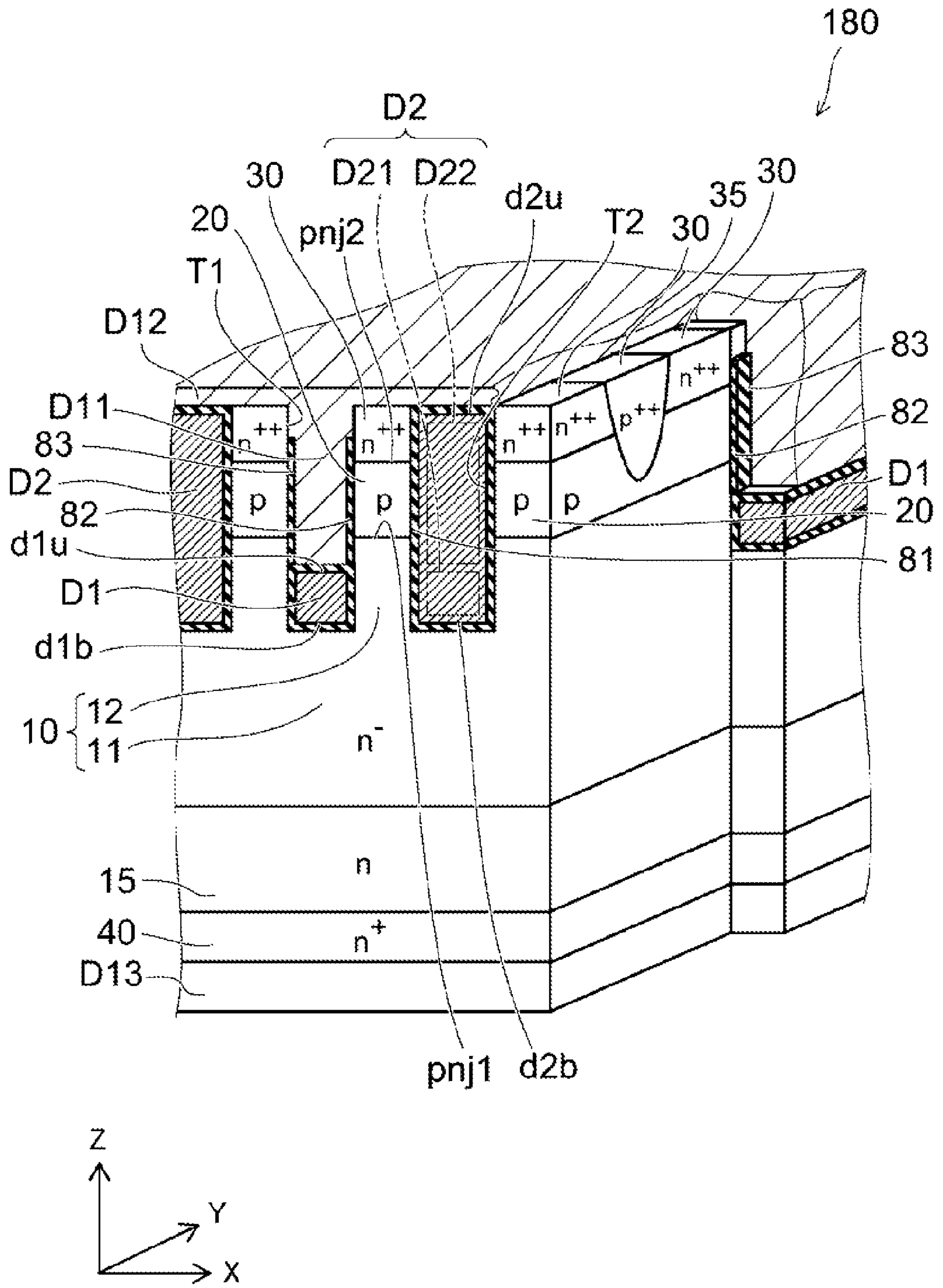

FIG. 23 is a perspective view schematically illustrating a semiconductor device according to an eighth embodiment.

Figure 24A:
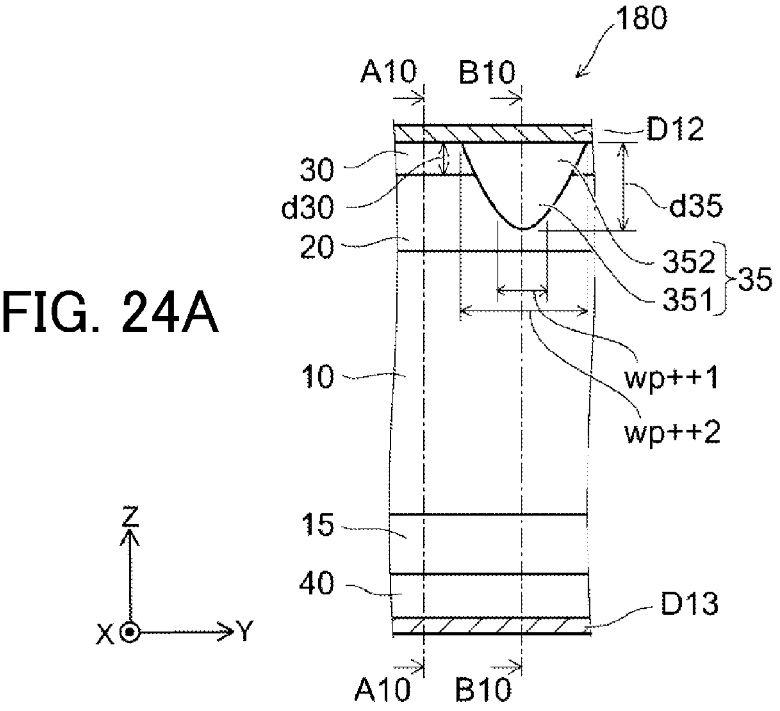
Figure 24B:
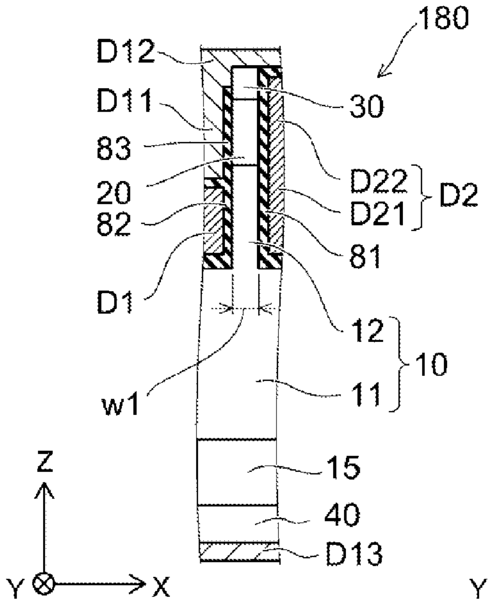
Figure 24C:
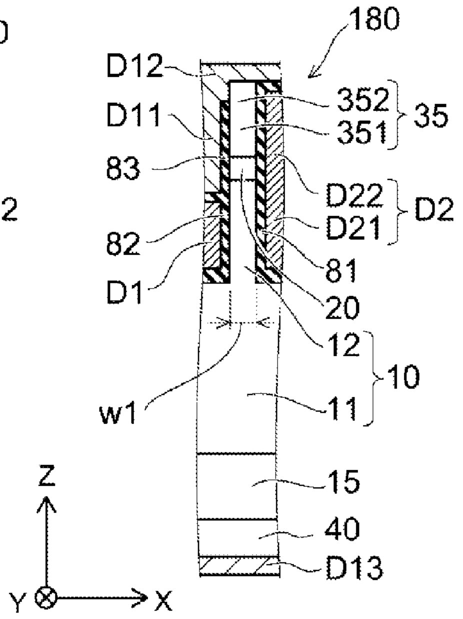

FIGS. 24A to 24C are cross-sectional views schematically illustrating the semiconductor device according to the eighth embodiment.

Figure 25:
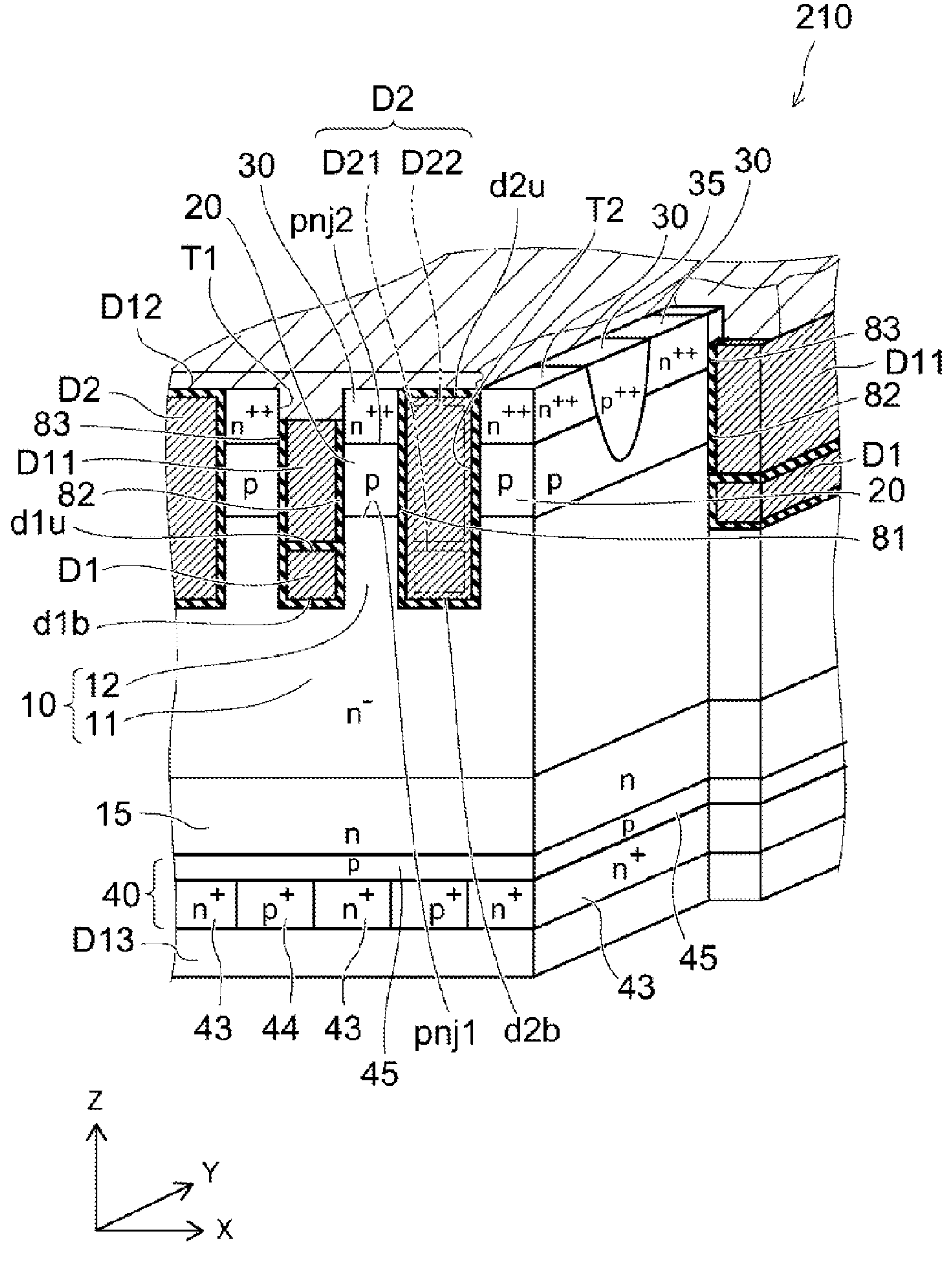

FIG. 25 is a perspective view schematically illustrating a semiconductor device according to a ninth embodiment.

Figure 26:
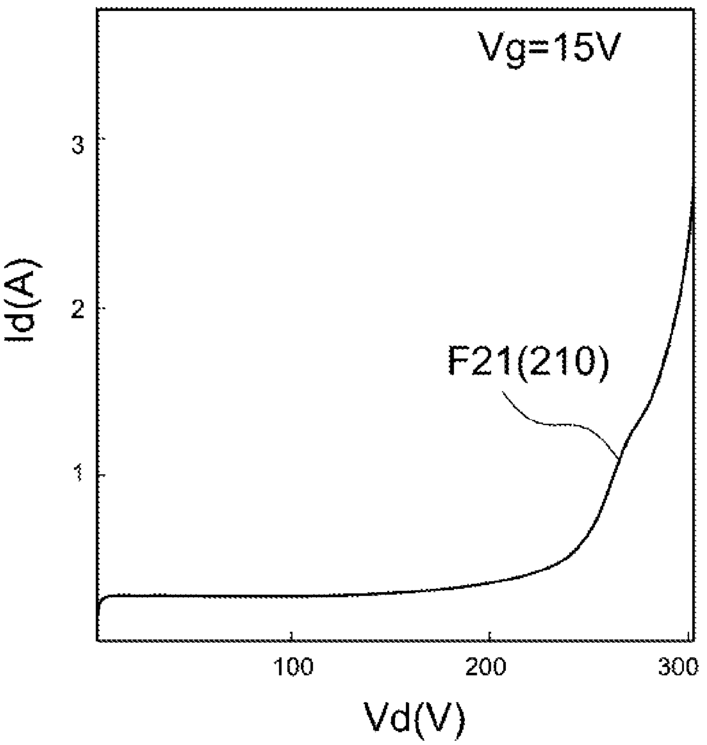

FIG. 26 is a diagram plotting a feature of a semiconductor device.

Figure 27:
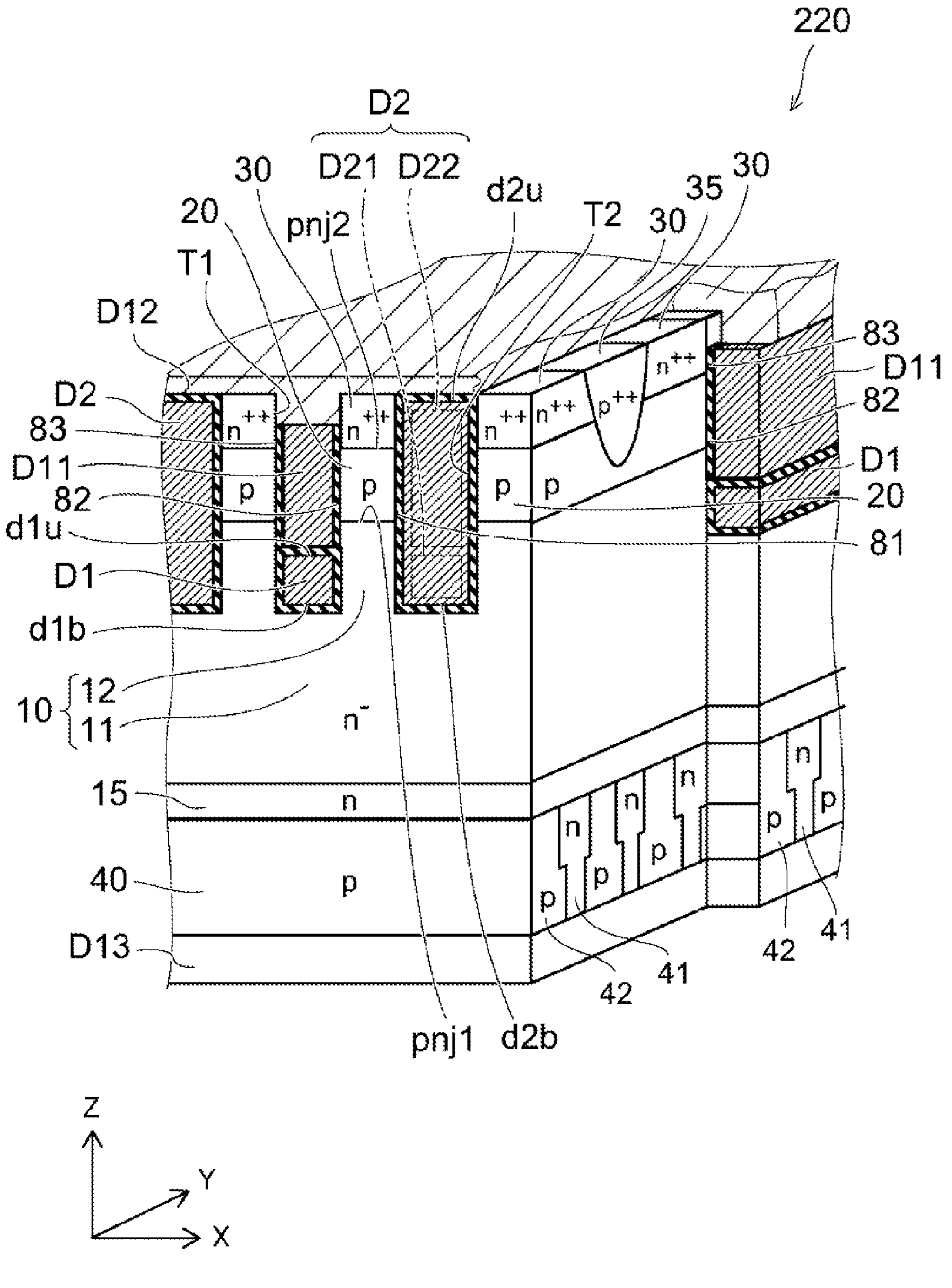

FIG. 27 is a perspective view schematically illustrating a semiconductor device according to a tenth embodiment.

Figure 28:
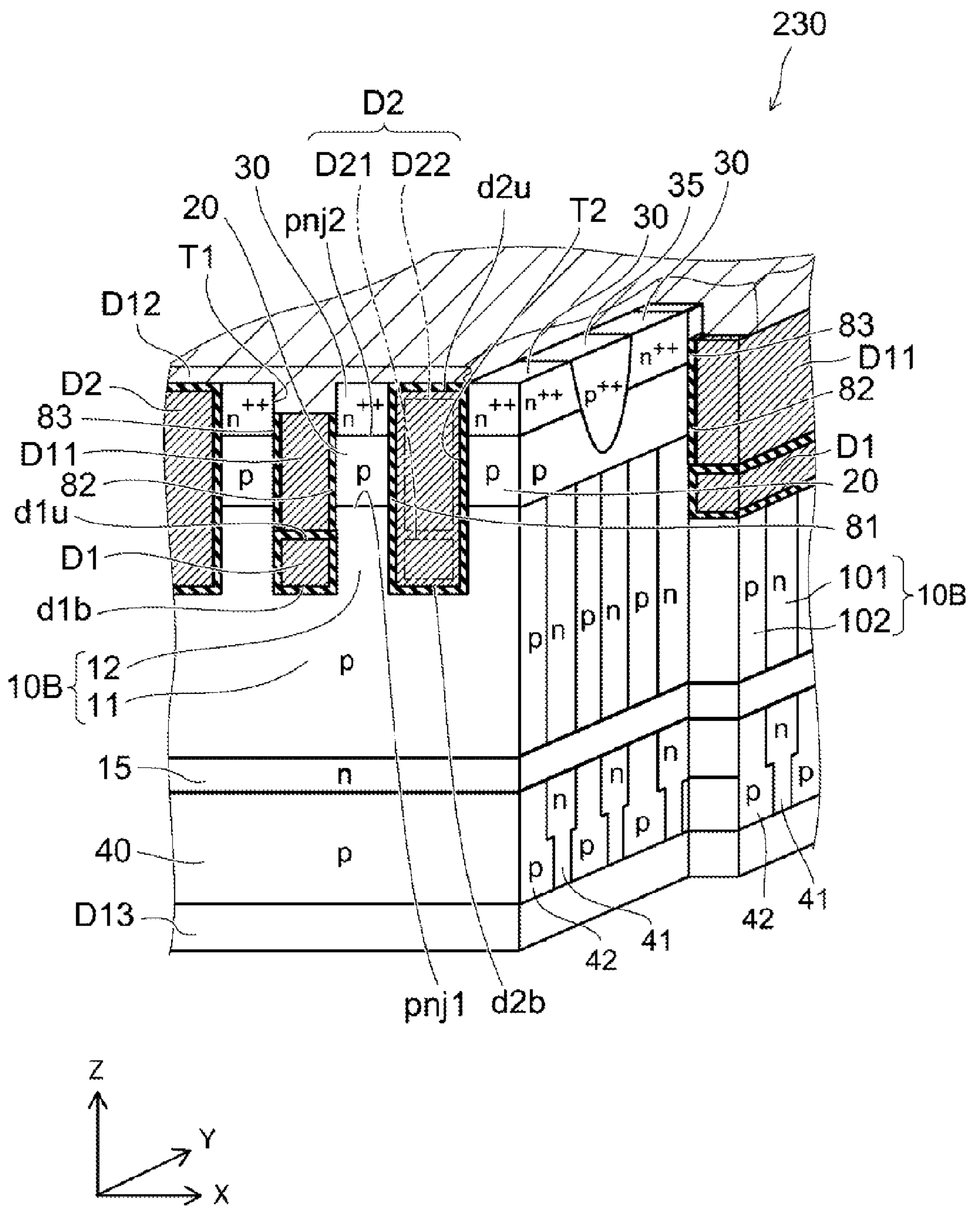

FIG. 28 is a perspective view schematically illustrating a semiconductor device according to an eleventh embodiment.

Figure 29:
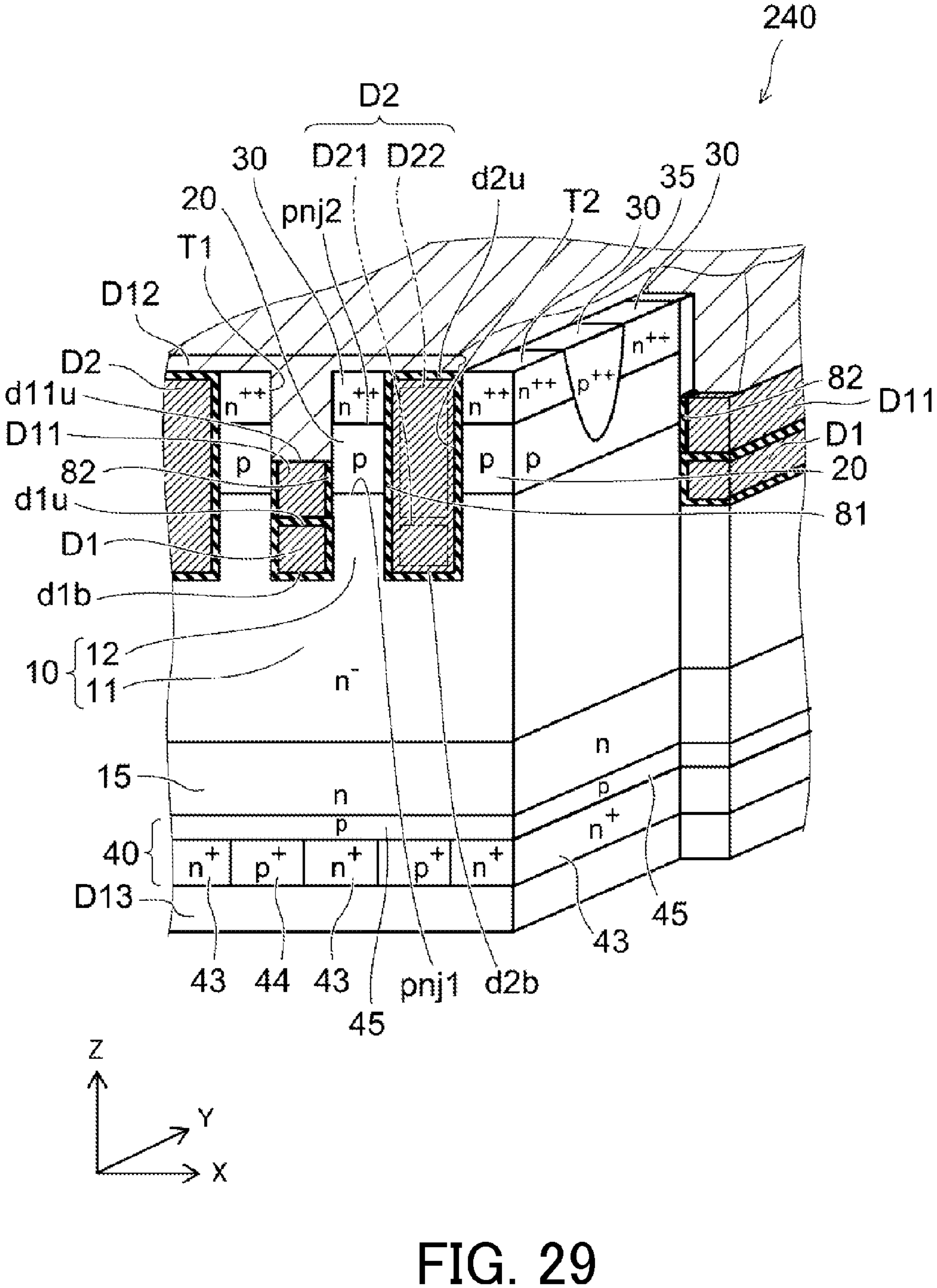

FIG. 29 is a perspective view schematically illustrating a semiconductor device according to a twelfth embodiment.

Figure 30:
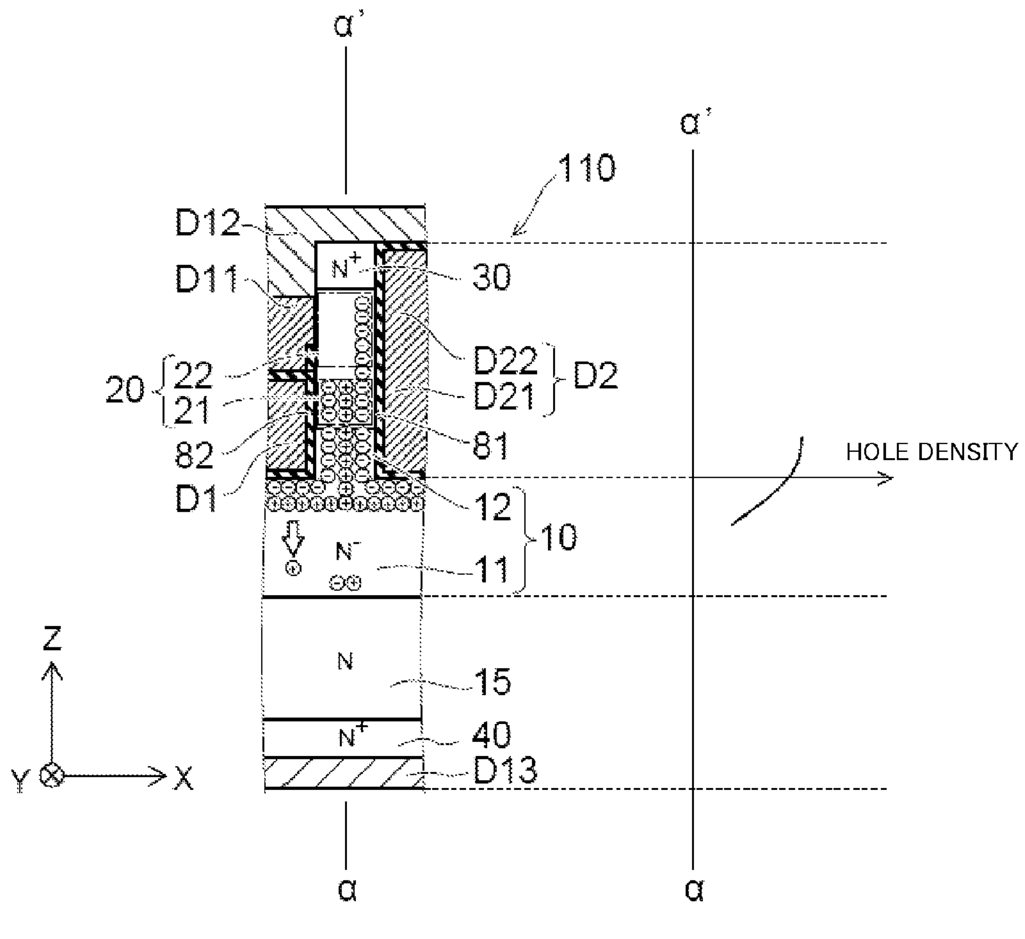

FIG. 30 is a cross-sectional view schematically illustrating the operation of the semiconductor device.

Figure 31A:
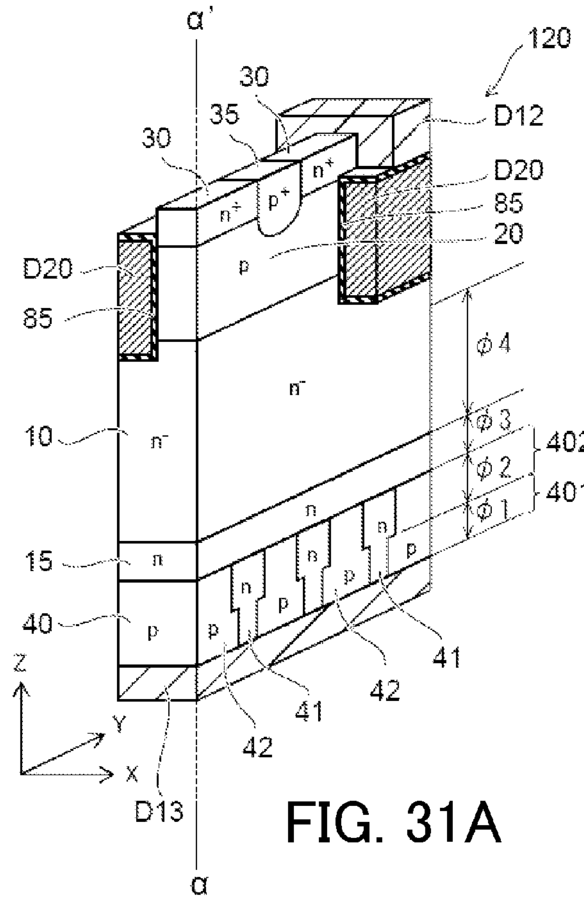
Figure 31C:
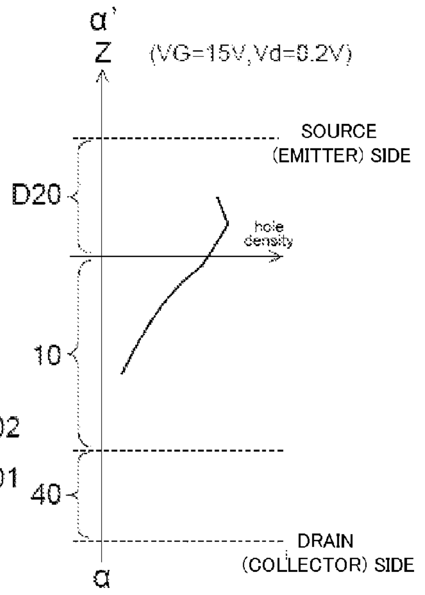
Figure 31B:
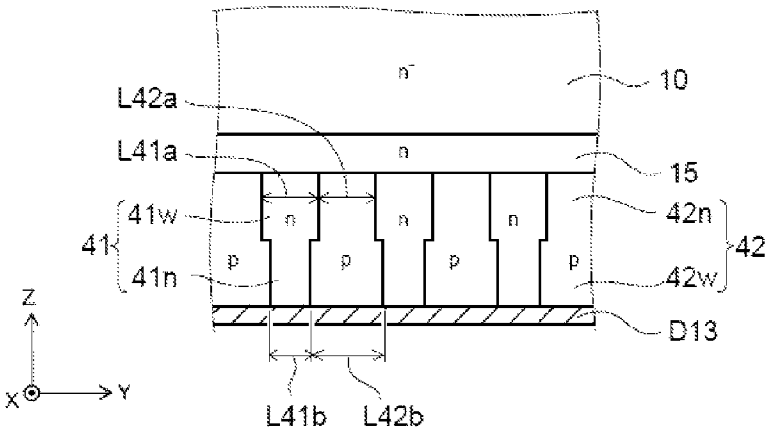

FIG. 31A is a perspective view schematically illustrating a semiconductor device according to a modified example of a twelfth embodiment. FIG. 31B is a cross-sectional view schematically illustrating the structure on a side near the drain. FIG. 31C is a diagram plotting a hole density in a cross section taken along line $\alpha$-$\alpha'$ of FIG. 31A under a condition of Vd<Vbi.

Figure 32:
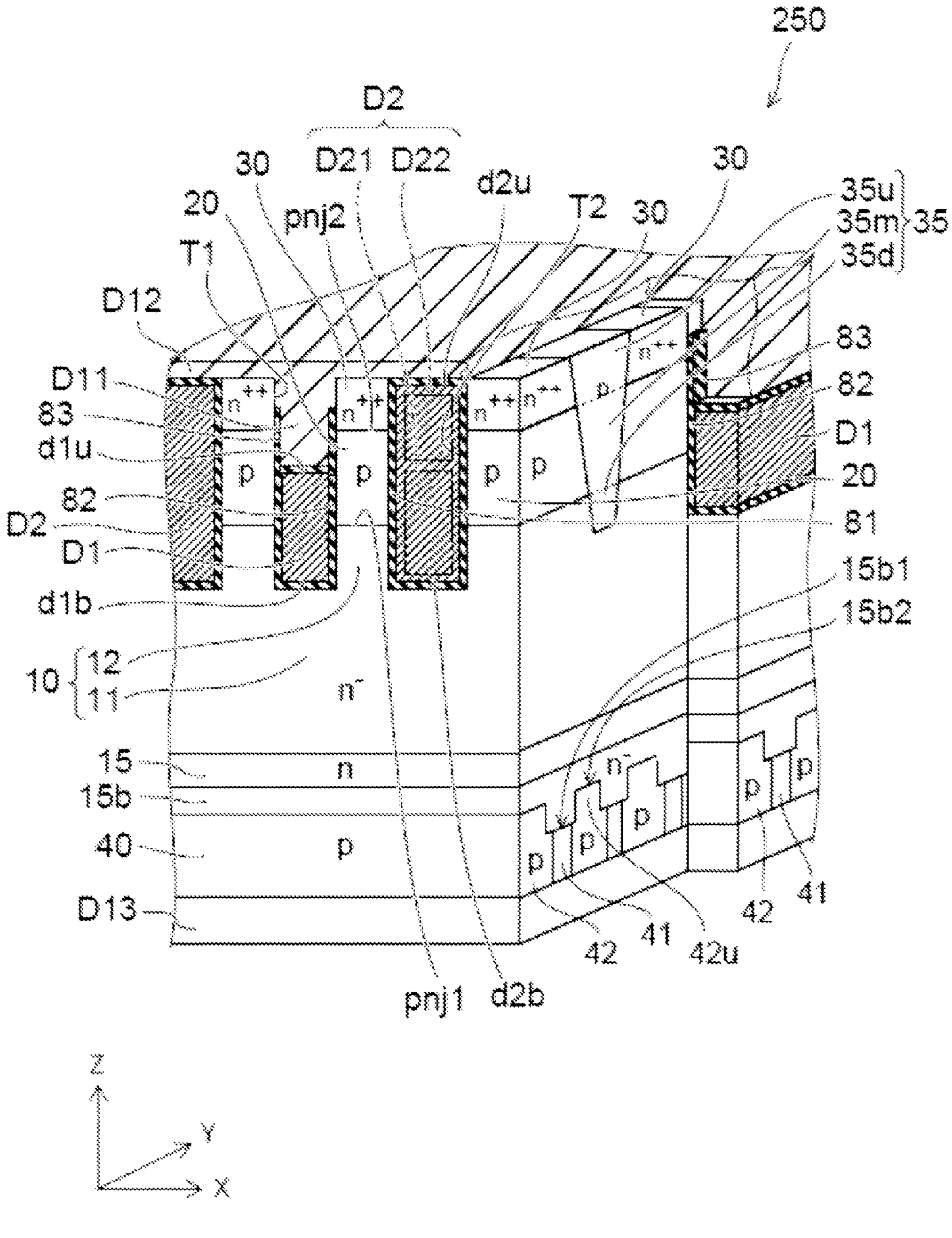

FIG. 32 is a perspective view schematically illustrating a semiconductor device according to a thirteenth embodiment.

Figure 33A:
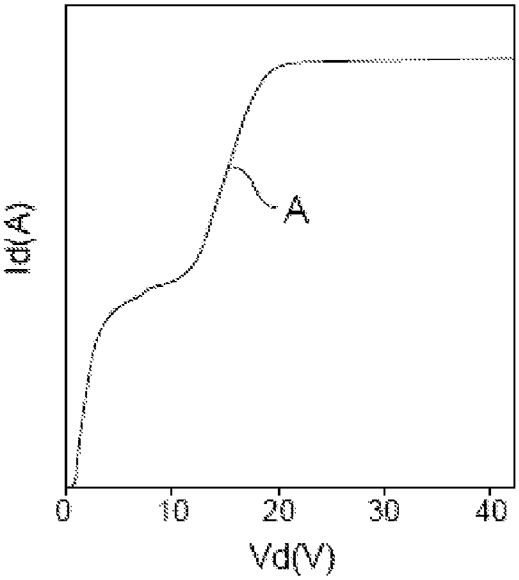
Figure 33B:
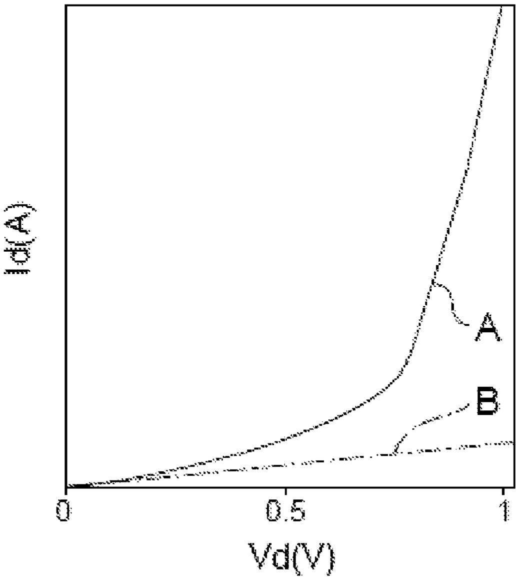

FIGS. 33A and 33B are diagrams illustrating relations between a drain voltage and a drain current.

Figure 34A:
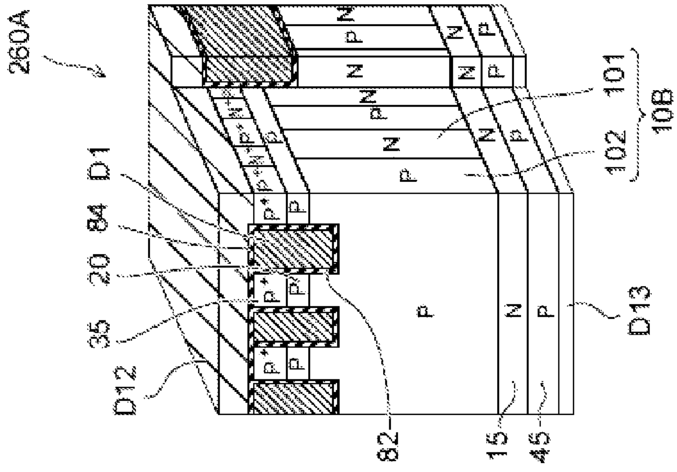
Figure 34B:
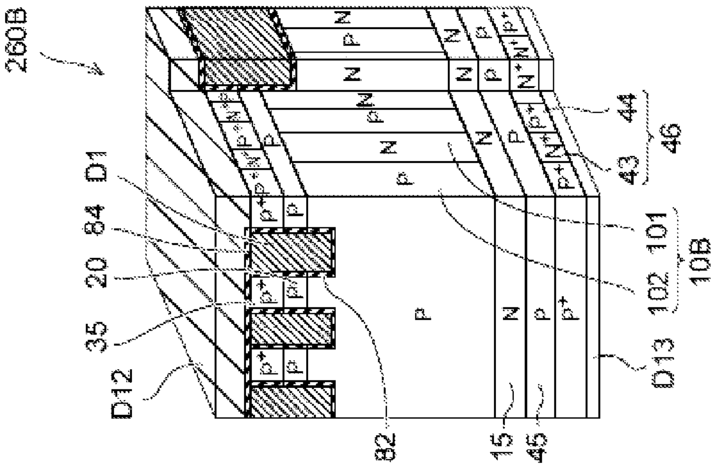
Figure 34C:
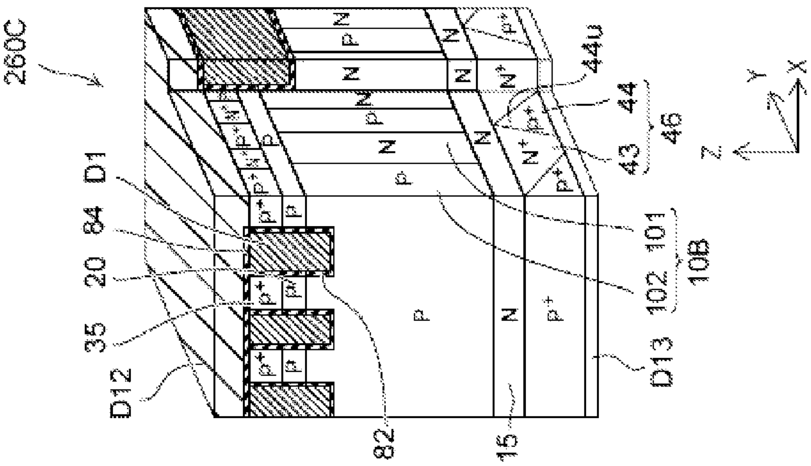

FIG. 34A is a perspective view schematically illustrating a semiconductor device according to a first example of a fourteenth embodiment. FIG. 34B is a perspective view schematically illustrating a semiconductor device according to a second example of the fourteenth embodiment. FIG. 34C is a perspective view schematically illustrating a semiconductor device according to a third example of the fourteenth embodiment.

Figure 35:
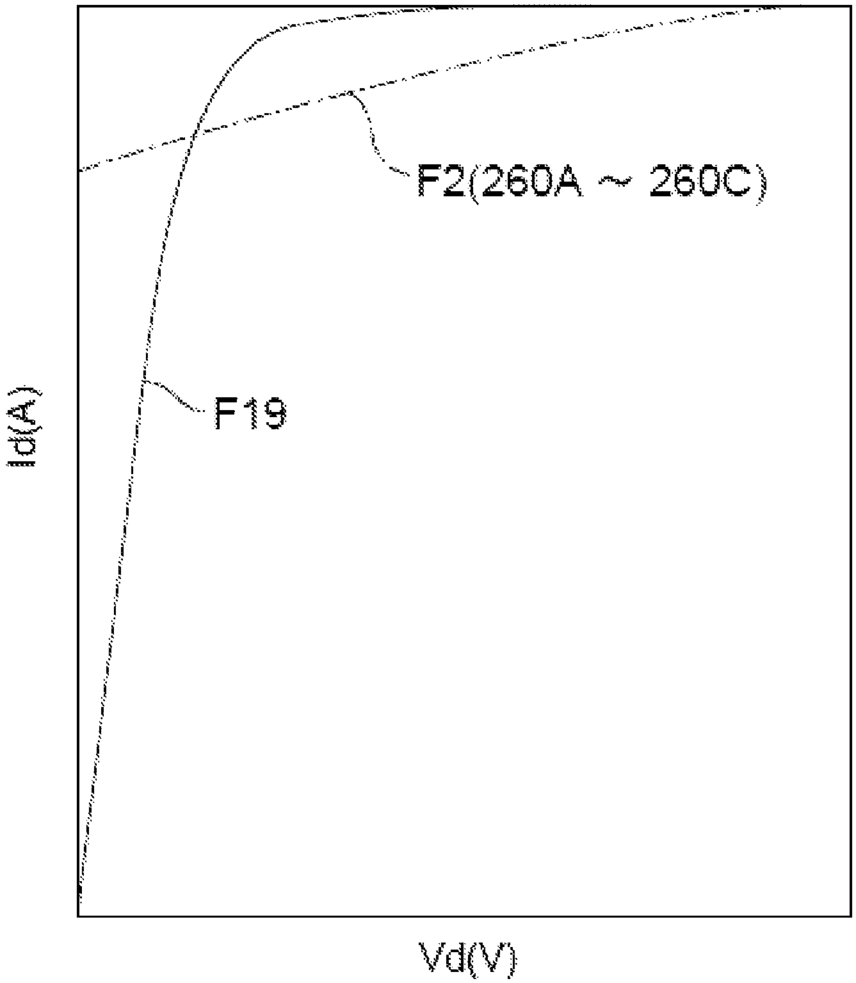

FIG. 35 is a diagram plotting a relation between a drain voltage and a drain current.

Figure 36:
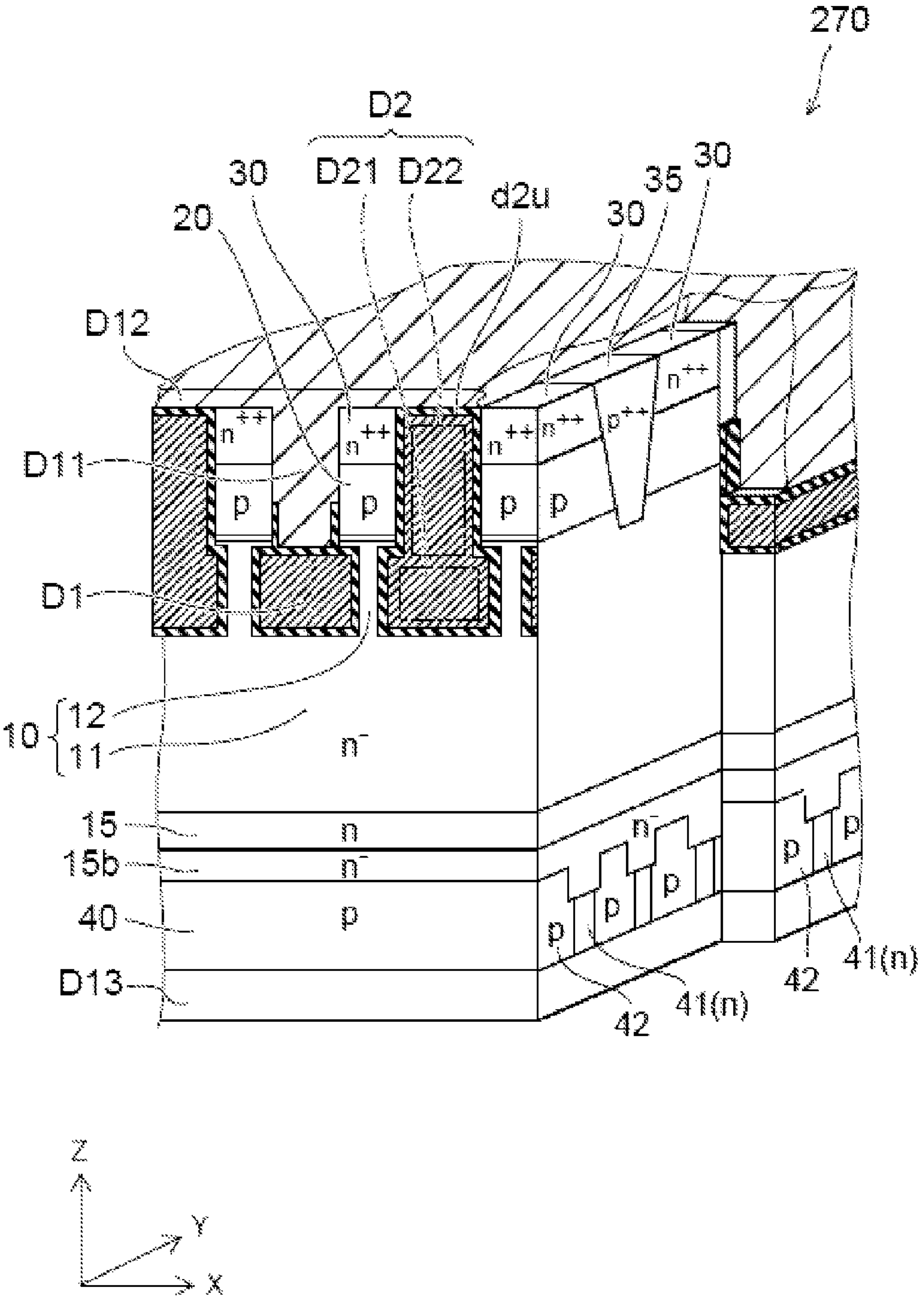

FIG. 36 is a perspective view schematically illustrating a semiconductor device according to a fifteenth embodiment.

Figure 37:
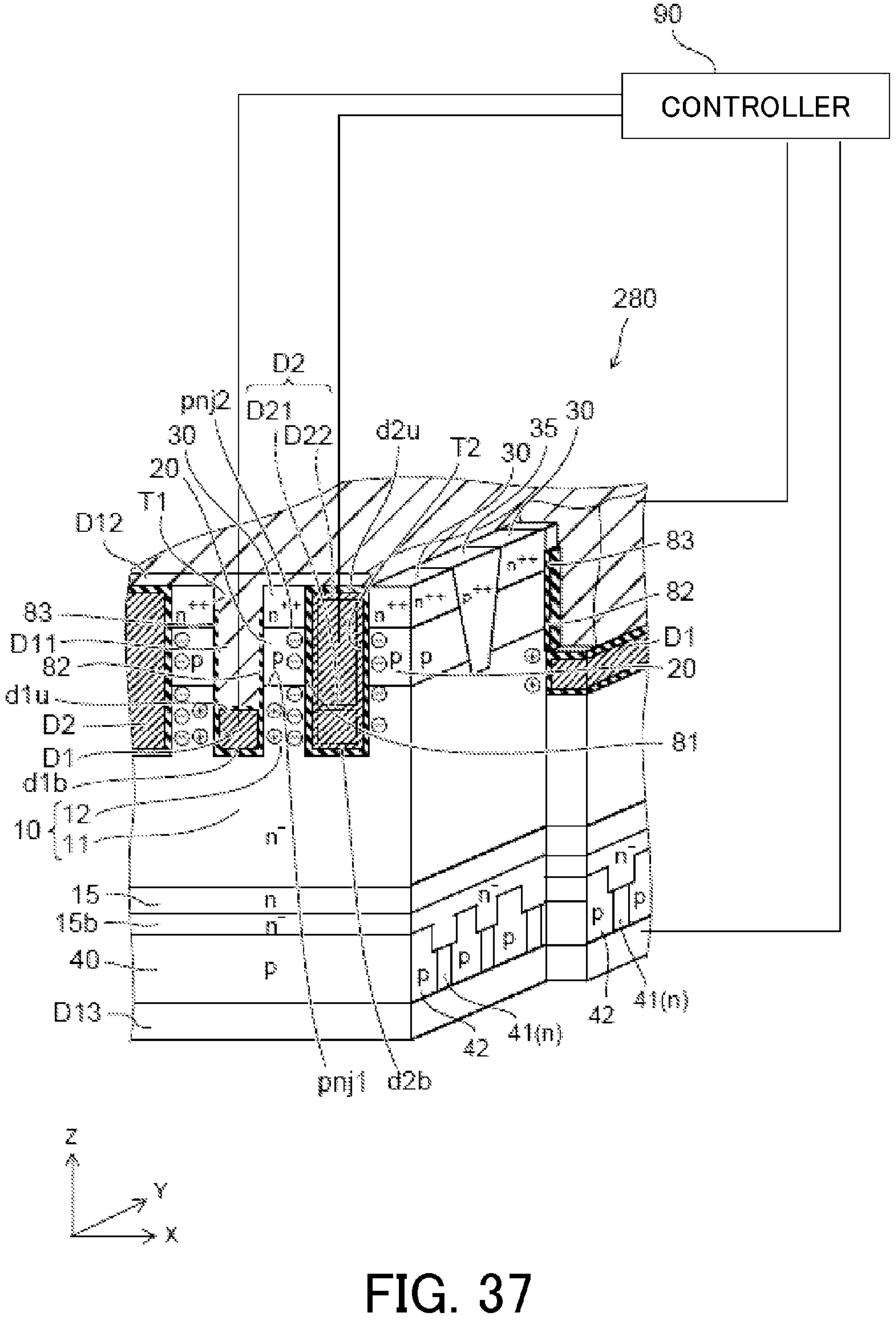

FIG. 37 is a perspective view schematically illustrating a semiconductor device according to a sixteenth embodiment.

Figure 38A:
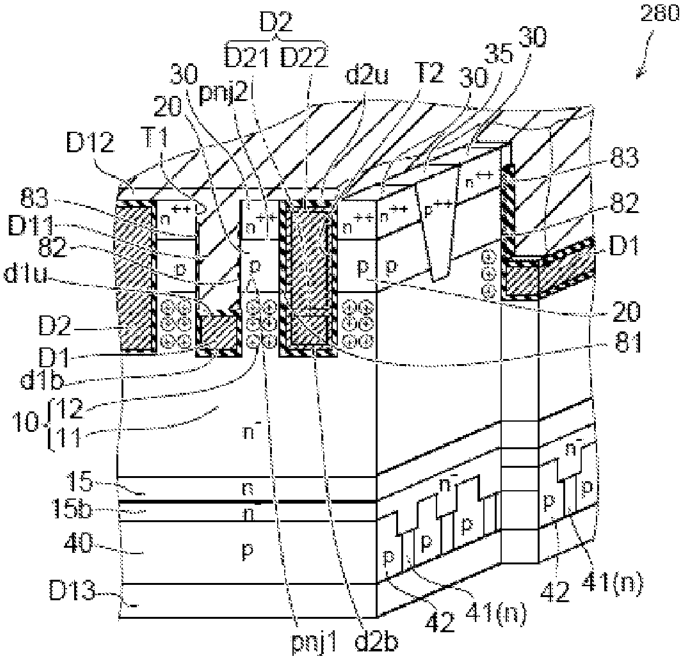
Figure 38B:
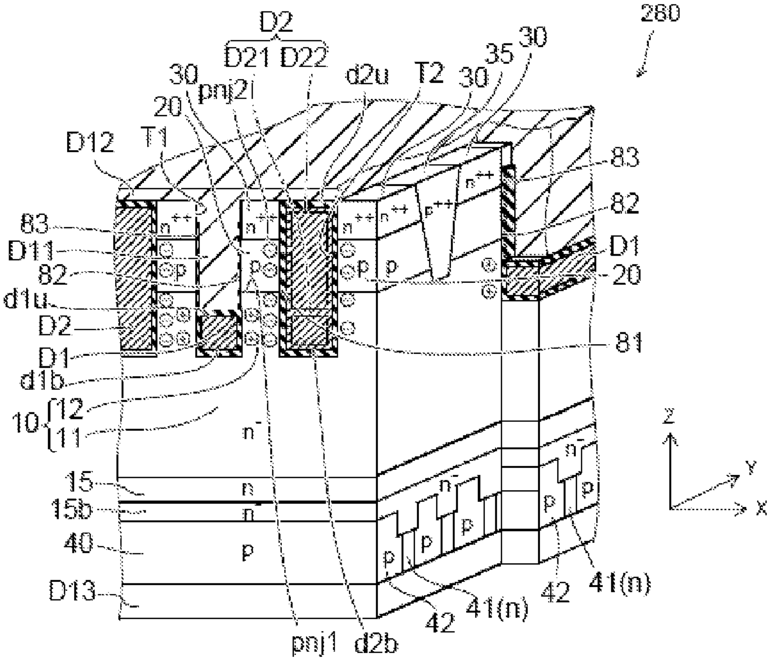

FIGS. 38A and 38B are perspective views schematically illustrating the operations of the semiconductor device according to the sixteenth embodiment.

Figure 39:
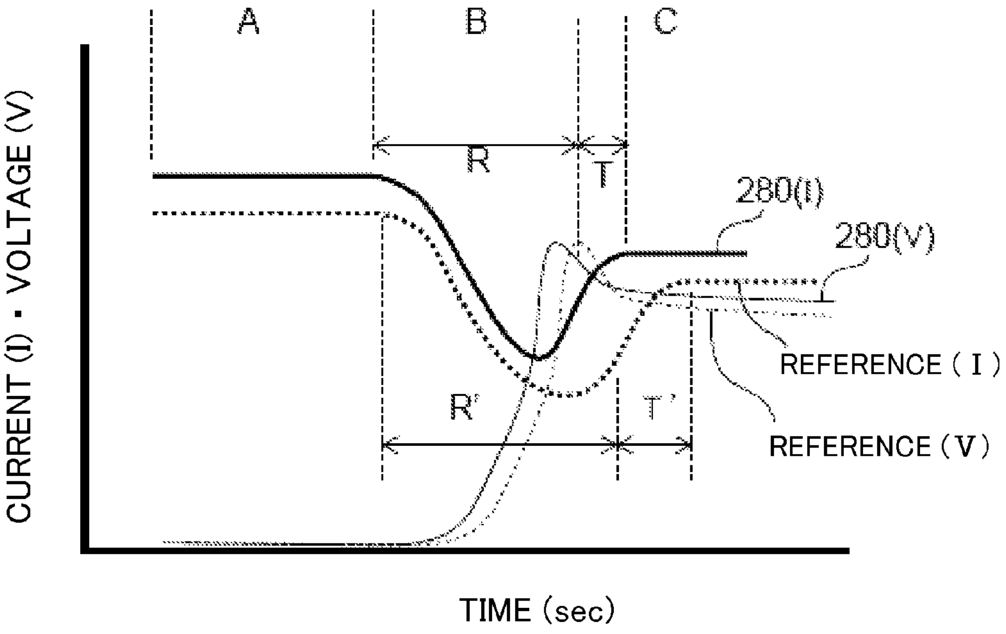

FIG. 39 is a graph showing the operation of the semiconductor device according to the sixteenth embodiment.

DETAILED DESCRIPTION

According to one embodiment, a semiconductor device includes a first semiconductor region, a first control electrode, a first electrode, a second control electrode, a second semiconductor region, a third semiconductor region, a first insulating film, a second electrode, and a third electrode.

The first semiconductor region is a semiconductor region of a first conductivity type.

The first control electrode is provided on or above the first semiconductor region.

The first electrode is provided on the first control electrode.

The second control electrode is provided on or above the first semiconductor region. The second control electrode includes a first portion and a second portion. The first portion is beside the first control electrode. The second portion is provided on the first portion and beside the first electrode.

The second semiconductor region is provided on the first semiconductor region. The second semiconductor region is a semiconductor region of a second conductivity type.

The third semiconductor region is provided on the second semiconductor region. The third semiconductor region is a semiconductor region of the first conductivity type.

The first insulating film is provided between the second semiconductor region and the second portion.

The second electrode is electrically connected to the third semiconductor region and the first electrode.

The third electrode is electrically connected to the first semiconductor region.

Embodiments will be described below with reference to the drawings. In the drawings, the same reference numerals show the same or similar portions. The same portions in the drawings are denoted by the same numerals and a detailed explanation of the same portions is appropriately omitted, and different portions will be described.

In the following description, notations $n^+$, n, $n^-$, $p^+$, p, and $p^-$ represent relative levels in impurity concentrations of the respective conductivity types. In other words, $n^+$ means an n-type impurity concentration relatively higher than that of n, and $n^-$ means an n-type impurity concentration relatively lower than that of n. $p^+$ means a p-type impurity concentration relatively higher than that of p, and $p^-$ means a p type impurity concentration relatively lower than that of p. As the number of plus signs ("+") increases, it means that the impurity concentration is high. As the number of minus signs ("−") increases, it means that the impurity concentration is low. A specific example will be given as an example assuming that a first conductivity type is assumed to be an n type and a second conductivity type is assumed to be a p-type in the following description.

First Embodiment

Figure 1:
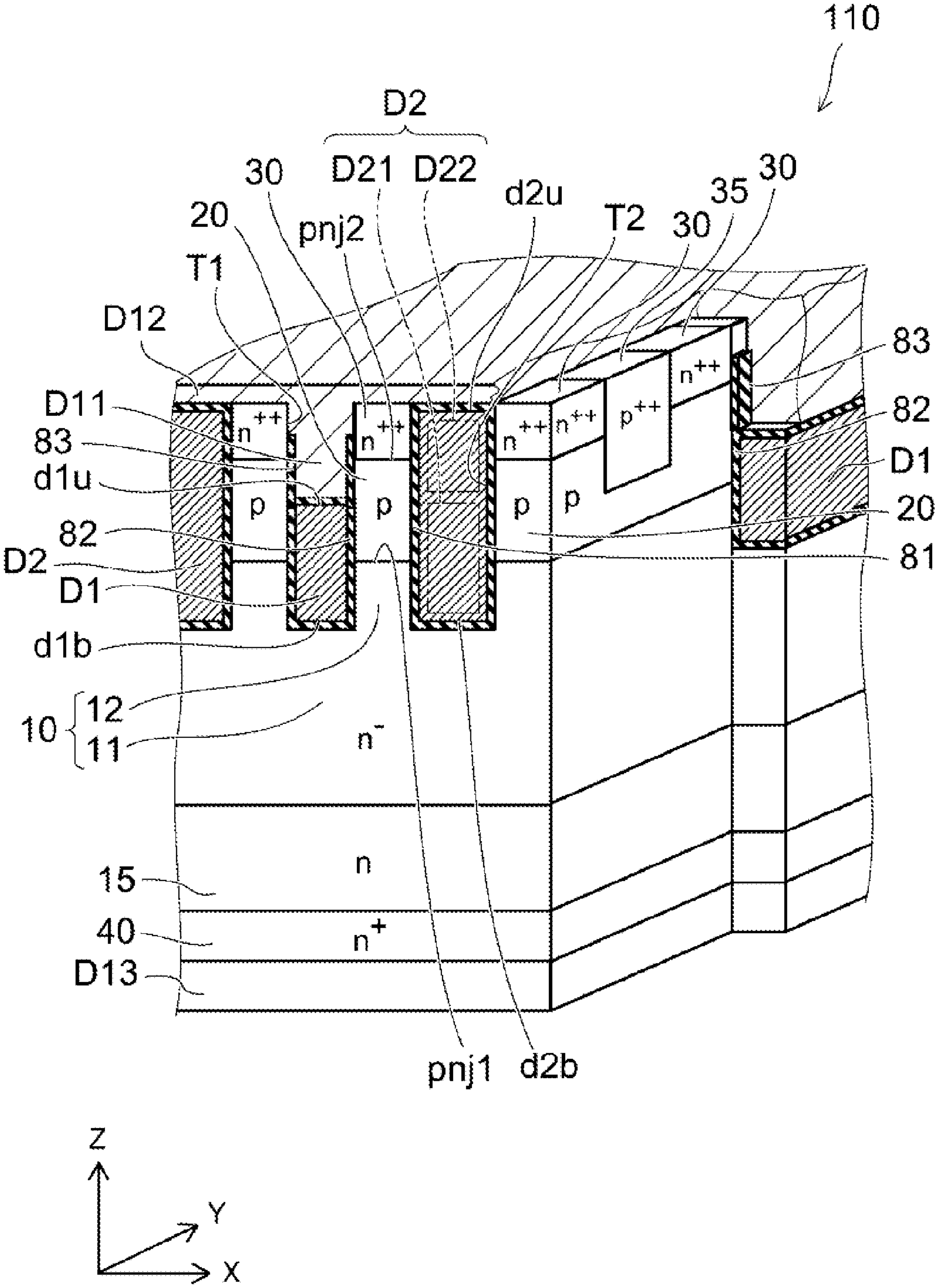
FIG. 1 is a perspective view schematically illustrating a semiconductor device according to a first embodiment.

FIG. 1 is a perspective view schematically illustrating a semiconductor device according to a first embodiment.

FIG. 1 is a perspective view schematically illustrating a semiconductor device 110 partially broken away according to the first embodiment.

Figure 2A:
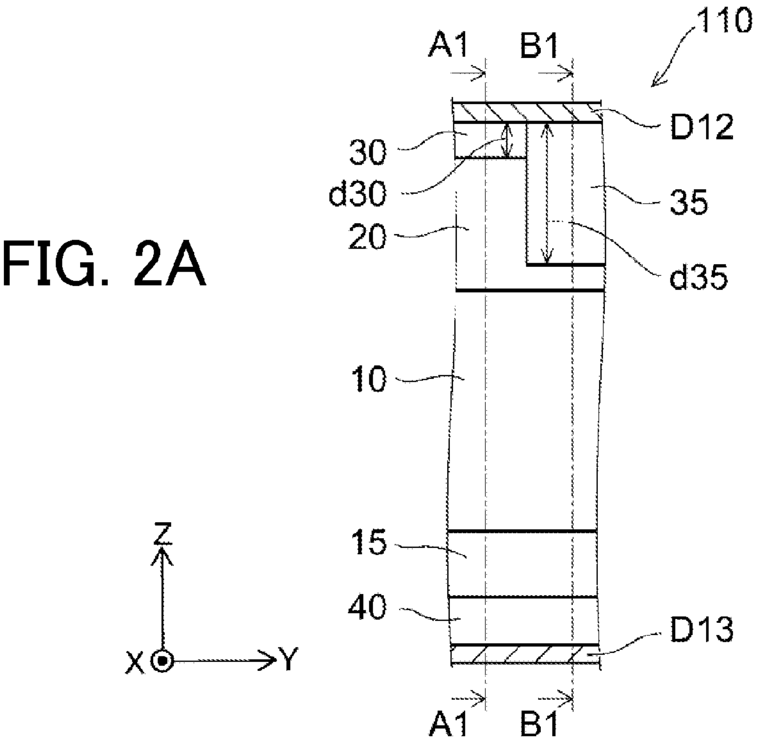
FIGS. 2A to 2C are cross-sectional views schematically illustrating the semiconductor device according to the first embodiment.
Figure 2B:
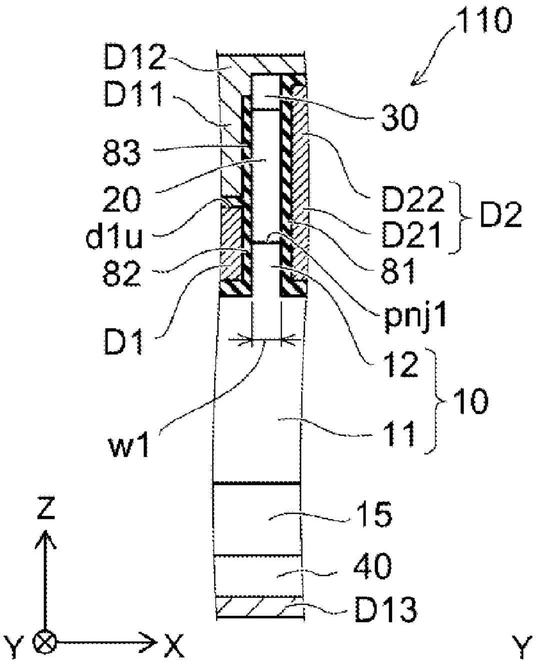
Figure 2C:
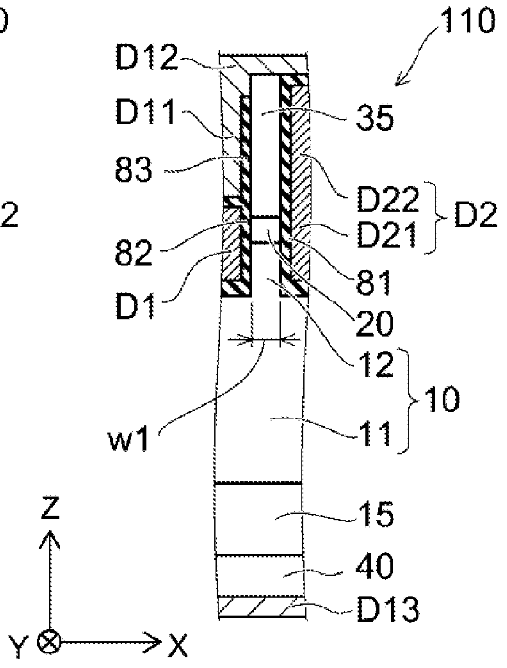

FIGS. 2A to 2C are cross-sectional views schematically illustrating the semiconductor device according to the first embodiment.

FIG. 2A partially illustrates a cross-sectional view of the semiconductor device 110 when viewed in the X direction. FIG. 2B illustrates a cross section taken along line A1-A1 drawn in FIG. 2A. FIG. 2C illustrates a cross section taken along line B1-B1 drawn in FIG. 2A.

As illustrated in FIG. 1, the semiconductor device 110 according to the embodiment is provided with an $n^-$ type drift region 10, a first gate electrode D1, a first electrode portion D11, a second gate electrode D2, a p type base region 20, an $n^{++}$ type source region 30, a gate insulating film 81, a source electrode D12, and a drain electrode D13.

The drift region 10 is a first semiconductor region. The first gate electrode D1 is a first control electrode. The first electrode portion D11 is a first electrode. The second gate electrode D2 is a second control electrode. The base region 20 is a second semiconductor region. The source region 30 is a third semiconductor region. The gate insulating film 81 is a first insulating film. The source electrode D12 is a second electrode. The drain electrode D13 is a third electrode. The semiconductor device 110 is a metal oxide semiconductor field effect transistor (MOSFET) for example. The semiconductor device 110 may be an insulated gate bipolar transistor (IGBT) or an injection enhanced gate transistor (IEGT). In the first embodiment, a case where the semiconductor device 110 is the MOSFET will be given as an example if not otherwise specified.

An n type semiconductor region 15 (a fifth semiconductor region) and an $n^+$ type fourth semiconductor region 40 may be provided between the drift region 10 and the drain electrode D13. Further, in a case where the semiconductor device 110 is an IGBT or an IEGT, the fourth semiconductor region 40 becomes a $p^+$ type semiconductor region. The semiconductor region 15 is provided between the fourth semiconductor region 40 and the drift region 10. The fourth semiconductor region 40 is provided between the drain electrode D13 and the semiconductor region 15. The fourth semiconductor region 40 abuts on the drain electrode D13.

In the embodiment, the semiconductor region 15 is assumed to be included in the drift region 10 for the convenience of the description. In addition, in the embodiment, a direction connecting the drain electrode D13 and the drift region 10 is assumed as a Z direction (a first direction), one of directions orthogonal to the Z direction is assumed as an X direction (a second direction or a third direction), and a direction orthogonal to the Z direction and the X direction is assumed as a Y direction (the third direction or the second direction). In addition, a direction advancing from the drain electrode D13 to the drift region 10 in the Z direction is assumed as an ascending direction (an upper side) and the opposite direction is assumed as a descending direction (a lower side).

The drift region 10 includes a lower portion 11 and an upper portion 12. The lower portion 11 is provided on the semiconductor region 15. The upper portion 12 is provided on the lower portion 11. The upper portion 12 is a portion protruding from the upper part of the lower portion 11 to the upper side. In the embodiment, the plurality of upper portions 12 is provided on the lower portion 11. Each of the upper portions 12 is provided to extend in the Y direction. The impurity concentration of the drift region 10 is approximately $1\times10^{13}$ $cm^{-3}$ or more and $1\times10^{15}$ $cm^{-3}$ or less for example.

The base region 20 is provided on the upper portion 12 so as to abut on the upper portion 12. The base region 20 is provided to extend in the Y direction along with the upper portion 12. In a case where the plurality of upper portions 12 is provided, the base region 20 is provided on each upper portion 12.

The source region 30 is provided on the base region 20. The source region 30 abuts at least on a part of the base region 20. The impurity concentration of the source region 30 is higher than that of the drift region 10. The impurity concentration of the source region 30 is approximately $1\times10^{18}$ $cm^{-3}$ or more and $1\times10^{21}$ $cm^{-3}$ or less for example.

The first gate electrode D1 is provided on the drift region 10. The first gate electrode D1 is drawn alongside of the upper portion 12 and the base region 20 in the X direction. The first gate electrode D1 extends in the Z direction and the Y direction. A lower end d1*b* of the first gate electrode D1 is below a boundary pnj1 between the upper portion 12 and the base region 20. An upper end d1*u* of the first gate electrode D1 is above the boundary pnj1, and below a boundary pnj2 between the base region 20 and the source region 30. In other words, the boundary pnj1 is above the upper end d1*u* of the first gate electrode D1.

The first gate electrode D1 is made of a semiconductor material (polycrystalline silicon for example) doped with impurities for example. Metal may be used as a material of the first gate electrode D1.

A gate insulating film 82 is provided between the first gate electrode D1 and the upper portion 12, and between the first gate electrode D1 and the base region 20. The gate insulating film 82 is a second insulating film. The gate insulating film 82 is made of silicon oxide or silicon nitride for example. The semiconductor device 110 is configured to have a channel region formed in the Z direction along the surface of the base region 20 which faces the first gate electrode D1.

The first gate electrode D1 is a trench gate. The first gate electrode D1 is provided in a first trench T1 which is formed in the source region 30, the base region 20, and the drift region 10 in the Z direction. The first gate electrode D1 is formed to be buried in the first trench T1 through the gate insulating film 82.

The first electrode portion D11 is provided on the first gate electrode D1. An insulating film 83 is provided between the first electrode portion D11 and the first gate electrode D1.

The second gate electrode D2 is provided on the drift region 10. The second gate electrode D2 is drawn alongside of the upper portion 12 and the base region 20 in the X direction. The second gate electrode D2 includes a first portion D21 and a second portion D22. The first portion D21 is drawn alongside of the first gate electrode D1 in the X direction. The second portion D22 is provided on the first portion D21. The second portion D22 is not drawn alongside of the first gate electrode D1 in the X direction.

The first gate electrode D1 extends in the Z direction and the Y direction. A lower end d2*b* of the second gate electrode D2 is below the boundary pnj1. The position of the lower end d2*b* in the Z direction is substantially equal to that of the lower end d1*b* in the Z direction. An upper end d2*u* of the second gate electrode D2 is above the upper end d1*u* of the first gate electrode D1. The length of the second gate electrode D2 in the Z direction is longer than that of the first gate electrode D1 in the Z direction.

The gate insulating film 81 is provided between the second gate electrode D2 and the upper portion 12, and between the second gate electrode D2 and the base region 20. The gate insulating film 81 is the first insulating film. The gate insulating film 81 is made of silicon oxide or silicon nitride for example. The semiconductor device 110 is configured to have a channel region formed in the Z direction along the surface of the base region 20 which faces the second gate electrode D2. In general, the thickness of the gate insulating film 81 corresponds to a gate driving voltage of the element. The thickness of the gate insulating film 81 is approximately 10 nm or more and 0.2 μm or less for example.

The second gate electrode D2 is a trench gate. The second gate electrode D2 is provided in a second trench T2 which is formed in the source region 30, the base region 20, and the drift region 10 in the Z direction. The second gate electrode D2 is formed to be buried in the second trench T2 through the gate insulating film 81.

The semiconductor device 110 is provided with a plurality of first gate electrodes D1 and a plurality of second gate electrodes D2. Each of the first gate electrodes D1 and each of the second gate electrodes D2 are alternately disposed in the X direction. The gap (pitch) between the first gate electrode D1 and the second gate electrode D2 in the X direction is 200 nanometers (nm) or less for example.

Further, even when the gap (pitch) between the first gate electrode D1 and the second gate electrode D2 in the X direction is made to be approximately 1 μm corresponding to the gap (pitch) of the trench gate of a conventional trench element, there is no problem. However, the channel layers of the facing trench gates (an inversion or accumulation channel layer which is generated at the time of applying a gate voltage. The same will apply hereinafter) is made to have a gap at which the channel layers give an influence to each other, that is, 300 nm or less for example, which is particularly advantageous in the embodiment. Further, a gap is so close that the channel layers of the facing trench gates give an influence to each other, that is, 40 nm or more and 100 nm or less for example. Furthermore, the advantage of the embodiment will be remarkably exhibited with a gap (40 nm to 20 nm for example) at which the channel layers of the facing trench gates overlap each other, and a gap (20 nm or less for example) at which the channel layers are completely overlapped.

The semiconductor device 110 is configured to have the upper portion 12 of the drift region 10 provided between the first gate electrode D1 and the first portion D21 of the second gate electrode D2. In addition, a part of the base region 20 (a part on the lower side) is provided between the first gate electrode D1 and the first portion D21 of the second gate electrode D2. The other part of the base region 20 (a part on the upper side) faces the second portion D22 of the second gate electrode D2. The other part of the base region 20 does not face the first gate electrode D1.

The semiconductor device 110 as described above is configured to have a first MOS structure and a second MOS structure arranged in series in the Z direction. The first MOS structure has a structure in which the semiconductor region is interposed between two gate electrodes. The first MOS structure includes the first gate electrode D1 and the first portion D21 of the second gate electrode D2. The second MOS structure has a structure in which one gate electrode is provided on one side of the semiconductor region. The second MOS structure includes the second portion D22 of the second gate electrode D2.

The semiconductor device 110 is configured to have a $p^+$ type contact region 35 provided on the base region 20. For example, a plurality of contact regions 35 is provided. For example, a plurality of source regions 30 is provided. Each of the source regions 30 and each of the contact regions 35 are alternately disposed in the Y direction.

As illustrated in FIG. 2A, the length d35 of the contact region 35 in the Z direction is longer than the length d30 of the source region 30 in the Z direction.

As illustrated in FIGS. 2B and 2C, the source electrode D12 is electrically connected to the source region 30 and the first electrode portion D11. The first electrode portion D11 extends from the source electrode D12 to the upper portion of the first gate electrode D1 in the Z direction.

The first electrode portion D11 is drawn alongside of the second portion D22 of the second gate electrode D2 in the X direction. The first electrode portion D11 is integrally provided with the source electrode D12. The source electrode D12 comes into ohmic contact with the source region 30 and the contact region 35.

The insulating film 83 is provided between the first electrode portion D11 and the base region 20, between the first electrode portion D11 and a part of the source region 30, and between the first electrode portion D11 and a part of the contact region 35.

The semiconductor device 110 is configured to set the gap w1 between the first trench T1 and the second trench T2 to 100 nm or less for example. When the gap w1 is set to 20 nm or more 40 nm or less for example, a great advantage according to the embodiment is obtained. The gap w1 corresponds to the length (the width) of the base region 20 in the X direction.

Even in a case where in the semiconductor device 110 is configured to set the width of the base region 20 narrow, a reduction in ON-state resistance, a high short-circuit resistance, and an improvement in avalanche resistance are achieved by employing the first MOS structure and the second MOS structure. The high short-circuit resistance is secured all over the semiconductor device 110 by forming the second MOS structure having a high short-circuit resistance on the first MOS structure having a low short-circuit resistance in series. Further, the first MOS structure may be constructed such as a emitter layer with a high concentration by overlapping trench channels which face each other. On the other hand, it is desirable that the second MOS structure have a short-circuit resistance capable of withstanding a voltage equal to approximately the gate driving voltage.

Next, the operation of the semiconductor device 110 according to the embodiment will be described.

Figure 3A:
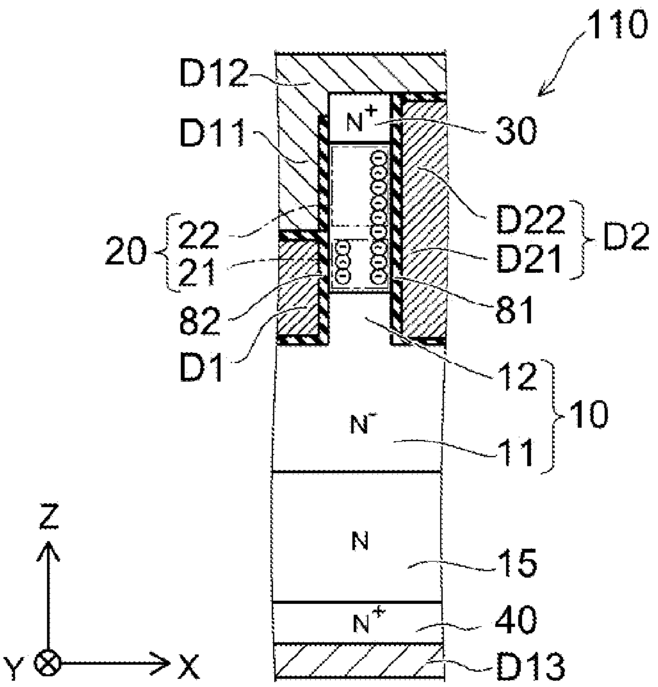
FIGS. 3A and 3B are cross-sectional views schematically illustrating the operations of the semiconductor device.
Figure 3B:
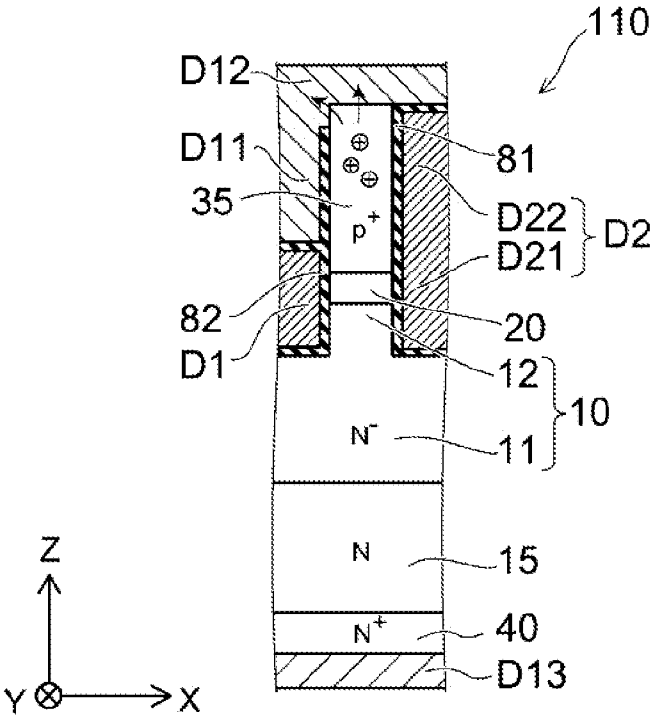

FIGS. 3A and 3B are cross-sectional views schematically illustrating the operations of the semiconductor device.

FIG. 3A schematically illustrates a cross-sectional view corresponding to FIG. 2B. FIG. 3B schematically illustrates a cross-sectional view corresponding to FIG. 2C.

As illustrated in FIG. 3A, when a gate voltage equal to or above a threshold is applied to the first gate electrode D1 and the second gate electrode D2 in a state where the drain electrode D13 is applied with a high potential and the source electrode D12 is applied with a potential lower than that of the drain electrode D13, inversion layers (channels) are formed in the base region 20 near the boundaries with the gate insulating films 81, 82.

For example, the source electrode D12 is applied with a ground potential or a negative potential, and the first gate electrode D1 and the second gate electrode D2 are applied with a positive potential. The drain electrode D13 is applied with a positive potential higher than that of the first gate electrode D1 and the second gate electrode D2. In the state, electrons are injected into the base region 20 and the drift region 10 from the source region 30 through a channel. Therefore, the semiconductor device 110 enters a turned-on state.

At the time, a lower-side portion 21 in the base region 20 between the first gate electrode D1 and the first portion D21 of the second gate electrode D2 enters a state in which the facing inversion layers are joined together. The joined portion is accumulated with the electrons in high concentration. Therefore, in a case where the semiconductor device 110 is a MOSFET, a low channel resistance is realized. In addition, in a case where the semiconductor device 110 is an IGBT or an IEGT, a high electron injection efficiency (an electron injection efficiency $\gamma e$ extremely converges toward 1 compared to the conventional IGBT) is obtained.

On the other hand, an upper-side portion 22 of the base region 20, which faces the second portion D22 of the second gate electrode D2, has the inversion layer formed only on the second gate electrode D2. The electron concentration of the upper-side portion 22 is low compared to that of the lower-side portion 21. Therefore, the upper-side portion 22 can be secured with controllability of current using a gate voltage.

Next, when a voltage lower than the threshold is applied to the first gate electrode D1 and the second gate electrode D2, the channel is not formed in the base region 20 near the boundaries with the gate insulating films 81, 82, and thus the semiconductor device 110 enters a turned-off state. When the semiconductor device 110 is switched from the turned-on state to the turned-off state, electron-hole pairs may be generated in a depletion layer which is formed in a boundary portion between the drift region 10 and the base region 20.

As illustrated in FIG. 3B, the semiconductor device 110 is configured to efficiently discharge the holes generated in the base region 20 to the source electrode D12 through the contact region 35 which is provided on the base region 20. Therefore, the avalanche resistance of the semiconductor device 110 is improved.

As illustrated in FIG. 2A, the semiconductor device 110 is configured to have the length d35 of the contact region 35 longer than the length d30 of the source region 30. For this reason, a contact area between the contact region 35 and the base region 20 becomes wide compared to the case where the length d35 is equal to the length d30. Therefore, the holes generated in the base region 20 are efficiently transferred to the contact region 35, and discharged from the source electrode D12.

In addition, since the semiconductor device 110 is provided with the first electrode portion D11 and the insulating film 83, the extent of the inversion layer in the upper-side portion 22 of the base region 20 is suppressed and the avalanche resistance is improved.

Herein, a reference example will be described.

FIGS. 4A to 4C are cross-sectional views schematically illustrating a semiconductor device according to the reference example.

FIG. 4A partially illustrates a cross-sectional view of a semiconductor device 190 according to the reference example when viewed in the X direction. FIG. 4B illustrates a cross section taken along line A2-A2 drawn in FIG. 4A. FIG. 4C illustrates a cross section taken along line B2-B2 drawn in FIG. 4A.

As illustrated in FIG. 4A, the semiconductor device 190 is configured to have the source region 30 and the contact region 35 which are disposed on the base region 20. The length of the contact region 35 in the Z direction is equal to that of the source region 30 in the Z direction. As illustrated in FIGS. 4B and 4C, the semiconductor device 190 is provided with a gate electrode D10. A plurality of gate electrodes D10 is provided.

The gate electrodes D10 are disposed at a predetermined interval in the X direction.

The semiconductor device 190 is configured to have the whole base region 20 in the Z direction disposed between adjacent two gate electrodes D10. Therefore, when the semiconductor device 190 is in the turned-on state, the inversion layers are formed in the whole base region 20 in the Z direction. In other words, the whole base region 20 enters a state in which the facing inversion layers are joined together. Therefore, it becomes difficult to control the threshold and to secure the avalanche resistance.

Figure 5A:
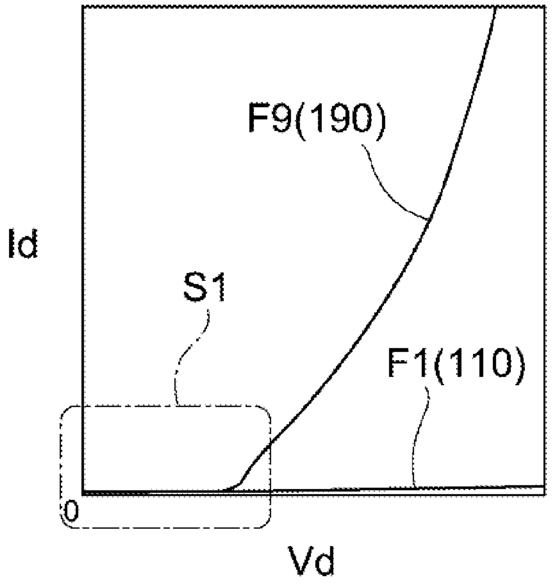
FIGS. 5A and 5B are diagrams plotting short-circuit resistance.
Figure 5B:
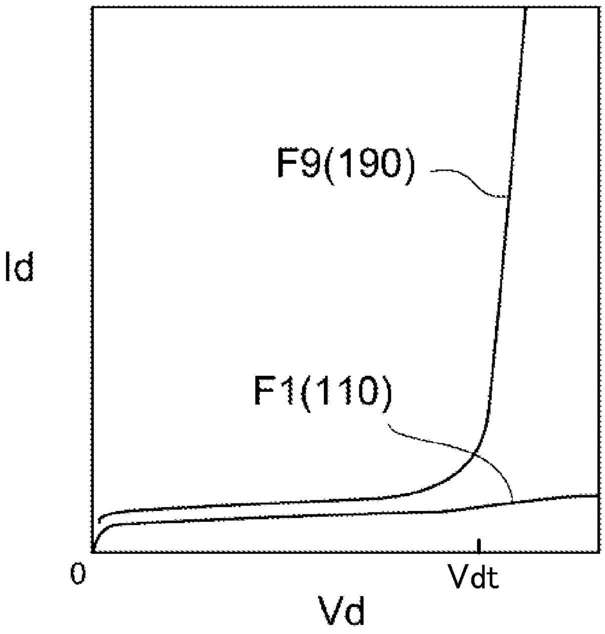

FIGS. 5A and 5B are diagrams plotting short-circuit resistance.

The horizontal axis of FIGS. 5A and 5B represents the drain voltage Vd, and the vertical axis represents the drain current Id when the element is in the turned-on state. FIG. 5B shows Section S1 marked in FIG. 5A on a magnified scale.

FIGS. 5A and 5B plot the feature F1 of the semiconductor device 110 according to the embodiment and the feature F9 of the semiconductor device 190 according to the reference example. Both features F1, F9 show calculation results obtained by simulating the change in the drain current Id when the semiconductor devices 110, 190 are switched to the turned-on state to raise the drain voltage Vd.

As plotted in FIGS. 5A and 5B, the feature F9 of the semiconductor device 190 according to the reference example shows that dynamic avalanche occurs in the drain at the drain voltage Vdt. On the other hand, the feature F1 of the semiconductor device 110 according to the embodiment shows that the dynamic avalanche does not occur even at the drain voltage Vdt. Therefore, it can be seen that the semiconductor device 110 has a short-circuit resistance higher than that of the semiconductor device 190.

Next, a semiconductor device according to a modified example of the first embodiment will be described.

FIGS. 6A to 6C, 7A to 7C, 8A to 8C, 9A to 9C, 10A to 10C, and 11A to 11C are cross-sectional views schematically illustrating the semiconductor device according to the modified example of the first embodiment.

Figure 6A:
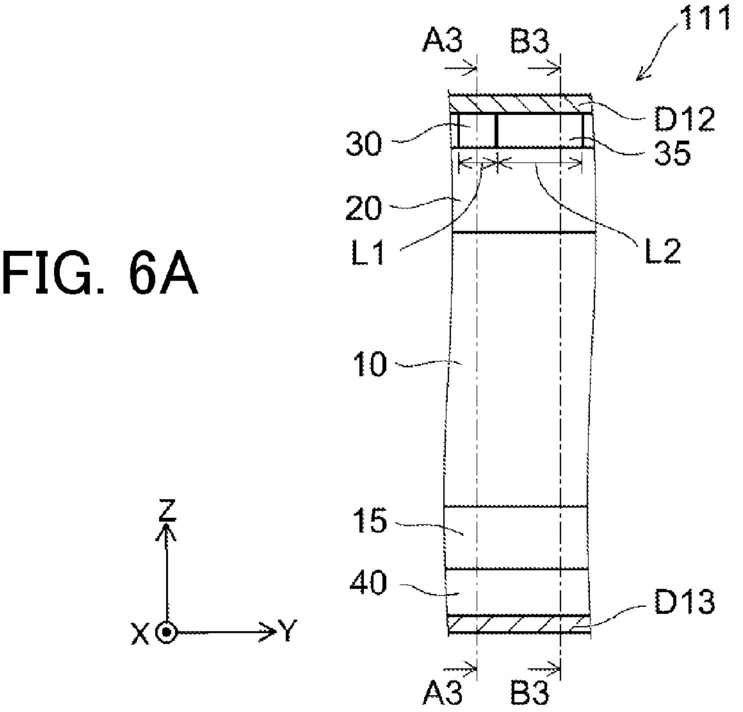
Figure 6B:
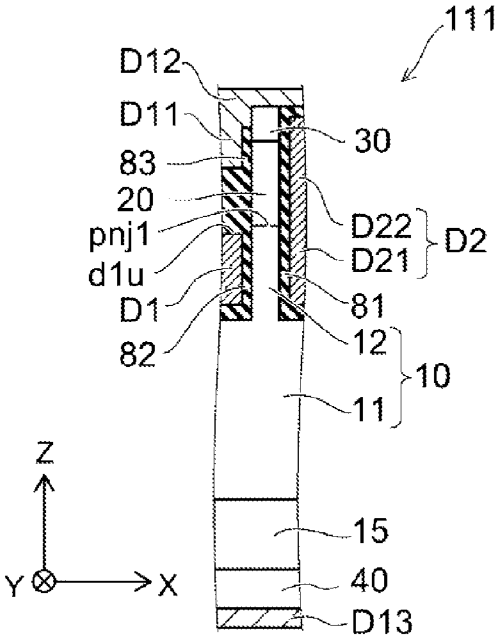
Figure 6C:
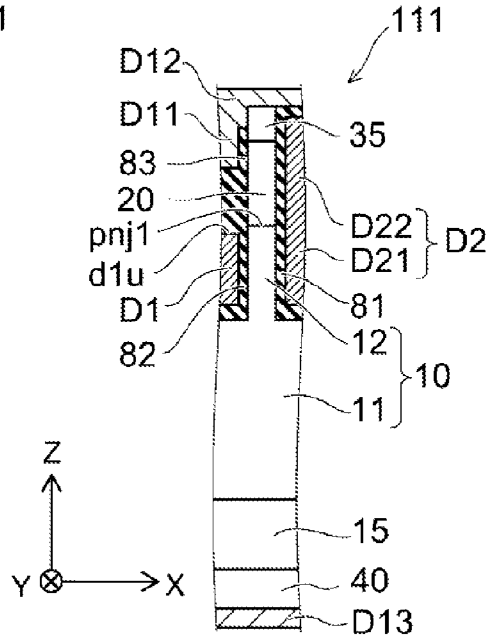

FIGS. 6A to 6C illustrate a semiconductor device 111 according to a first modified example.

FIG. 6A partially illustrates a cross-sectional view of the semiconductor device 111 when viewed in the X direction. FIG. 6B illustrates a cross section taken along line A3-A3 drawn in FIG. 6A. FIG. 6C illustrates a cross section taken along line B3-B3 drawn in FIG. 6A.

As illustrated in FIG. 6A, the semiconductor device 111 is different from the semiconductor device 110 according to the first embodiment in the length and the width of the contact region 35. The semiconductor device 111 is configured to have the length of the contact region 35 in the Z direction equal to that of the source region 30 in the Z direction. The semiconductor device 111 is configured to have the length L2 of the contact region 35 in the Y direction longer than the length L1 of the source region 30 in the Y direction.

In addition, the semiconductor device 111 is configured to have the upper end d1*u* of the first gate electrode D1 below the boundary pnj1 between the upper portion 12 and the base region 20 of the drift region 10.

The semiconductor device 111 as described above enables it to realize a higher short-circuit resistance and a higher avalanche resistance, in addition to the same operational advantage as that of the semiconductor device 110.

FIGS. 7A to 7C illustrate a semiconductor device 112 according to a second modified example.

FIG. 7A partially illustrates a cross-sectional view of the semiconductor device 112 when viewed in the X direction. FIG. 7B illustrates a cross section taken along line A4-A4 drawn in FIG. 7A. FIG. 7C illustrates a cross section taken along line B4-B4 drawn in FIG. 7A.

As illustrated in FIG. 7A, the semiconductor device 112 is configured to have the contact region 35 provided between the base region 20 and the source region 30. As illustrated in FIGS. 7A and 7C, the source region 30 is electrically connected to the source electrode D12 in a contact portion CP which is provided in the upper end of the source region 30 and the side face of the source region 30. In addition, as illustrated in FIGS. 7A and 7B, the upper end of the base region 20 abuts on the source electrode D12.

The semiconductor device 112 as described above enables it to realize a higher short-circuit resistance and a higher avalanche resistance, in addition to the same operational advantage as that of the semiconductor device 110.

FIGS. 8A to 8C illustrate a semiconductor device 113 according to a third modified example.

FIG. 8A partially illustrates a cross-sectional view of the semiconductor device 113 when viewed in the X direction. FIG. 8B illustrates a cross section taken along line A5-A5 drawn in FIG. 8A. FIG. 8C illustrates a cross section taken along line B5-B5 drawn in FIG. 8A.

As illustrated in FIGS. 8A to 8C, the semiconductor device 113 is provided with trench electrodes D5, D6 in addition to the configuration of the semiconductor device 110. The trench electrode D5 is provided in the first trench T1 between the first gate electrode D1 and the lower portion 11 of the drift region 10. The trench electrode D5 is provided to be separated from each of the first gate electrode D1 and the drift region 10.

The trench electrode D6 is provided in the second trench T2 between the second gate electrode D2 and the lower portion 11 of the drift region 10. The trench electrode D6 is provided to be separated from each of the second gate electrode D2 and the drift region 10. The potential of each of the trench electrodes D5, D6 is equal to that of the source electrode D12.

The semiconductor device 113 as described above enables the trench electrodes D5, D6 to serve as field plate electrodes, in addition to the same operational advantage as that of the semiconductor device 110. With the configuration, even in a state where a high voltage is applied between the source electrode D12 and the drain electrode D13 in the turned-off state, the electric field in the semiconductor device 113 is weaken not to be focused on the end portion of the first gate electrode D1 and the end portion of the second gate electrode D2. Therefore, the semiconductor device 113 is operated under a high withstand voltage.

In addition, when the potential of the trench electrodes D5, D6 is set to be equal to that of the source electrode D12, the trench electrodes D5, D6 exert a function of reducing the electrostatic capacitance of the gate. The operation at the time of switching is stabilized by the function. In this case, the $n^-$ type upper portion 12 between the trench electrodes D5, D6 is depleted and the ON-state resistance is prevented from being increased under the influence of the potential of the trench electrodes D5, D6. Therefore, an n type region having a concentration higher than that of the $n^-$ type lower portion 11 may be provided in the upper portion 12.

FIGS. 9A to 9C illustrate a semiconductor device 114 according to a fourth modified example.

FIG. 9A partially illustrates a cross-sectional view of the semiconductor device 114 when viewed in the X direction. FIG. 9B illustrates a cross section taken along line A6-A6 drawn in FIG. 9A. FIG. 9C illustrates a cross section taken along line B6-B6 drawn in FIG. 9A.

As illustrated in FIG. 9A, the semiconductor device 114 is configured to have the source region 30 extending in the Y direction. The contact region 35 is provided in the upper portion of a part of the base region 20 between the contact region 35 and the source region 30. As illustrated in FIGS. 9A and 9C, the source region 30 is electrically connected to the source electrode D12 in the contact portion CP which is provided in the upper end of the source region 30 and the side face of the source region 30. The contact region 35 is electrically connected to the source electrode D12 in the contact portion CP which is provided in the side face of the contact region 35.

The semiconductor device 114 as described above enables it to realize a higher short-circuit resistance and a higher avalanche resistance, in addition to the same operational advantage as that of the semiconductor device 110.

Figure 10A:
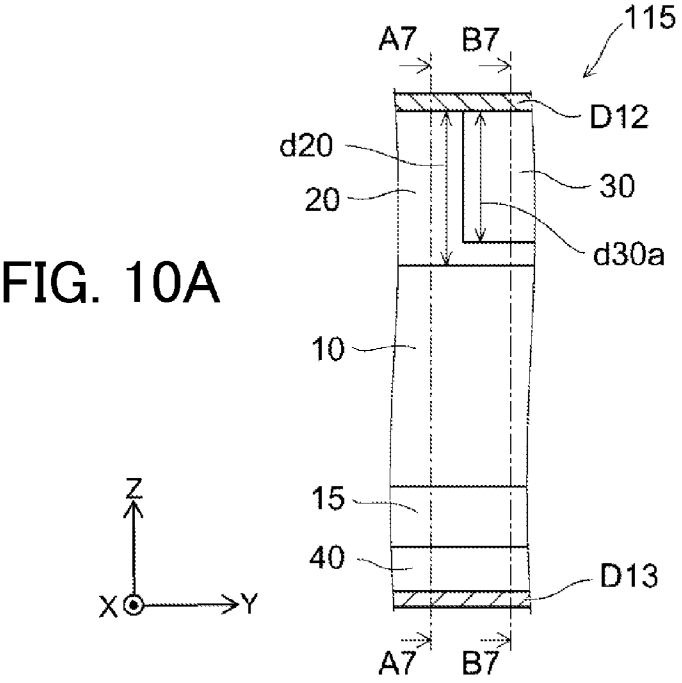
Figure 10B:
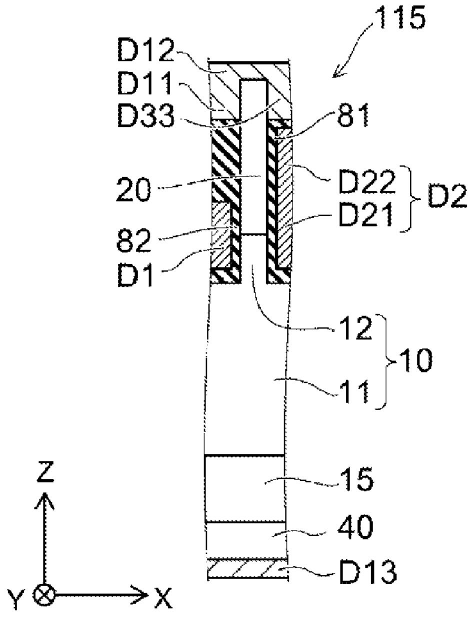
Figure 10C:
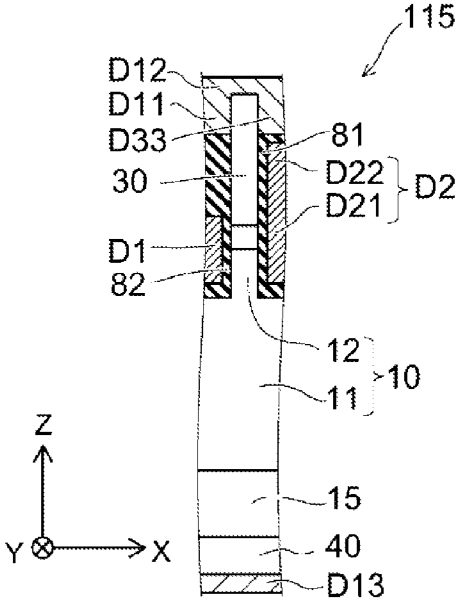

FIGS. 10A to 10C illustrate a semiconductor device 115 according to a fifth modified example.

FIG. 10A partially illustrates a cross-sectional view of the semiconductor device 115 when viewed in the X direction. FIG. 10B illustrates a cross section taken along line A7-A7 drawn in FIG. 10A. FIG. 10C illustrates a cross section taken along line B7-B7 drawn in FIG. 10A.

The semiconductor device 115 is not provided with the contact region 35 which has been provided in the semiconductor device 110. As illustrated in FIG. 10A, the semiconductor device 115 is configured to have the source region 30 provided in the upper portion of a part of the base region 20. The semiconductor device 115 is configured to have the length d30*a* of the source region 30 in the Z direction longer than the length d30 of the source region 30 in the Z direction in the semiconductor device 110 illustrated in FIG. 2A. The length d30*a* is set to be half the length d20 or more, for example, of the base region 20 in the Z direction.

The semiconductor device 115 is configured to have the source electrode D12 electrically connected to the first electrode portion D11 and a second electrode portion D33. The second electrode portion D33 extends from the source electrode D12 to the upper portion of the second gate electrode D2 in the Z direction.

As illustrated in FIG. 10B, the source electrode D12 is provided to surround the upper-side portion of the base region 20. The source electrode D12 abuts on a part of the side faces and the upper face of the base region 20. As illustrated in FIG. 10C, the source electrode D12 is provided to surround the upper-side portion of the source region 30. The source electrode D12 abuts on a part of the side faces and the upper face of the source region 30.

The semiconductor device 115 as described above enables it to realize a higher short-circuit resistance and a higher avalanche resistance, in addition to the same operational advantage as that of the semiconductor device 110.

Figure 11A:
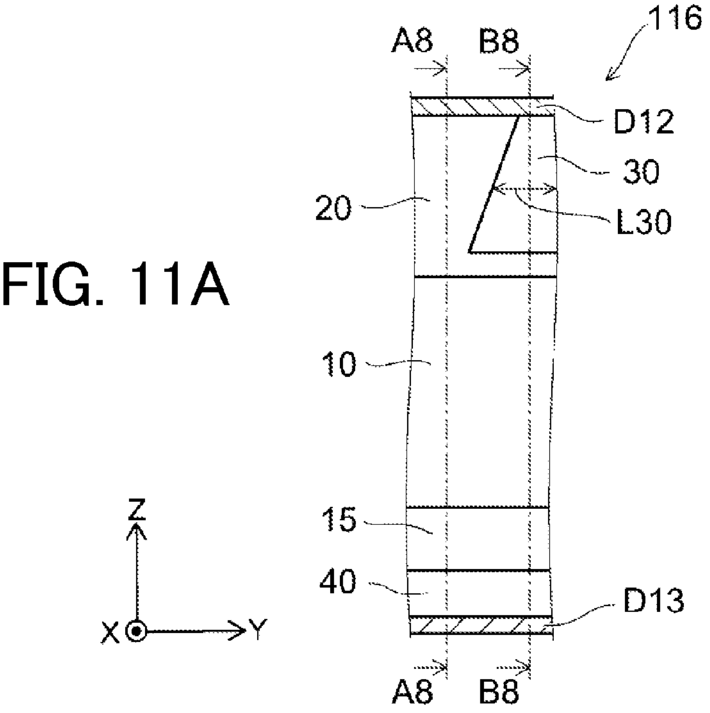
Figure 11B:
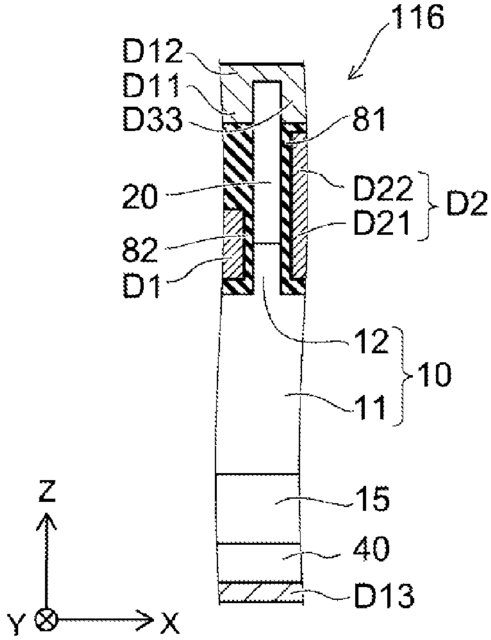
Figure 11C:
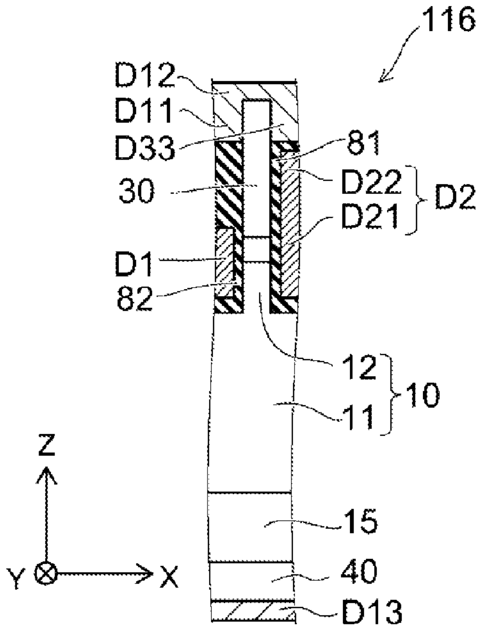

FIGS. 11A to 11C illustrate a semiconductor device 116 according to a sixth modified example.

FIG. 11A partially illustrates a cross-sectional view of the semiconductor device 116 when viewed in the X direction. FIG. 11B illustrates a cross section taken along line A8-A8 drawn in FIG. 11A. FIG. 11C illustrates a cross section taken along line B8-B8 drawn in FIG. 11A.

As illustrated in FIG. 11A, the semiconductor device 116 is configured to have the length L30 of the source region 30 in the Y direction different depending on a position in the Z direction. In other words, the length L30 of the source region 30 in the Y direction is not constant. The semiconductor device 116 has the same configuration as that of the semiconductor device 115 illustrated in FIGS. 10A to 10C except the source region 30.

The semiconductor device 116 is configured to have the length L30 of the source region 30 shortened as it goes near the source electrode D12, and lengthened as it goes near the drift region 10. For example, the length L30 is gradually increased as it goes from the source electrode D12 toward the drift region 10. The length L30 may be increased in a stepped manner as it goes from the source electrode D12 toward the drift region 10.

The semiconductor device 116 as described above enables it to realize a high short-circuit resistance and a high avalanche resistance, in addition to the same operational advantage as that of the semiconductor device 110.

FIG. 12 is a diagram plotting a relation between a drain voltage and a drain current.

The horizontal axis drawn in FIG. 12 represents the drain voltage Vd, and the vertical axis represents the drain current Id. FIG. 12 plots the feature F5 of the semiconductor device 115 and the feature F6 of the semiconductor device 116. Both features F5, F6 show calculation results obtained by simulating the change in the drain current Id when the drain voltage Vd is raised. The simulation calculation has been performed in the condition that the gate voltage is 15 V and the width of the base region 20 is 20 nm.

As plotted in FIG. 12, it can be seen that the feature F6 of the semiconductor device 116 shows a large saturation current compared to the feature F5 of the semiconductor device 115.

With the semiconductor devices 110, 111, 112, 113, 114, 115, 116 according to the first embodiment and the modified examples as described above, the reduction in ON-state resistance and an improvement in avalanche resistance are achieved even when the gap between the adjacent gate electrodes (the width of the base region 20) is narrow. Therefore, even in a case where the gap between the gate electrodes is made narrow, characteristics can be improved.

Further, the MOSFET has been given as an example of the semiconductor devices 111, 112, 113, 114, 115, 116 according to the first embodiment and the modified examples. However, the semiconductor devices 110, 111, 112, 113, 114, 115, 116 can be applied even to an IGBT and an IEGT.

The turned-on state of the IGBT and the IEGT is different from the MOSFET (a unipolar element) in that conductivity modulation occurs in the $n^-$ type drift region 10. According to the embodiment, the short-circuit resistance and the avalanche resistance are secured even in the case of the IGBT or the IEGT similarly to the MOSFET, and then it is possible to rapidly improve a turning-on characteristic of the element. Further, in the case of the IGBT and the IEGT, the conductivity type of the fourth semiconductor region 40 of the semiconductor devices 111, 112, 113, 114, 115, 116 is the $p^+$ type.

Second Embodiment

Next, a second embodiment will be described.

FIGS. 13A to 13C are diagrams schematically illustrating a semiconductor device according to the second embodiment.

FIG. 13A schematically illustrates a perspective view of a semiconductor device 120 partially broken away according to the second embodiment. FIG. 13B schematically illustrates a cross-sectional view of the semiconductor device 120 when viewed in the X direction. FIG. 13C plots an excess carrier density in the turned-on state of an element.

As illustrated in FIG. 13A, the semiconductor device 120 according to the embodiment is provided with the $n^-$ type drift region 10, a gate electrode D20, the p type base region 20, an $n^+$ type source region 30, a gate insulating film 85, the source electrode D12, the drain electrode D13, and the fourth semiconductor region 40. The drift region 10 is a first semiconductor region. The gate electrode D20 is a control electrode. The base region 20 is a second semiconductor region. The source region 30 is a third semiconductor region. The gate insulating film 85 is an insulating film. The source electrode D12 is a second electrode. The drain electrode D13 is a third electrode.

The gate electrode D20 is provided on the drift region 10. The gate insulating film 85 is provided between the base region 20 and the gate electrode D20.

The fourth semiconductor region 40 includes an n type first semiconductor portion 41 and a p type second semiconductor portion 42. The first semiconductor portion 41 is juxtaposed with the second semiconductor portion 42 in the Y direction. In the embodiment, a plurality of first semiconductor portions 41 and a plurality of second semiconductor portions 42 are provided. Each of the first semiconductor portions 41 and each of the second semiconductor portions 42 are alternately disposed in the Y direction.

The semiconductor device 120 includes both structures of the elements, an IGBT and a MOSFET. When being regarded as an IGBT, the semiconductor device 120 is considered to have a shorted anode IGBT structure since the first semiconductor portion 41 is present. In the case of a normal shorted anode IGBT, a threshold of approximately 0.7 V is necessary for the bipolar operation (the injection of holes from the second semiconductor portion 42). In addition, when the bipolar operation (the injection of holes from the second semiconductor portion 42) is prevented by the presence of the first semiconductor portion 41, the threshold will disappear. However, also the conductivity modulation will not occur in the drift region 10.

In the embodiment, the buried trench gate which is as narrow as the channels of the trench MOS abut on each other (with the configuration, the discharging rate of the holes from the drift region 10 toward the base region 20 in the turned-on state is substantially zero) is combined with the fourth semiconductor region 40 having a low injection efficiency or the second semiconductor portion 42 short-circuited in the first semiconductor portion 41. Therefore, it is possible to realize a low threshold IGBT (see FIG. 15) or a low ON-state resistance MOSFET (partial conductivity modulation of the drift region 10 on a side near the gate electrode D20, that is, a lowered resistance).

The conventional IGBT (IEGT) is lowered in the ON-state resistance at the drain voltage (Vd) equal to or higher than the threshold (0.7 V at a maximum), but no current flows at the drain voltage (Vd) lower than the threshold (0.7 V at a maximum). In addition, the conventional MOSFET is configured such that the drain voltage (Vd) equal to or higher than 0 V makes the current flow without a threshold, but since the MOSFET is a unipolar element, the ON-state resistance is higher than that of the IGBT in which the conductivity is modulated.

According to the embodiment, it is possible to realize the IGBT (IEGT) which has current-voltage characteristics of the turned-on state having no threshold (or a threshold lower than the conventional threshold in the related art), or the MOSFET which is dramatically improved in the ON-state resistance by the conductivity modulation.

As illustrated in FIG. 13B, in the fourth semiconductor region 40, the length of the first semiconductor portion 41 in the Y direction on a side near the drift region 10 is denoted by L41$a$, and the length of the second semiconductor portion 42 in the Y direction on a side near the drift region 10 is denoted by L42$a$. In the case, the length L41$a$ is substantially equal to the length L42$a$.

Assuming that the depth of the second semiconductor portion 42 or the first semiconductor portion 41 is T, and one of the lengths L41$a$, L42$a$ is W, T and W are desirable to satisfy a relation of T/W>2. In addition, in a case where at least one of the lengths L41$a$, L42$a$ is formed in a fine dimension, W is 10 μm or less and preferably approximately 10 nm or more and 100 nm or less.

In addition, in the fourth semiconductor region 40, the length of the first semiconductor portion 41 in the Y direction on a side near the drain electrode D13 is denoted by L41$b$, and the length of the second semiconductor portion 42 in the Y direction on a side near the drain electrode D13 is denoted by L42$b$. In the case, the length L41$b$ is shorter than the length L42$b$.

By such a difference in the length, the first semiconductor portion 41 includes a long portion 41$w$ of which the length in the Y direction is long and a short portion 41$n$ of which the length in the Y direction is short. In addition, the second semiconductor portion 42 includes a short portion 42$n$ of which the length in the Y direction is short and a long portion 42$w$ of which the length in the Y direction is long.

The fourth semiconductor region 40 includes a first row region 401 and a second row region 402. The first row region 401 is a region in which the short portion 41$n$ of the first semiconductor portion 41 and the long portion 42$w$ of the second semiconductor portion 42 are drawn alongside in the Y direction. The second row region 402 is a region in which the long portion 41$w$ of the first semiconductor portion 41 and the short portion 42$n$ of the second semiconductor portion 42 are drawn alongside in the Y direction.

A substantial reduction in threshold is achieved in the semiconductor device 120 by setting a difference between a potential $\phi 1$ of the first row region 401 and a potential $\phi 2$ of the second row region 402, a difference between the potential $\phi 2$ and a potential $\phi 3$ of the semiconductor region 15, and a difference between the potential $\phi 3$ and a potential $\phi 4$ of the drift region 10.

In a case where the semiconductor device 120 is in the turned-on state, electrons injected from the source electrode D12 flow into the source region 30, the base region 20, the drift region 10, and the semiconductor region 15. Further, the electrons flow into the drain electrode D13 through the first semiconductor portion 41 of the fourth semiconductor region 40. At this time, the electrons flow across a pseudo potential which is lower than the built-in potential in the fourth semiconductor region 40. Therefore, the threshold of the semiconductor device 120 becomes lower than a threshold corresponding to the built-in potential of a normal pn junction.

Further, the injection efficiency of the holes from the second semiconductor portion 42 to the high-resistance drift region 10 becomes lower as much as the lowered threshold. However, the effect of the fine gap of the trench gate on a side near the source electrode D12 causes the conductivity modulation to occur, so that the holes are accumulated in the drift region 10 on a side near the gate electrode D20. As a result, the base resistance is lowered compared to an element (a pure MOSFET) which has not the conductivity modulation at all. In other words, there is provided an element having a low ON-state resistance. Further, the accumulation of the holes on a side near the gate electrode D20 is desirable from the viewpoint of a switching characteristic.

In a case where an inversed voltage (the potential of the source electrode D12 is higher than that of the drain electrode D13) is applied to the semiconductor device 120, the short portion 41*n* of the first semiconductor portion 41 is pinched off by the depletion layer. Therefore, a pseudo pn junction is formed in the fourth semiconductor region 40.

The semiconductor device 120 is configured such that the potentials ϕ1, ϕ2 are set by the impurity concentration of the first row region 401, the impurity concentration of the second row region 402, the lengths L41*a*, L41*b*, L42*a*, L42*b*, and the like. In addition, the semiconductor device 120 is configured such that the potential ϕ3 is set by the impurity concentration of the semiconductor region 15 and the like, and the potential ϕ4 is set by the impurity concentration of the drift region 10 and the like. A pseudo threshold of the semiconductor device 120 is set by these potentials ϕ1, ϕ2, ϕ3, ϕ4.

FIGS. 14A and 14B are diagram schematically illustrating a semiconductor device according to a modified example of the second embodiment.

FIG. 14A schematically illustrates a perspective view of a semiconductor device 121 partially broken away according to the modified example of the second embodiment. FIG. 14B schematically illustrates a cross-sectional view of the semiconductor device 121 when viewed in the X direction.

As illustrated in FIG. 14A, the configuration of a drift region 10B in the semiconductor device 121 is different from that of the drift region 10 of the semiconductor device 120. The other configurations of the semiconductor device 121 except the drift region 10B are similar to those of the semiconductor device 120.

The drift region 10B of the semiconductor device 121 includes an n type first region 101 and a p type second region 102. The first region 101 is juxtaposed with the second region 102 in the Y direction. In the embodiment, a plurality of first regions 101 and a plurality of second regions 102 are provided. Each of the first regions 101 and each of the second regions 102 are alternately disposed in the Y direction. The drift region 10B of the semiconductor device 121 has a super-junction structure.

In the super-junction structure, a pseudo non-doped layer is configured in the drift region 10B by making the quantity of impurities contained in the first region 101 equal to the quantity of impurities contained in the second region 102. With the configuration, the withstand voltage of the semiconductor device 121 is improved. In addition, the reduction in ON-state resistance is achieved by making the impurity concentration of the drift region 10B high.

The first region 101 is disposed at a position overlapped with the first semiconductor portion 41 in the Z direction. The second region 102 is disposed at a position overlapped with the second semiconductor portion 42 in the Z direction. As illustrated in FIG. 14B, the length L101 of the first region 101 in the Y direction is substantially equal to the length L102 of the second region 102 in the Y direction. The length L101 is substantially equal to the length L41*a*. The length L102 is substantially equal to the length L42*a*.

In the semiconductor device 121 as described above, the reduction in threshold is achieved by the first semiconductor portion 41 and the second semiconductor portion 42 of the fourth semiconductor region 40 as well as the improvement in withstand voltage and a low ON-state resistance by the super-junction structure.

FIG. 15 is a diagram plotting a relation between a drain voltage and a drain current.

The horizontal axis drawn in FIG. 15 represents the drain voltage Vd, and the vertical axis represents the drain current Id. FIG. 15 plots a feature F2 of the semiconductor device 121 and a feature F19 of a semiconductor device according to a comparative example. Both features F2, F19 show calculation results obtained by simulating the change in the drain current Id when the drain voltage Vd is raised. Herein, the semiconductor device according to the comparative example has a structure in which the n type region is uniformly provided in the fourth semiconductor region 40 of the semiconductor device 121.

As plotted in FIG. 15, the feature F19 of the semiconductor device according to the comparative example shows that the drain current Id is gradually increased as the drain voltage Vd is increased. On the other hand, the feature F2 of the semiconductor device 121 shows that a large amount of the drain current Id flows even though the drain voltage Vd is low. In other words, it can be seen that the semiconductor device 121 has a substantially low threshold to make the drain current Id start to flow.

For example, in a case where silicon (Si) is used for the semiconductor material, the built-in potential of the pn junction is approximately 0.8 V. Therefore, the threshold of the semiconductor device according to the comparative example, in which the structure of the fourth semiconductor region 40 of the semiconductor devices 120, 121 is not used, cannot be lowered than the built-in potential (approximately 0.8 V). The semiconductor devices 120, 121 are configured to set thresholds of the semiconductor devices 120, 121 by the potentials ϕ1, ϕ2, ϕ3, ϕ4. Therefore, the thresholds of the semiconductor devices 120, 121 can be artificially set to 0.2 V or less.

Further, the semiconductor devices 120, 121 described above employ the trench gate structure as the gate electrode D10, but a planar gate structure may be employed.

Third Embodiment

Next, a third embodiment will be described.

FIG. 16 is a perspective view schematically illustrating a semiconductor device according to the third embodiment.

FIG. 16 schematically illustrates a perspective view of a semiconductor device 130 partially broken away according to the third embodiment.

As illustrated in FIG. 16, the semiconductor device 130 according to the embodiment has the configuration of the fourth semiconductor region 40 of the semiconductor device 120 according to the second embodiment instead of the configuration of the fourth semiconductor region 40 of the semiconductor device 110 according to the first embodiment. The semiconductor device 130 includes the first gate electrode D1 and the second gate electrode D2 which have the same trench gate structure as the semiconductor device 110. Further, the semiconductor device 130 is provided with the first semiconductor portion 41 and the second semiconductor portion 42 which have the same structure as the fourth semiconductor region 40 of the semiconductor device 120.

The semiconductor device 130 thus configured has the operational advantage of the semiconductor device 110 and the operational advantage of the semiconductor device 120 as well. In other words, a high short-circuit resistance, a high avalanche resistance, a low ON-state resistance, and a low threshold are realized in the semiconductor device 130.

FIG. 17 is a perspective view schematically illustrating a semiconductor according to a modified example of the third embodiment.

FIG. 17 schematically illustrates a perspective view of a semiconductor device 131 partially broken away according to the modified example of the third embodiment.

As illustrated in FIG. 17, the semiconductor device 131 according to the embodiment has the configurations of the drift region 10B and the fourth semiconductor region 40 of the semiconductor device 121 according to the second embodiment instead of the configurations of the drift region 10 and the fourth semiconductor region 40 of the semiconductor device 110 according to the first embodiment. The semiconductor device 131 includes the first gate electrode D1 and the second gate electrode D2 which have the same trench gate structure as the semiconductor device 110. Further, the semiconductor device 131 includes the first region 101 and the second region 102 which have the same structure as the drift region 10B of the semiconductor device 121. Furthermore, the semiconductor device 131 is provided with the first semiconductor portion 41 and the second semiconductor portion 42 which have the same structure of the fourth semiconductor region 40 of the semiconductor device 121.

The semiconductor device 131 thus configured has the operational advantage of the semiconductor device 110 and the operational advantage of the semiconductor device 121 as well. In other words, a high avalanche resistance, a low ON-state resistance, and a low threshold are realized in the semiconductor device 131.

Fourth Embodiment

Next, a fourth embodiment will be described.

FIG. 18 is a perspective view schematically illustrating a semiconductor device according to the fourth embodiment.

FIGS. 19A to 19C are cross-sectional views schematically illustrating the semiconductor device according to the fourth embodiment.

FIG. 19A partially illustrates a cross-sectional view of a semiconductor device 140 when viewed in the X direction. FIG. 19B illustrates a cross section taken along line A9-A9 drawn in FIG. 19A. FIG. 19C illustrates a cross section taken along line B9-B9 drawn in FIG. 19A.

As illustrated in FIG. 18 and FIGS. 19A to 19C, the semiconductor device 140 is a MOSFET for example. The semiconductor device 140 is different from the semiconductor device 110 in the length of the first gate electrode D1 in the Z direction and the position of the boundary pnj1. The semiconductor device 140 is configured to have the upper end d1*u* of the first gate electrode D1 disposed below the boundary pnj1. In other words, the boundary pnj1 is disposed below the upper end d1*u* of the first gate electrode D1. The semiconductor device 110 is configured to have the boundary pnj1 on a side near the first portion D21 in the second gate electrode D2, but the semiconductor device 140 is configured to have the boundary pnj1 on a side near the second portion D22 in the second gate electrode D2.

According to the semiconductor device 140 as described above, a trade-off between the short-circuit resistance and the ON-state resistance of the second MOS structure when the element is short-circuited is rapidly improved, in addition to the same operational advantage as the semiconductor device 110.

Fifth Embodiment

Next, a fifth embodiment will be described.

FIG. 20 is a perspective view schematically illustrating a semiconductor device according to the fifth embodiment.

As illustrated in FIG. 20, a semiconductor device 150 is an IGBT or an IEGT for example. The conductivity type of the fourth semiconductor region 40 of the semiconductor device 150 is the $p^+$ type. The other configurations are similar to those of the semiconductor device 140.

According to the semiconductor device 150 as described above, a trade-off between the short-circuit resistance and the ON-state resistance of the second MOS structure when the element is short-circuited is rapidly improved, in addition to the same operational advantage as the semiconductor device 110. In addition, since no complicated processing is necessary for the fourth semiconductor region 40, there is a great merit on manufacturing.

Sixth Embodiment

Next, a sixth embodiment will be described.

FIG. 21 is a perspective view schematically illustrating a semiconductor device according to the sixth embodiment.

As illustrated in FIG. 21, a semiconductor device 160 is different from the semiconductor device 140 in the configuration of the fourth semiconductor region 40. The other configurations are similar to those of the semiconductor device 140. The fourth semiconductor region 40 of the semiconductor device 160 includes an $n^+$ type first semiconductor portion 43, a $p^+$ type second semiconductor portion 44, and a p type third semiconductor portion 45.

The first semiconductor portion 43 is juxtaposed with the second semiconductor portion 44 in the X direction. In the embodiment, a plurality of first semiconductor portions 43 and a plurality of second semiconductor portions 44 are provided. Each of the first semiconductor portions 43 and each of the second semiconductor portions 44 are alternately disposed in the X direction.

The third semiconductor portion 45 is provided between the first and second semiconductor portions 43, 44 and the semiconductor region 15.

The semiconductor device 160 as described above enables an improvement in characteristics to be further achieved by employing a structure in which a fine pn pattern is formed in the fourth semiconductor region 40 so as to make the injection efficiency of the holes low, in addition to the same operational advantage as the semiconductor device 110.

Seventh Embodiment

Next, a seventh embodiment will be described.

FIG. 22 is a perspective view schematically illustrating a semiconductor device according to the seventh embodiment.

As illustrated in FIG. 22, a semiconductor device 170 is different from the semiconductor device 140 in the configuration of the first electrode portion D11. The other configurations are similar to those of the semiconductor device 140. The semiconductor device 170 is configured to have the first electrode portion D11 and the source electrode D12 divided into separate bodies. The first electrode portion D11 of the semiconductor device 170 is formed using a material different from that of the source electrode D12. The semiconductor device 170 is configured to have the first electrode portion D11 formed using at least any one material of polysilicon and tungsten (W) for example.

The first electrode portion D11 may be an electrode which is formed in a process different from the source electrode D12. In other words, the source electrode D12 may be formed on the first electrode portion D11 after the first electrode portion D11 is buried on the first control electrode D1 in the first trench T1.

The semiconductor device 170 as described above enables the resistance of the second MOS structure to be further improved by forming the boundary pnj1 at a position above the first gate electrode D1, in addition to the same operational advantage as the semiconductor device 110.

Eighth Embodiment

Next, an eighth embodiment will be described.

FIG. 23 is a perspective view schematically illustrating a semiconductor device according to the eighth embodiment.

FIGS. 24A to 24C are cross-sectional views schematically illustrating the semiconductor device according to the eighth embodiment.

FIG. 24A partially illustrates a cross-sectional view of a semiconductor device 180 when viewed in the X direction. FIG. 24B illustrates a cross section taken along line A10-A10 drawn in FIG. 24A. FIG. 24C illustrates a cross section taken along line B10-B10 drawn in FIG. 24A.

As illustrated in FIG. 23 and FIGS. 24A to 24C, the semiconductor device 180 is different from the semiconductor device 140 in the configuration of the contact region 35. The other configurations are similar to those of the semiconductor device 140.

As illustrated in FIG. 24A, the contact region 35 of the semiconductor device 180 includes a lower region 351 which abuts on the base region 20 and an upper region 352 which abuts on the source region 30. The length Wp++1 of the upper region 352 in the Y direction is longer than the length Wp++2 of the lower region 351 in the Y direction. For example, the length of the contact region 35 of the semiconductor device 180 in the Y direction becomes small as it goes from the source region 30 toward the base region 20.

The contact region 35 as described above enables the injection of the electrons from the $n^{++}$ type source region 30 toward a high resistance semiconductor layer (the drift region 10) to be prevented when the element is short-circuited, and the short-circuit resistance is significantly improved.

The semiconductor device 180 as described above enables the resistance of the second MOS structure to be further improved by forming the boundary pnj1 at a position above the first gate electrode D1 and by changing the shape of the contact region 35 in the depth direction, in addition to the same operational advantage as the semiconductor device 110.

Ninth Embodiment

Next, a ninth embodiment will be described.

FIG. 25 is a perspective view schematically illustrating a semiconductor device according to the ninth embodiment.

As illustrated in FIG. 25, a semiconductor device 210 is different from the semiconductor device 180 in the configuration of the fourth semiconductor region 40. The other configurations are similar to those of the semiconductor device 180. The fourth semiconductor region 40 of the semiconductor device 210 is similar to the fourth semiconductor region 40 of the semiconductor device 160. In other words, the fourth semiconductor region 40 includes the first semiconductor portion 43, the second semiconductor portion 44, and the third semiconductor portion 45. In the embodiment, a plurality of first semiconductor portions 43 and a plurality of second semiconductor portions 44 are provided. Each of the first semiconductor portions 43 and each of the second semiconductor portions 44 are alternately disposed in the X direction. The third semiconductor portion 45 is provided between the first and second semiconductor portions 43, 44 and the semiconductor region 15.

FIG. 26 is a diagram plotting a feature of a semiconductor device.

FIG. 26 plots a feature F21 of drain voltage-drain current of the semiconductor device 210. The horizontal axis of FIG. 26 represents the drain voltage Vd, and the horizontal axis represents the drain current Id when the element is in the turned-on state. FIG. 26 shows a calculation result obtained by simulating the characteristics of the semiconductor device 210 which is designed to have a withstand voltage of 300 V. The gate voltage Vg is 15 V.

The semiconductor device 210 as described above enables the resistance of the second MOS structure to be further improved by changing the shape of the contact region 35 in the depth direction, in addition to the same operational advantage as the semiconductor device 160.

Tenth Embodiment

Next, a tenth embodiment will be described.

FIG. 27 is a perspective view schematically illustrating a semiconductor device according to the tenth embodiment.

As illustrated in FIG. 27, a semiconductor device 220 is different from the semiconductor device 140 in the configuration of the fourth semiconductor region 40 and the configuration of the contact region 35. The other configurations are similar to those of the semiconductor device 140. The fourth semiconductor region 40 of the semiconductor device 220 is similar to the fourth semiconductor region 40 of the semiconductor device 120. The contact region 35 of the semiconductor device 220 is similar to the contact region 35 of the semiconductor device 180.

The semiconductor device 220 as described above enables the resistance of the second MOS structure to be improved by changing the shape of the contact region 35 in the depth direction, in addition to the same operational advantage as the semiconductor device 130.

Eleventh Embodiment

Next, an eleventh embodiment will be described.

FIG. 28 is a perspective view schematically illustrating a semiconductor device according to the eleventh embodiment.

As illustrated in FIG. 28, a semiconductor device 230 is different from the semiconductor device 220 in the configuration of the drift region 10B. The other configurations are similar to those of the semiconductor device 220. The drift region 10B of the semiconductor device 230 is similar to the drift region 10B of the semiconductor device 121. In other words, the drift region 10B in the semiconductor device 230 has the super-junction structure.

The semiconductor device 230 as described above enables the resistance of the second MOS structure to be improved by changing the shape of the contact region 35 in the depth direction, in addition to the same operational advantage as the semiconductor device 131.

Twelfth Embodiment

Next, a twelfth embodiment will be described.

FIG. 29 is a perspective view schematically illustrating a semiconductor device according to the twelfth embodiment.

As illustrated in FIG. 29, a semiconductor device 240 is different from the semiconductor device 210 in the configuration of the first electrode portion D11. The other configurations are similar to those of the semiconductor device 210. The upper end d11$u$ of the first electrode portion D11 of the semiconductor device 240 is below the boundary pnj2, and above the boundary pnj1 in the Z direction. The first electrode portion D11 abuts on the base region 20 above the first gate electrode D1.

FIG. 30 is a cross-sectional view schematically illustrating the operation of the semiconductor device.

The cross section of the semiconductor device 240 is illustrated on the left of FIG. 30, and the distribution of hole in the cross section taken along line α-α' when the element is in the turned-on state (Vd<Vbi) is plotted on the right.

When the element is in the turned-on state (Vd<Vbi), the holes generated in the vicinity of the gate by impact ionization are accumulated in the high resistance semiconductor layer (the drift region 10) on a side near the gate. As a result, the resistance of the high resistance semiconductor layer (the drift region 10) is significantly reduced compared to the conventional MOSFET in which the holes are not accumulated. The current-carrying capability of the element in the state of Vd<Vbi can be activated compared to the conventional MOSFET which has the same high resistance semiconductor layer (that is, the same voltage rating).

In a structure of the adjacent gate electrodes, the narrower the gap between the first gate electrode D1 and the second gate electrode D2 which face to each other becomes in the X direction, the closer the inversion layers (or carrier accumulation layers) generated in the turned-on state by applying a voltage to the gate are so as to have an influence on each other.

Specifically, when the gap of the facing gate electrodes falls within 300 nm or less, the inversion layers (the carrier accumulation layers) begins to make an influence to each other. When the gap falls within 40 nm or more and 100 nm or less, the channel layers of the facing trench gates make a stronger influence to each other. When the gap falls within 40 nm to 20 nm, and 20 nm or less to be completely overlapped, the channel layers are overlapped and the advantage of the embodiment appears remarkably.

The semiconductor device 240 is provided with the p type base region 20, the $p^+$ type contact region 35, and the first electrode portion D11 as a field plate layer to face the buried gate between the $n^{++}$ type source region 30 and the drift region 10 (the high resistance semiconductor layer).

Such a configuration enables the withstand voltage between the source region 30 and the drift region 10 to be secured when the element is short-circuited.

The semiconductor region 15 as an n type buffer layer is not a region simply only for preventing punch through, but has the following advantages in the turned-on state (Vd<Vbi). Herein, Vd denotes a voltage applied to the drain (the collector), and Vbi denotes a build-in voltage.

In other words, the semiconductor region 15 prevents the holes generated between the trench gates by the impact ionization from diffusing from the source (the emitter) to the collector so as to contribute to the accumulation of the holes in the drift region 10 on a side near the trench gate.

Accordingly, even under the condition of Vd<Vbi, that is, during a period of serving as a MOSFET, the holes are accumulated in the drift region 10 on a side near the trench gate. Compared to an element having a gap between the buried gates in which the holes are not accumulated (or in such a degree that can be ignored), the structure in the embodiment in which the holes are accumulated causes the resistance of the drift region 10 to be lowered.

In addition, the semiconductor device 240 includes the $p^+$ type second semiconductor portion 44 which injects the holes toward the collector (the drain) under a condition of Vd>Vbi. Herein, in the case of the structure in which only the drain (the collector) is the n type layer (FIG. 1 for example), since the drift region 10 on a side near the trench gate is lowered in resistance by accumulating the carrier when the element is short-circuited, the electric field of the drift region 10 on a side near the drain (the collector) may be increased to result in breakdown.

The semiconductor device 240 injects sufficient holes from the drain (the collector) at the time of being short-circuited, and accumulates the carrier in the drift region 10 on a side near the drain (the collector), so that an increase in the electric field on a side near the drain (the collector) is relaxed. Therefore, the semiconductor device 240 includes a high short-circuit resistance.

FIG. 31A is a perspective view schematically illustrating a semiconductor device according to a modified example of the twelfth embodiment. FIG. 31B is a cross-sectional view schematically illustrating the structure on a side near the drain. FIG. 31C is a diagram plotting a hole density in a cross section taken along line α-α' of FIG. 31A under a condition of Vd<Vbi.

The region on a side near the collector (the drain) in the semiconductor device 240 may have the structure illustrated in FIGS. 31A and 31B.

As described above, the semiconductor device 240 is configured to improve the resistance of the second MOS structure, in addition to the same operational advantage as the semiconductor device 210.

Thirteenth Embodiment

FIG. 32 is a perspective view schematically illustrating a semiconductor device according to a thirteenth embodiment.

A semiconductor device 250 illustrated in FIG. 32 is provided with the contact region 35 between the drift region 10 and the source electrode D12. The contact region 35 is electrically connected to the source electrode D12. The contact region 35 includes a lower region 35*d* which abuts on the drift region 10, an intermediate region 35*m* which abuts on the base region 20, and an upper region 35*u* which abuts on the source region 30. The length of the upper region 35*u*, the length of the intermediate region 35*m*, and the length of the lower region 35*d* in the Y direction become shorter in this order.

In addition, the semiconductor device 250 is provided with the semiconductor region 15 between the drift region 10 and the fourth semiconductor region 40. The impurity concentration of the semiconductor region 15 is higher than that of the drift region 10. Further, the semiconductor device 250 is provided with an $n^-$ type semiconductor region 15*b* (a sixth semiconductor region) between the semiconductor region 15 and the fourth semiconductor region 40. The impurity concentration of the semiconductor region 15*b* is lower than that of the semiconductor region 15.

A junction portion 15*b*1 between the second semiconductor portion 42 and the semiconductor region 15*b* is above a junction portion 15*b*2 between the first semiconductor portion 41 and the semiconductor region 15*b*.

FIGS. 33A and 33B are diagrams illustrating relations between a drain voltage and a drain current.

Herein, FIG. 33B plots Id-Vd curve corresponding to a range of 0 to 1 V in the drain voltage Vd of FIG. 33A on a magnified scale. As plotted in FIG. 33B, it can be seen that the semiconductor device 250 (Curve A) shows a large amount of current Id flowing even at the same drain voltage (Vd) compared to a normal MOSFET (Curve B) having no conductivity modulation. Further, the reason why the saturation current plotted in FIG. 33A appears in two steps is that the semiconductor device 250 includes the first gate electrode D1 and the second gate electrode D2 which are different in length in the Z direction. For example, in the configuration of the semiconductor device 240 (FIG. 29), the saturation current may appear in one step by optimizing the structure on a side near the source through a design appropriate for a contact layer to the p type base region 20 within a scope of the gist of the invention.

The semiconductor device 250 enables the following operational advantages to be achieved in addition to the same operational advantage as the semiconductor device 220.

For example, the semiconductor device 250 is configured to interpose the $n^-$ type semiconductor region 15*b* between the n type semiconductor region 15 and the n type first semiconductor portion 41. Regarding the electrons, the semiconductor region 15*b* is a region having a high resistance compared to the semiconductor region 15 and the first semiconductor portion 41. Therefore, the electrons in the semiconductor device 250 are strongly suppressed from flowing from the semiconductor region 15 toward the drain electrode D13 at the time of turning on. By the extent, the holes are easily injected from the drain electrode D13. Accordingly, the ON-state resistance is further reduced.

The holes are easily injected from the drain electrode D13 in accordance with the amount of protrusion of an upper portion 42*u* of the second semiconductor portion 42 toward the semiconductor region 15*b*. The strength of the electric field (for example, the electric field near the boundary between the semiconductor region 15*b* and the second semiconductor portion 42) applying toward the drain is suppressed as the holes are easily injected from the drain electrode D13 at the time of turning on, so that the short-circuit resistance is further increased.

The semiconductor device 250 is configured such that the lower end of the $p^+$ type contact region 35 reaches the drift region 10. With the configuration, a contact area between the base region 20 and the contact region 35 is further increased. Therefore, the holes generated in the base region 20 are efficiently discharged by the source electrode D12 through the contact region 35. Accordingly, the avalanche resistance of the semiconductor device 250 is further improved.

Fourteenth Embodiment

FIG. 34A is a perspective view schematically illustrating a semiconductor device according to a first example of a fourteenth embodiment. FIG. 34B is a perspective view schematically illustrating a semiconductor device according to a second example of the fourteenth embodiment. FIG. 34C is a perspective view schematically illustrating a semiconductor device according to a third example of the fourteenth embodiment.

Semiconductor devices 260A to 260C according to the fourteenth embodiment are IGBTs, and further include the super-junction structure.

For example, the semiconductor device 260A illustrated in FIG. 34A is configured to have the drift region 10B which includes the n type first region 101 and the p type second region 102. The drift region 10B has the super-junction structure in which the first region 101 and the second region 102 are alternately disposed in the Y direction for example.

A plurality of base regions 20 are provided on the drift region 10B. Each of the base regions 20 abuts on the first region 101 and the second region 102.

The source region 30 and the contact region 35 are provided on each of the base regions 20. The impurity concentration of the source region 30 is higher than that of the first region 101. The impurity concentration of the contact region 35 is higher than that of the base region 20.

The gate electrode D1 abuts on the drift region 10B, each of the base regions 20, and the source region 30 through the gate insulating film 82. The source electrode D12 is electrically connected to the source region 30 and the contact region 35. The drain electrode D13 is electrically connected to the drift region 10B. Then, the semiconductor device 260A is provided with an insulating layer 84 between the contact region 35 which abuts on at least one of the base regions 20 and the source electrode D12.

The semiconductor region 15 is provided between the drain electrode D13 and the drift region 10B. The p type third semiconductor portion 45 is provided between the drain electrode D13 and the semiconductor region 15. Further, the third semiconductor portion 45 may be referred to as a fourth semiconductor region in the embodiment.

The semiconductor devices 260B, 260C illustrated in FIGS. 34B and 34C are configured to have a semiconductor region 46 (a seventh semiconductor region) provided between the drain electrode D13 and the drift region 10B. For example, the semiconductor device 260B is configured to have the semiconductor region 46 abut on the third semiconductor portion 45, and the semiconductor device 260C is configured to have the semiconductor region 46 abut on the semiconductor region 15.

The semiconductor region 46 is configured such that the $n^+$ type first semiconductor portion 43 and the $p^+$ type second semiconductor portion 44 are juxtaposed in the Y direction for example.

FIG. 35 is a diagram plotting a relation between a drain voltage and a drain current.

The horizontal axis drawn in FIG. 35 represents the drain voltage Vd, and the vertical axis represents the drain current Id. FIG. 35 plots the feature F2 of the semiconductor devices 260A to 260C and the feature F19 of a semiconductor device according to the reference example. The features F2, F19 show calculation results obtained by simulating the change in the drain current Id when the drain voltage Vd rises up. Herein, the semiconductor device according to the reference example is configured such that an n type region is uniformly provided in the semiconductor region 40 of the above-mentioned semiconductor device 121.

As plotted in FIG. 35, the feature F19 of the semiconductor device according to the reference example shows that the drain current Id gradually increases as the drain voltage Vd increases. On the other hand, the feature F2 of the semiconductor devices 260A to 260C shows that a large drain current Id flows even at a low drain voltage Vd. In other words, it can be seen that the semiconductor devices 260A to 260C have a low threshold at which the drain current Id begins to flow.

In the semiconductor devices 260A, 260B, 260C, the insulating layer 84 is provided between the contact region 35 which abuts on a part of the base region 20 and the source electrode D12. The insulating layer 84 serves as a barrier against the holes, it is hard for the holes to flow to the base region 20 below the insulating layer 84 at the time of turning on. Such a structure for suppressing the flow of the holes is referred to as a thinning structure in the embodiment.

Therefore, the semiconductor devices 260A, 260B, 260C enable the injection amount of electrons which are injected from the source electrode D12 to relatively increase. Therefore, the ON-state resistance is reduced in the semiconductor devices 260A, 260B, 260C.

The semiconductor devices 260A, 260B, 260C include the super-junction structure. Therefore, the ON-state resistance of the drift region 10B is reduced.

Further, in the semiconductor devices 260B, 260C, the semiconductor region 46 has a fine pn pattern through which the injection efficiency of the holes from the drain can be adjusted. For example, the injection amount of the holes from the drain can be set low by adjusting the width of the second semiconductor portion 44 in the Y direction. Therefore, the characteristics are further improved.

Further, in the semiconductor device 260C, the holes are easily injected from the drain electrode D13 in accordance with the amount of protrusion of an upper portion 44*u* of the second semiconductor portion 44 toward the drift region 10B. The strength of the electric field applying toward the drain is suppressed at the time of turning on as the holes are easily injected from the drain electrode D13, so that the short-circuit resistance is further increased.

In the semiconductor devices 260A to 260C, the thinning structure enables the current to be reduced between the source and the drain in the whole element, so that this structure, the saturation current is reduced. Accordingly, the short-circuit current is reduced, and the short-circuit resistance is increased.

Fifteenth Embodiment

FIG. 36 is a perspective view schematically illustrating a semiconductor device according to a fifteenth embodiment.

A semiconductor device 270 illustrated in FIG. 36 is configured such that the width of the upper portion 12 of the drift region 10 interposed between the first gate electrode D1 and the first portion D21 of the second gate electrode D2 is narrower than that of the base region 20 interposed between the first electrode portion D11 and the second portion D22 of the second gate electrode D2.

As a result of the narrow width of the drift region 10 interposed between the first gate electrode D1 and the first portion D21 of the second gate electrode D2, the holes are hard to flow to the base region 20 at the time of turning on.

Therefore, the semiconductor device 270 enables the injection amount of electrons which are injected from the source electrode D12 to be relatively increased, so that the ON-state resistance is reduced in the semiconductor device 270.

Sixteenth Embodiment

FIG. 37 is a perspective view schematically illustrating a semiconductor device according to a sixteenth embodiment.

A semiconductor device 280 illustrated in FIG. 37 is configured to include the same portions as the semiconductor device 250, in which the upper end d1*u* of the first gate electrode D1 is lower than the boundary pnj1.

The semiconductor device 280 is attached with a controller 90. The semiconductor device 280 may be configured by combining the controller 90 and the semiconductor device 280.

The semiconductor device 280 is configured to control the potential of the first gate electrode D1, the potential of the second gate electrode D2, the potential of the source electrode D12, and the potential of the drain electrode D13 using the controller 90.

FIGS. 38A and 38B are perspective views schematically illustrating the operations of a semiconductor device according to the sixteenth embodiment.

For example, as illustrated in FIG. 38A, in a case where the first gate electrode D1 is applied with a voltage of −15 V for example and the second gate electrode D2 is applied with a voltage of −15 V for example, positive electric charges are induced in the drift region 10 along the first gate electrode D1, and positive electric charges are induced in the drift region 10 along the second gate electrode D2.

On the other hand, as illustrated in FIG. 38B, in a case where the first gate electrode D1 is applied with a voltage of −15 V for example and the second gate electrode D2 is applied with a voltage of +15 V for example, positive electric charges are induced in the drift region 10 along the first gate electrode D1, and negative electric charges are induced in the drift region 10 and the base region 20 along the second gate electrode D2.

FIG. 39 is a graph showing the operation of the semiconductor device according to the sixteenth embodiment.

The horizontal axis of FIG. 39 represents time (sec), and the vertical axis represents current (A) and voltage (V). FIG. 39 shows temporal changes in switching current and switching voltage from a stationary conductive state when the semiconductor device 280 is operated as a diode. The time in the horizontal axis is divided into Period A of the stationary conductive state, and Periods B, C thereafter.

In Period A, the first gate electrode D1 is applied with a voltage of −15 V for example, and the second gate electrode D2 is applied with a voltage of −15 V for example. In Periods B, C, the first gate electrode D1 is applied with a voltage of −15 V for example, and the second gate electrode D2 is applied with a voltage of +15 V for example.

In addition, FIG. 39 shows the temporal changes of the semiconductor device according to the reference example in addition to the operation of the semiconductor device 280. In the reference example, a voltage is not applied to the gate electrode during the operation. For example, the potential of the gate electrode is set to 0 (V) in Periods A to C.

In Period A, the current of the semiconductor device 280 is larger than that of the reference example. This is because the first gate electrode D1 is applied with a voltage of −15 V, the second gate electrode D2 is applied with a voltage of −15 V, and the positive electric charges are induced in the upper portion 12 of the drift region 10 in Period A. At the time, the semiconductor device 280 is configured to have the upper portion 12 of the drift region 10 inversed into a highly concentrated $p^+$ layer in appearance. In other words, the semiconductor device 280 is operated in a state where a forward bias is applied to a $p^+$/n type diode in Period A.

However, when the semiconductor device 280 is made to be turned off in a state where the first gate electrode D1 is applied with a voltage of −15 V and the second gate electrode D2 is applied with a voltage of −15 V, a recovery period and a tail period of the diode become long. This is because a large amount of holes injected from the $p^+$ layer of the $p^+$/n type diode into the diode are continued to remain in the diode immediately after the turning-off.

In the semiconductor device 280, the first gate electrode D1 is applied with a voltage of −15 V for example and the second gate electrode D2 is applied with a voltage of +15 V for example in Period B before the turning-off, so that the upper portion 12 of the drift region 10 inverted into the $p^+$ layer does not remain as the $p^+$ layer any more. For example, the diode becomes a p/n type diode. Therefore, the holes are suppressed from being injected from the anode in Period B further than Period A.

Next, the semiconductor device 280 is turned off in Period C. At this time, since the hole injection into the semiconductor device 280 is suppressed in Period B, the recovery period and the tail period of the diode become short compared to those in the reference example.

In this way, the current of the semiconductor device 280 flows a lot in the stationary conductive state than that of the reference example. A recovery period R and a tail period T of the semiconductor device 280 become shorter than a recovery period R' and a tail period T' of the reference example.

Further, a switching voltage V of the semiconductor device 280 is quickly reduced and also quickly reaches a constant value compared to the switching voltage V in the case of the semiconductor device according to the reference example.

As described above, the semiconductor devices according to the embodiment can achieve an improvement in characteristics along with miniaturization while securing the controllability and the resistance using the gate.

The above-mentioned embodiments can be summed up as follows.

(1) In the embodiment, there is provided a semiconductor device which has a buried gate structure with a fine gap, so that a super IE effect is generated. Herein, an IE effect refers to an injection enhanced effect of promoting the injection efficiency of electrons (holes) by limiting the discharge of holes (electrons).

(2) In the embodiment, the buried gate structure with a fine gap enables the high resistance semiconductor layer (the drift region 10) to be lowered in resistance. For example, this is because the holes which are generated between the buried gate structures with a fine gap by the impact ionization are accumulated between the high resistance semiconductor layer and the buried gate, or the holes which are injected from the collector (the drain) to the high resistance semiconductor layer (under a condition of Vd<Vbi) are accumulated (due to the super IE effect).

(3) In the embodiment, a structure through which the holes injected from the emitter (the source) (which is caused by the impact ionization) or the holes injected from the collector (the drain) are effectively accumulated in the high resistance semiconductor layer is realized. In other words, the structure is realized using the buffer layer (the semiconductor region 15) and the buried gate structure with a fine gap (the super IE effect).

The holes are generated also near the gate channel of a power MOSFET due to a little impact ionization. Conventionally, the holes generated by the impact ionization are quickly discharged from a p type base layer, and thus no adverse influence occurs in device characteristics.

However, the holes which are generated between the buried gate structures with a fine gap due to the impact ionization are effectively accumulated between the buried gate structures with a fine gap, and are diffused from the buried gate structures with a fine gap so as to be injected into the high resistance semiconductor layer.

The dispersion of the holes from the buried gate structure with a fine gap to the high resistance semiconductor layer under the condition of Vd<Vbi can contribute to making the high resistance semiconductor layer lowered in resistance. In other words, the ON-state resistance of the element is lowered under the condition of Vd<Vbi.

In addition, the buried gate structure with a fine gap has a function of effectively preventing that the holes injected from the collector (the drain) to the high resistance semiconductor layer (such as an injection of a little holes from a low-threshold p type emitter structure or the like (in the region of Vd<Vbi)) is discharged to the source (the emitter) (that is, even in such a case, the holes are accumulated in the high resistance semiconductor layer to make a low resistance).

(4) In the embodiment, the collector (the drain) structure which secures the short-circuit resistance is realized. In other words, there is provided the collector (the drain) structure which can inject a sufficient amount of holes from the drain (the collector) at the time of being short-circuited, increase an accumulating amount of carriers in the high resistance semiconductor layer on a side near the drain (the collector), weaken the electric field rising on a side near the drain (the collector), and secure the short-circuit resistance.

(5) In the embodiment, the emitter (the source) structure which secures the short-circuit resistance is realized. In other words, a first combination and a second combination are formed between the n type source and the high resistance semiconductor layer, facing the buried gate. The first combination is a combination (FIG. 32, and others) of the p type base, the field plate layer (FIG. 1 and others), and the field plate layer and a RESURF layer (the contact region 35 of FIG. 24A, the contact region 35 of FIG. 32, and others). The second combination is a combination (the structure of the semiconductor device 240 of FIG. 29, and others) of the $p^+$ type contact region and the field plate layer (the structure of the semiconductor device 240 of FIG. 29, and others) or the $p^+$ type contact region and the RESURF layer (the contact region 35 of FIG. 29) and the field plate layer. The injection of the holes to the n type source layer can be effectively limited when the element is short-circuited. Further, the injection of the electrons from the $n^{++}$ type source region 30 in the short-circuit state of the element can be controlled.

(6) In the embodiment, there is realized the ON-state resistance greatly lower than that of a unipolar MOSFET, which includes the high resistance semiconductor layer having the same thickness, by the effect of the accumulation (conductivity modulation) of the holes to the high resistance semiconductor layer under the condition of Vd<Vbi. Further, there is realized a smooth IV characteristic showing the low ON-state resistance resulted from an IGBT (bipolar) operation (deep conductivity modulation) which is caused by the injection of sufficient holes from the collector (the drain) under the condition of Vd>Vbi. Furthermore, the short-circuit resistance can also be secured.

As described above, in the embodiment, there is realized a device having an operation mode into which the bipolar and unipolar elements are fused.

Further, the embodiments and the modified examples have been described above, but the invention is not limited to these examples. For example, additions or omissions of the components, and changes in design can be appropriately made in the above-mentioned embodiments or the modified examples by a person skilled in the art without departing from the scope of the invention, and also an appropriate combination of features of the respective embodiments falls within the scope of the invention as long as it contains the spirit of the invention.

For example, the above-mentioned embodiments and the modified examples have been described on the assumption that the first conductivity type is the n type and the second conductivity type is the p type. However, the first conductivity type may be the p type, and the second conductivity type may be the n type.

Furthermore, the above-mentioned embodiments and the modified examples have been described by giving an example of Si as the semiconductor material. However, a compound semiconductor such as silicon carbide (SiC) or gallium nitride (GaN), or a wide band gap semiconductor such as diamond may be used as the semiconductor material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

(Note 1)

A semiconductor device, comprising:

a first semiconductor region of a first conductivity type;

a first control electrode provided on or above the first semiconductor region;

a first electrode provided on the first control electrode;

a second control electrode provided on or above the first semiconductor region and including a first portion and a second portion, the first portion being beside the first control electrode, the second portion being provided on the first portion and beside the first electrode;

a second semiconductor region of a second conductivity type provided on the first semiconductor region;

a third semiconductor region of the first conductivity type provided on the second semiconductor region;

a first insulating film provided between the second semiconductor region and the second portion;

a second electrode electrically connected to the third semiconductor region and the first electrode;

a third electrode electrically connected to the first semiconductor region; and a fourth semiconductor region provided between the third electrode and the first semiconductor region and including a first semiconductor portion of the first conductivity type and a second semiconductor portion of the second conductivity type, the first semiconductor portion and the second semiconductor portion being disposed in a second direction orthogonal to a first direction connecting the third electrode and the first semiconductor region.

(Note 2)

The semiconductor device according to Note 1, wherein the first semiconductor region includes a first region of the first conductivity type which is provided between the first semiconductor portion and the second semiconductor region, and a second region of the second conductivity type which is provided between the second semiconductor portion and the second semiconductor region.

(Note 3)

The semiconductor device according to Note 2, wherein a plurality of first semiconductor portions is provided, a plurality of second semiconductor portions is provided, each of the first semiconductor portions and each of the second semiconductor portions are alternately disposed in the second direction, a plurality of first regions is provided, a plurality of second regions is provided, each of the first regions is provided between each of the first semiconductor portions and the second semiconductor region, and each of the second regions is provided between each of the second semiconductor portions and the second semiconductor region.

(Note 4)

The semiconductor device according to Note 3, wherein each of the first semiconductor portions includes a portion which has a first width in the second direction, and a portion which has a second width narrower than the first width in the second direction.

(Note 5)

The semiconductor device according to Note 3 or 4, further comprising a contact region of the second conductivity type provided between the second semiconductor region and the second electrode to be electrically connected to the second electrode.

(Note 6)

The semiconductor device according to Note 5, wherein the contact region includes a lower region which abuts on the second semiconductor region and an upper region which abuts on the third semiconductor region, and the length of the upper region in the second direction orthogonal to the first direction connecting the third electrode and the first semiconductor region is longer than that of the lower region in the second direction.

(Note 7)

The semiconductor device according to Note 3 or 4, further comprising a contact region of the second conductivity type provided between the first semiconductor region and the second electrode to be electrically connected to the second electrode, wherein the contact region includes a lower region which abuts on the first semiconductor region, an intermediate region which abuts on the second semiconductor region, and an upper region which abuts on the third semiconductor region, and the length of the upper region, the length of the intermediate region, and the length of the lower region become shorter in this order in the second direction orthogonal to the first direction connecting the third electrode and the first semiconductor region.

(Note 8)

A semiconductor device, comprising:

a first semiconductor region of a first conductivity type;

a first control electrode provided on or above the first semiconductor region;

a first electrode provided on the first control electrode;

a second control electrode provided on or above the first semiconductor region and including a first portion and a second portion, the first portion being beside the first control electrode, the second portion being provided on the first portion and beside the first electrode;

a second semiconductor region of a second conductivity type provided on the first semiconductor region;

a third semiconductor region of the first conductivity type provided on the second semiconductor region;

a first insulating film provided between the second semiconductor region and the second portion;

a second electrode electrically connected to the third semiconductor region and the first electrode;

a third electrode electrically connected to the first semiconductor region; and a fourth semiconductor region provided between the third electrode and the first semiconductor region and including a first semiconductor portion of the first conductivity type and a second semiconductor portion of the second conductivity type, the first semiconductor portion and the second semiconductor portion being disposed in a second direction orthogonal to a first direction connecting the third electrode and the first semiconductor region.

(Note 9)

The semiconductor device according to any one of Notes 1 to 7, further comprising:

a fifth semiconductor region of the first conductivity type provided between the first semiconductor region and the fourth semiconductor region, the fifth semiconductor region having an impurity concentration higher than that of the first semiconductor region; and a sixth semiconductor region of the first conductivity type provided between the fifth semiconductor region and the fourth semiconductor region, the sixth semiconductor region having an impurity concentration lower than that of the fifth semiconductor region, wherein a junction portion between the second semiconductor portion and the sixth semiconductor region is above a junction portion between the first semiconductor portion and the sixth semiconductor region.

(Note 10)

The semiconductor device according to any one of Notes 1 to 9, wherein the width of the first semiconductor region which is interposed between the first control electrode and the first portion of the second control electrode is narrower than that of the second semiconductor region which is interposed between the first electrode and the second portion of the second control electrode.

(Note 11)

A semiconductor device, comprising:

a first semiconductor region including a first region of a first conductivity type and a second region of a second conductivity type, the first region and the second region being alternately disposed;

a plurality of second semiconductor regions of the second conductivity type provided on the first semiconductor region, each of the second semiconductor regions abutting on the first region and the second region;

a third semiconductor region of the first conductivity type and a contact region of the second conductivity type each provided on each of the second semiconductor regions, the third semiconductor region having the impurity concentration higher than that of the first region, the contact region having the impurity concentration higher than that of the second semiconductor region;

a control electrode abutting on the first semiconductor region, each of the second semiconductor regions, and the third semiconductor region through an insulating film;

a second electrode electrically connected to the third semiconductor region and the contact region;

a third electrode electrically connected to the first semiconductor region; and an insulating layer provided between the contact region abutting on at least one of the second semiconductor regions and the second electrode.

(Note 12)

The semiconductor device according to Note 11, further comprising a fourth semiconductor region of the second conductivity type provided between the third electrode and the first semiconductor region.

(Note 13)

The semiconductor device according to Note 12, further comprising a seventh semiconductor region provided between the third electrode and the first semiconductor region, wherein the seventh semiconductor region includes a first semiconductor portion of the first conductivity type and a second semiconductor portion of the second conductivity type which are disposed in a second direction orthogonal to a first direction connecting the third electrode and the first semiconductor region.

(Note 14)

A semiconductor device, comprising:

a first semiconductor region of a first conductivity type;

a first control electrode provided on or above the first semiconductor region;

a first electrode provided on the first control electrode;

a second control electrode provided on or above the first semiconductor region and including a first portion and a second portion, the first portion being beside the first control electrode, the second portion being provided on the first portion and beside the first electrode;

a second semiconductor region of a second conductivity type provided on the first semiconductor region;

a third semiconductor region of the first conductivity type provided on the second semiconductor region;

a first insulating film provided between the second semiconductor region and the second portion;

a second electrode electrically connected to the third semiconductor region and the first electrode;

a third electrode electrically connected to the first semiconductor region; and a fourth semiconductor region provided between the third electrode and the first semiconductor region, the fourth semiconductor region including a first semiconductor portion of the first conductivity type and a second semiconductor portion of the second conductivity type, the first semiconductor portion and the second semiconductor portion being disposed in a second direction orthogonal to a first direction connecting the third electrode and the first semiconductor region.

(Note 15)

The semiconductor device according to Note 14, wherein the boundary between the first semiconductor region and the second semiconductor region is above the upper end of the first control electrode.

(Note 16)

The semiconductor device according to Note 14, wherein the boundary between the first semiconductor region and the second semiconductor region is below the upper end of the first control electrode.

(Note 17)

The semiconductor device according to any one of Notes 14 to 16, wherein a plurality of first semiconductor portions is provided, a plurality of second semiconductor portions is provided, and each of the first semiconductor portions and each of the second semiconductor portions are alternately disposed in the second direction.

(Note 18)

The semiconductor device according to any one of Notes 14 to 16, wherein the first semiconductor region includes a first region of the first conductivity type which is provided between the first semiconductor portion and the second semiconductor region, and a second region of the second conductivity type which is provided between the second semiconductor portion and the second semiconductor region.

(Note 19)

The semiconductor device according to Note 18, wherein a plurality of first semiconductor portions is provided, a plurality of second semiconductor portions is provided, each of the first semiconductor portions and each of the second semiconductor portions are alternately disposed in the second direction, a plurality of first regions is provided, a plurality of second regions is provided, each of the first regions is provided between each of the first semiconductor portions and the second semiconductor region, and each of the second regions is provided between each of the second semiconductor portions and the second semiconductor region.

What is claimed is:

1. A semiconductor device, comprising:

a first semiconductor region of a first conductivity type;

a first control electrode provided on or above the first semiconductor region;

a first electrode provided on the first control electrode;

a second control electrode provided on or above the first semiconductor region and including a first portion and a second portion, the first portion being beside the first control electrode, the second portion being provided on the first portion and beside the first electrode;

a second semiconductor region of a second conductivity type provided on the first semiconductor region, a boundary between the first semiconductor region and the second semiconductor region being above the lower end of the first electrode;

a third semiconductor region of the first conductivity type provided on the second semiconductor region;

a first insulating film provided between the second semiconductor region and the second portion;

a second insulating film provided between the second semiconductor region and the first control electrode;

a second electrode electrically connected to the third semiconductor region and the first electrode;

a third electrode electrically connected to the first semiconductor region; and a contact region of the second conductivity type provided between the second semiconductor region and the second electrode to be electrically connected to the second electrode.

2. A semiconductor device, comprising:

a first semiconductor region of a first conductivity type;

a first control electrode provided on or above the first semiconductor region;

a first electrode provided on the first control electrode;

a second control electrode provided on or above the first semiconductor region and including a first portion and a second portion, the first portion being beside the first control electrode, the second portion being provided on the first portion and beside the first electrode;

a second semiconductor region of a second conductivity type provided on the first semiconductor region;

a third semiconductor region of the first conductivity type provided on the second semiconductor region;

a first insulating film provided between the second semiconductor region and the second portion;

a second electrode electrically connected to the third semiconductor region and the first electrode; and a third electrode electrically connected to the first semiconductor region.

3. The semiconductor device according to claim 2, wherein the boundary between the first semiconductor region and the second semiconductor region is above the upper end of the first control electrode.

4. The semiconductor device according to claim 2, wherein the boundary between the first semiconductor region and the second semiconductor region is below the upper end of the first control electrode.

5. The semiconductor device according to claim 2, further comprising a second insulating film provided between the second semiconductor region and the first control electrode.

6. The semiconductor device according to claim 3, further comprising a second insulating film provided between the second semiconductor region and the first control electrode.

7. The semiconductor device according to claim 4, further comprising a second insulating film provided between the second semiconductor region and the first control electrode.

8. The semiconductor device according to claim 2, further comprising a contact region of the second conductivity type provided between the second semiconductor region and the second electrode to be electrically connected to the second electrode.

9. The semiconductor device according to claim 3, further comprising a contact region of the second conductivity type provided between the second semiconductor region and the second electrode to be electrically connected to the second electrode.

10. The semiconductor device according to claim 4, further comprising a contact region of the second conductivity type provided between the second semiconductor region and the second electrode to be electrically connected to the second electrode.

11. The semiconductor device according to claim 8, wherein the contact region includes a lower region which abuts on the second semiconductor region and an upper region which abuts on the third semiconductor region, and the length of the upper region in a second direction orthogonal to a first direction connecting the third electrode and the first semiconductor region is longer than that of the lower region in the second direction.

12. The semiconductor device according to claim 2, further comprising a fourth semiconductor region of the second conductivity type provided between the first semiconductor region and the third electrode.

13. The semiconductor device according to claim 3, further comprising a fourth semiconductor region of the second conductivity type provided between the first semiconductor region and the third electrode.

14. The semiconductor device according to claim 4, further comprising a fourth semiconductor region of the second conductivity type provided between the first semiconductor region and the third electrode.

15. A semiconductor device, comprising:

a first semiconductor region;

a control electrode provided on or above the first semiconductor region;

a second semiconductor region of a second conductivity type provided on the first semiconductor region;

a third semiconductor region of a first conductivity type provided on the second semiconductor region;

an insulating film provided between the second semiconductor region and the control electrode;

a second electrode electrically connected to the third semiconductor region;

a third electrode electrically connected to the first semiconductor region; and a fourth semiconductor region provided between the third electrode and the first semiconductor region and including a first semiconductor portion of the first conductivity type and a second semiconductor portion of the second conductivity type, the first semiconductor portion and the second semiconductor portion being disposed in a second direction orthogonal to a first direction connecting the third electrode and the first semiconductor region.

16. The semiconductor device according to claim 15, wherein a plurality of first semiconductor portions is provided, a plurality of second semiconductor portions is provided, and each of the first semiconductor portions and each of the second semiconductor portions are alternately disposed in the second direction.

17. The semiconductor device according to claim 15, wherein the first semiconductor portion includes a portion which has a first width in the second direction, and a portion which has a second width narrower than the first width in the second direction.

18. The semiconductor device according to claim 15, wherein the first semiconductor region includes a first region of the first conductivity type which is provided between the first semiconductor portion and the second semiconductor region, and a second region of the second conductivity type which is provided between the second semiconductor portion and the second semiconductor region.

19. The semiconductor device according to claim 18, wherein a plurality of first semiconductor portions is provided, a plurality of second semiconductor portions is provided, each of the first semiconductor portions and each of the second semiconductor portions are alternately disposed in the second direction, a plurality of first regions is provided, a plurality of second regions is provided, each of the first regions is provided between each of the first semiconductor portions and the second semiconductor region, and each of the second regions is provided between each of the second semiconductor portions and the second semiconductor region.

20. The semiconductor device according to claim 19, wherein each of the first semiconductor portions includes a portion which has a first width in the second direction, and a portion which has a second width narrower than the first width in the second direction.

* * * * *